US008126163B2

(12) United States Patent
Cohen et al.

(10) Patent No.: US 8,126,163 B2
(45) Date of Patent: Feb. 28, 2012

(54) VOLUME AND TONE CONTROL IN DIRECT DIGITAL SPEAKERS

(75) Inventors: Yuval Cohen, Rehovot (IL); Daniel Lewin, Tel Aviv (IL); Shay Kaplan, Givat Ela (IL)

(73) Assignee: Audio Pixels Ltd., Tel Aviv (IL)

( * ) Notice: Subject to any disclaimer, the term of this patent is extended or adjusted under 35 U.S.C. 154(b) by 749 days.

(21) Appl. No.: 12/301,954

(22) PCT Filed: May 21, 2007

(86) PCT No.: PCT/IL2007/000621
§ 371 (c)(1),
(2), (4) Date: Nov. 21, 2008

(87) PCT Pub. No.: WO2007/135679
PCT Pub. Date: Nov. 29, 2007

(65) Prior Publication Data

US 2010/0008521 A1 Jan. 14, 2010

Related U.S. Application Data

(60) Provisional application No. 60/802,126, filed on May 22, 2006, provisional application No. 60/872,488, filed on Dec. 4, 2006, provisional application No. 60/907,450, filed on Apr. 2, 2007, provisional application No. 60/924,203, filed on May 3, 2007.

(51) Int. Cl.
*H03G 5/00* (2006.01)
*H03G 3/00* (2006.01)
(52) U.S. Cl. .......................................... 381/98; 381/104
(58) Field of Classification Search .................... 381/98, 381/104
See application file for complete search history.

(56) References Cited

U.S. PATENT DOCUMENTS 4,131,363 A 12/1978 Shea et al.
(Continued)

FOREIGN PATENT DOCUMENTS

EP 0 437 999 A2 12/1990
(Continued)

OTHER PUBLICATIONS

Lagorce, L. K. and M. G. Allen, "Magnetic and Mechanical Properties of Micro-machined Strontium Ferrite/Polyimide Composites", IEEE Journal of Micro-electromechanical Systems, vol. 6, No. 4, Dec. 1977.

(Continued)

*Primary Examiner* — Thanh V Pham
(74) *Attorney, Agent, or Firm* — Oliff & Berridge, PLC

(57) ABSTRACT

A system that includes a direct digital speaker volume control device configured to be coupled to a direct digital speaker. The direct digital speaker includes many pressure producing elements being adapted to generate a sound at a sound pressure level (SPL) and at a given frequency in response to an input signal, without using digital to analog converter. The direct digital speaker inherently exhibits a frequency response throughout its entire frequency range. The direct digital speaker volume control device includes a module for providing few filters each having a distinct cutoff frequency such that each filter exhibits no attenuation below its cutoff frequency and an attenuation response above the filter's cutoff frequency. And a selector for selecting one of the filters according to a selection criterion that depends on a desired volume and frequency of generated sound, and applying the filter to the input signal for generating a filtered signal that fed to the speaker.

16 Claims, 44 Drawing Sheets

U.S. PATENT DOCUMENTS

| | | | |
|---|---|---|---|
| 4,194,095 A | 3/1980 | Doi et al. | |
| 4,337,379 A | 6/1982 | Nakaya | |
| 4,515,997 A | 5/1985 | Stinger, Jr. | |
| 5,517,570 A | 5/1996 | Taylor | |
| 5,574,792 A | 11/1996 | Konno | |
| 5,580,639 A | 12/1996 | Togawa et al. | |
| 5,953,200 A | 9/1999 | Haley et al. | |
| 6,094,116 A | 7/2000 | Tai et al. | |
| 6,125,189 A | 9/2000 | Yasuno et al. | |
| 6,289,106 B1 | 9/2001 | Wong | |
| 6,373,955 B1 | 4/2002 | Hooley | |
| 6,403,995 B2 | 6/2002 | Thomas | |
| 6,795,561 B1 | 9/2004 | Bank | |
| 6,959,096 B2 | 10/2005 | Boone et al. | |
| 6,963,654 B2 | 11/2005 | Sotme et al. | |
| 6,975,740 B2 | 12/2005 | Rautio et al. | |
| 7,016,186 B2 | 3/2006 | Ueda et al. | |
| 7,286,681 B2 | 10/2007 | Gerkinsmeyer | |
| 2001/0048123 A1 | 12/2001 | Thomas | |
| 2002/0073856 A1 | 6/2002 | Davis et al. | |
| 2002/0106093 A1 | 8/2002 | Azima et al. | |
| 2002/0151171 A1 | 10/2002 | Furusawa | |
| 2003/0068054 A1 | 4/2003 | Sotme et al. | |
| 2003/0129814 A1 | 7/2003 | Mizukoshi | |
| 2004/0122543 A1 | 6/2004 | Lee et al. | |
| 2005/0008171 A1 | 1/2005 | Hosoi et al. | |
| 2005/0207588 A1 | 9/2005 | Biegelsen | |
| 2006/0145059 A1 | 7/2006 | Lee et al. | |
| 2010/0002900 A1 | 1/2010 | Cohen et al. | |
| 2010/0008521 A1 * | 1/2010 | Cohen et al. | 381/98 |
| 2010/0166242 A1 | 7/2010 | Cohen et al. | |
| 2010/0316242 A1 | 12/2010 | Cohen et al. | |

FOREIGN PATENT DOCUMENTS

| | | | |
|---|---|---|---|
| EP | 1 063 866 A1 | 12/2000 | |
| EP | 1 065 725 A2 | 1/2001 | |
| EP | 1 465 211 A2 | 10/2004 | |
| EP | 1 653 614 A1 | 5/2006 | |
| GB | 1 106 750 A | 4/1983 | |
| GB | 2 393 601 A | 3/2004 | |
| JP | A-51-120710 | 10/1976 | |
| JP | A-57-185790 | 11/1982 | |
| JP | A-09-266599 | 10/1997 | |
| JP | A-20001-016675 | 1/2001 | |
| JP | A-2005-087929 | 4/2005 | |
| NL | 6613713 A | 4/1968 | |
| WO | WO 84/00460 | 2/1984 | |
| WO | WO 98/24544 | 6/1998 | |
| WO | WO 01/23104 A2 | 4/2001 | |
| WO | WO 01/87458 A1 | 11/2001 | |
| WO | WO 03/059005 A2 | 7/2003 | |
| WO | WO 2007/135678 A2 | 11/2007 | |
| WO | WO 2007/135680 A1 | 11/2007 | |
| WO | WO 2007135679 A2 | * | 11/2007 |

OTHER PUBLICATIONS

Lagorce, L. K., Brand, O. and M. G. Allen, "Magnetic micro actuators based on polymer magnets", IEEE Journal of Micro-electromechanical Systems, vol. 8, No. 1, Mar. 1999.

BBE Sound, Inc., "DS48 Digital Speaker Processor", BBE Professional Products.

Diamond, A. M., et al. "Digital Sound Reconstruction using Arrays of CMOS-MEMS Microspeakers", Transducers, Solid-State Sensors, Actuators and Microsystems, 12$^{th}$ International Conference, Piscataway, NJ, US, IEEE, vol. 9, Jun. 9, 2003, p. 238-241.

Hawksford, M.O.J., "Smart Digital Loudspeaker Arrays", Journal of the Audio Engineering Society, New York, NY, US, vol. 51, No. 12, Dec. 2003, p. 1133-1162.

Huang, Y., et al., "Distortion and Directivity in a Digital Transducer Array Loudspeaker", Journal of the Audio Engineering Society, New York, NY, US, vol. 49, No. 5, May 2001, p. 337-352.

Meyer, D.G., "Digital Control of Loudspeaker Array Directivity", Journal of the Audio Engineering Society, New York, NY, US, vol. 32, No. 10, Oct. 1984, pp. 747-754.

Crocker, M.J., "Encyclopedia of Acoustics", Wiley-Interscience, Apr. 22, 1997.

Kinsler, L.E., et al., "Fundamentals of Acoustics".

Raichel, D.R., "The science and Applications of Acoustics".

Rossing, T. D., et al., "Principles of Vibration and Sound".

Fahy, F., "Foundations of Engineering Acoustics".

Neumann, J.J., Jr., "MEMS (Microelectromechanical Systems) Audio Devices-Dreams and Realities", Audio Engineering Society, Convention paper, Oct. 10-13, 2003.

Yamaha, "Multi-channel Surround Sound from a single component", Digital Sound Projections.

May 10, 2007 International Search Reports issued in PCT/IL2007/000622.

May 11, 2007 International Search Report issued in PCT/IL2007/000618.

Mar. 3, 2008 International Search Report issued in PCT/IL2007/000621.

Jun. 18, 2009 International Search Report issued in PCT/IL2008/001524.

Mar. 3, 2010 International Preliminary Report on Patentability issued in PCT/IL2008/001524.

* cited by examiner

| Hatching | | Represents |
|---|---|---|
| | I | Electrostatic latch |
| | II | Gasket |
| | III | Magnet |
| | IV | Flexure |
| | V | Top spacer |
| | VI | Bottom spacer |

VOLUME AND TONE CONTROL IN DIRECT DIGITAL SPEAKERS

REFERENCE TO CO-PENDING APPLICATIONS

Priority is claimed from U.S. provisional application No. 60/802,126 filed 22 May 2006 and entitled "An apparatus for generating pressure" and from a U.S. provisional application No. 60/872,488 filed 4 Dec. 2006 and entitled "Volume Control" and from a U.S. provisional application No. 60/907,450 filed 2 Apr. 2007 and entitled "Appartus for generating pressure and methods of manufacture thereof" and from U.S. provisional application 60/924,203 filed 3 May 2007 and entitled "Apparatus and Methods for Generating Pressure Waves".

FIELD OF THE INVENTION

The present invention relates generally to volume control for speakers and more specifically to volume control for direct digital speakers.

BACKGROUND OF THE INVENTION

The state of the art for actuators comprising an array of micro actuators is believed to be represented by the following, all of which are US patent documents, unless otherwise indicated:

2002/0106093: The Abstract, FIGS. 1-42 and paragraphs 0009, 0023, and 0028 show electromagnetic radiation, actuators and transducers and electrostatic devices.

U.S. Pat. No. 6,373,955: The Abstract and column 4, line 34-column 5, line 55 show an array of transducers.

JP 2001016675: The Abstract shows an array of acoustic output transducers.

U.S. Pat. No. 6,963,654: The Abstract, FIGS. 1-3, 7-9 and column 7, line 41-column 8, line 54 show the transducer operation based on an electromagnetic force.

U.S. Pat. No. 6,125,189: The Abstract; FIGS. 1-4 and column 4, line 1-column 5, line 46, show an electro-acoustic transducing unit including electrostatic driving.

WO 8400460: The Abstract shows an electromagnetic-acoustic transducer having an array of magnets.

U.S. Pat. No. 4,337,379: The Abstract; column 3, lines 28-40, and FIGS. 4, 9 show electromagnetic forces.

U.S. Pat. No. 4,515,997: The Abstract and column 4, lines 16-20, show volume level.

U.S. Pat. No. 6,795,561: Column 7, lines 18-20, shows an array of micro actuators.

U.S. Pat. No. 5,517,570: The Abstract shows mapping aural phenomena to discrete, addressable sound pixels.

JP 57185790: The Abstract shows eliminating the need for a D/A converter.

JP 51120710: The Abstract shows a digital speaker system which does not require any D-A converter.

JP 09266599: The Abstract shows directly applying the digital signal to a speaker.

U.S. Pat. No. 6,959,096: The Abstract and column 4, lines 50-63 show a plurality of transducers arranged within an array.

Methods for manufacturing polymer magnets are described in the following publications:

Lagorce, L. K. and M. G. Allen, "Magnetic and Mechanical Properties of Micro-machined Strontium Ferrite/Polyimide Composites", IEEE Journal of Micro-electromechanical Systems, 6(4), December 1997; and Lagorce, L. K., Brand, O. and M. G. Allen, "Magnetic micro actuators based on polymer magnets", IEEE Journal of Micro-electromechanical Systems, 8(1), March 1999.

U.S. Pat. No. 4,337,379 to Nakaya describes a planar electrodynamics electro-acoustic transducer including, in FIG. 4A, a coil-like structure.

U.S. Pat. No. 6,963,654 to Sotme et al describes a diaphragm, flat-type acoustic transducer and flat-type diaphragm. The Sotme system includes, in FIG. 7, a coil-like structure.

Semiconductor digital loudspeaker arrays are known, such as those described in United States Patent document 20010048123, U.S. Pat. No. 6,403,995 to David Thomas, assigned to Texas Instruments and issued 11 Jun. 2002, U.S. Pat. No. 4,194,095 to Sony, U.S. Pat. No. 4,515,997 to Walter Stinger, and Diamond Brett M., et al, "Digital sound reconstruction using array of CMOS-MEMS micro-speakers", Transducers '03, The 12$^{th}$ International Conference on Solid State Sensors, Actuators and Microsystems, Boston, Jun. 8-12, 2003; and such as BBE's DS48 Digital Loudspeaker Management System.

As is well known, conventional analog speakers are required to exhibit a flat frequency response. The term "frequency response" as known in the art and as used hereinafter is the measure of any system's transfer function, comparing the output signal of the system, to an input signal having constant amplitude but varying frequencies. The frequency response is typically characterized by the magnitude of the system's transfer function, measured in dB, versus frequency, measure in Hz.

This response, in the context of loudspeakers, is generally governed by the equations, known in the art of a vibrating piston in an infinite baffle:

$$P = \frac{\sqrt{2}\cdot\pi\cdot\rho\cdot S\cdot f^2\cdot\left(\frac{A}{2}\right)}{R} \tag{1}$$

Where:

P stands for the RMS pressure produced by the vibrating piston [N/m$^2$];

A stands for the peak-to-peak vibration amplitude [m];

S stands for the surface area of the vibrating piston [m$^2$];

ρ stands for the density of the medium (i e. air) in which the piston is vibrating [Kg/m$^3$];

R stands for the distance of the measurement point from the face of the piston [m];

f stands for the vibration frequency [Hz];

Thus, for instance, increasing the frequency f by a factor of 2 results in corresponding increase in the pressure P by a factor of 4 (provided all other parameters remain unchanged).

$$SPL = 20\cdot\log_{10} P/P_0 \tag{2}$$

Where $P_0$ stands for a constant reference pressure. Typically selected to be the lowest RMS pressure audible to humans or 20 $10^{-6}$ N/m$^2$ P stands for the piston RMS pressure (see (1)) SPL stands for Sound Pressure Level. The higher the SPL the louder the sound of the speaker as sensed by the listener.

As readily arises from equation (1), assuming that all the parameters except the frequency f are maintained invariable, and further assuming that the frequency f is doubled (i.e. increasing by one octave), this will result in multiplying the pressure P by 4 and the latter will result (see equation (2)) in increasing the SPL by 12 dB, giving rise to a frequency response of 12 dB/octave. This is not a desired effect since from the listener's standpoint, the speaker should exhibit a flat response across its entire designated frequency range. Thus, for example, increasing one octave (i.e. doubling the frequency) should not affect the generated SPL which should be maintained substantially constant, unless intentionally adjusted by the listener.

Analog speakers exhibit a flat response notwithstanding the specified 12 dB/Octave frequency response, since an analog speaker has an inherent property according to which increase of the frequency f entails a decrease in the peak-to-peak amplitude A. Thus, reverting to equation (1), when the frequency f is doubled, the amplitude A decreases by substantially a factor of 4, thereby maintaining the generated pressure P substantially invariable and, as readily arises from equation (2), the SPL is also maintained substantially constant, giving rise to the desired flat response.

Obviously, when the listener wishes to increase the sound level he may increase the peak-to-peak amplitude A across the entire frequency range.

The disclosures of all publications and patent documents mentioned in the specification, and of the publications and patent documents cited therein directly or indirectly, are hereby incorporated by reference.

SUMMARY OF THE INVENTION

The term “direct digital speaker” or DDS is used herein to include speakers that accept a digital signal and translate the signal into sound-waves without the use of a separate digital to analog converter (DAC). Such speakers may sometime include an analog to digital converter (ADC) as to allow them to translate analog signals instead or in addition to digital signals. Such speakers may include DDS (Direct Digital Speakers), DDL (Direct Digital Loudspeakers), DSR (Digital Sound Reconstruction) speakers, digital uniform loudspeaker arrays, matrix speakers, and MEMS speakers. The term “direct digital speaker” as used herein is intended to include speaker apparatus having a multiplicity of pressure-producing elements, which generate pressure either by virtue of their motion e.g. as specifically described herein or by heating and cooling the medium in which they reside, e.g. air, or by accelerating the medium in which they reside e.g. by ionizing the medium and providing a potential difference along an axis, or by operating as valves to selectively tap reservoirs of medium e.g. air, pressurized differently from the surrounding environment. The number of operating pressure producing elements (i.e. elements which are operating to generate pressure) is typically a monotonically increasing function of, e.g. proportional to, the intensity of the input signal, if analog, or to the digitally encoded intensity of the input signal, if digital.

DDS as used herein is intended to include an array of pressure producing elements such that each element can be controlled individually for controlling the frequency, SPL and/or other properties of the generated sound. DDSs (unlike analog speakers) do not require application of digital to analog (D/A) converter and accordingly in DDS a digital signal (indicative of the input signal generated, say by a sound system, possibly after undergoing certain processing) is fed to the speaker.

It is appreciated that the equations governing the pressure produced by a DDS are different from those described above. DDSs may, in some cases exhibit dependency that is not squared between frequency f and produced pressure P, thus exhibit frequency response slopes different from 12 dB/Octave.

The peak-to-peak amplitude of the speaker elements in the DDS is in many cases invariable.

There is thus a need in the art to provide a different technique to control the volume in DDS.

In accordance with an aspect on the invention, there is provided a system that includes a direct digital speaker volume control device configured to be coupled to a direct digital speaker; the direct digital speaker comprising a plurality of pressure producing elements being adapted to generate a sound at a sound pressure level (SPL) and at a given frequency in response to an input signal, without using digital to analog converter; the direct digital speaker inherently exhibits a frequency response throughout its entire frequency range; the direct digital speaker volume control device comprising:

(a) a module for providing a at least two filters each having a distinct cutoff frequency such that each filter exhibits substantially no attenuation below its cutoff frequency and an attenuation response above said filter's cutoff frequency;

(b) a selector for selecting at least one of said filters according to a selection criterion that depends on at least a desired volume and frequency of generated sound, and applying said filter to said input signal for generating a filtered signal that is configured to be fed to said speaker.

In accordance with a certain embodiment of the invention, at least one of said filters exhibits an attenuation response above said filter's cutoff frequency that corresponds to said frequency response of the speaker.

In accordance with a further embodiment of the invention, at least one of said filters exhibits an attenuation response above said filter's cutoff frequency that corresponds to said frequency response of the speaker, such that the speaker exhibits flat response substantially across its entire designated frequency range.

In accordance with yet a further embodiment of the invention, said frequency response of the speaker being substantially 6 dB/octave across its frequency range, and wherein each one of said filters exhibits an attenuation response of −6 dB/octave response throughout a frequency range that exceeds said cut-off operational frequency and substantially no attenuation below said cut-off operational frequency.

In accordance with a further embodiment of the invention, at least one of said filters being Low Pass Filter (LPF).

In accordance with a further embodiment of the invention, at least one of said LPFs being an IR type filter.

In accordance with a still further embodiment of the invention, at least one of said LPFs being an FIR type filter.

In accordance with a further embodiment of the invention, said direct digital speaker volume control device includes a volume control module for adjusting the SPL of the generated sound.

In accordance with a still further embodiment of the invention, said selection criterion depends on at least one of (i) desired generated SPL, (ii) desired frequency range of the generated sound, (iii) spectrum of the input signal and (iv) a gain of the input signal.

In accordance with a further aspect of the invention, there is provided a direct digital speaker comprising a plurality of pressure producing elements being adapted to generate a sound at a sound pressure level (SPL) and at a given frequency in response to an input signal, without using digital to analog converter; the direct digital speaker inherently exhibits a frequency response throughout its entire frequency range; the direct digital speaker includes a direct digital speaker volume control device, comprising:

(a) a module for providing a at least two filters each having a distinct cutoff frequency such that each filter exhibits substantially no attenuation below its cutoff frequency and an attenuation response above said filter's cutoff frequency;

(b) a selector for selecting at least one of said filters according to a selection criterion that depends on at least a desired volume and frequency of generated sound, and applying said filter to said input signal for generating a filtered signal that is configured to be fed to said speaker.

In accordance with an aspect of the invention, there is provided a speaker system for generating sound, at least one attribute of sound generated thereby corresponding to at least one characteristic of the input digital signal which is sampled periodically in accordance with a clock, the system comprising at least one actuator device, each actuating device including:

an array of moving elements, wherein each individual moving element is responsive to alternating magnetic fields and is constrained to travel alternately back and forth along a respective axis responsive to an electromagnetic force operative thereupon when in the presence of an alternating magnetic field;

at least one latch operative to selectively latch at least one subset of said moving elements in at least one latching position thereby to prevent said individual moving elements from responding to said electromagnetic force;

a magnetic field control system operative to receive the clock and, accordingly, to control application of said electromagnetic force to said array of moving elements; and a latch controller operative to receive said digital input signal and to control said at least one latch accordingly, wherein said latch controller is associated with the specified direct digital speaker volume control device.

In accordance with a still further embodiment of the invention, there is provided a speaker system for generating sound, at least one attribute of sound generated thereby corresponding to at least one characteristic of the input digital signal which is sampled periodically in accordance with a clock, the system comprising at least one actuator device, each actuating device including:

an array of moving elements, wherein each individual moving element is responsive to alternating magnetic fields and is constrained to travel alternately back and forth along a respective axis responsive to an electromagnetic force operative thereupon when in the presence of an alternating magnetic field;

at least one latch operative to selectively latch at least one subset of said moving elements in at least one latching position thereby to prevent said individual moving elements from responding to said electromagnetic force;

a magnetic field control system operative to receive the clock and, accordingly, to control application of said electromagnetic force to said array of moving elements; and a latch controller operative to receive said digital input signal and to control said at least one latch accordingly, wherein said latch controller is associated with the specified direct digital speaker volume control device.

In accordance with a still further aspect of the invention, there is provided a method for controlling volume of an input signal configured to be fed to a direct digital speaker; the direct digital speaker comprising a plurality of pressure producing elements being adapted to generate a sound at a sound pressure level (SPL) and at a given frequency in response to an input signal, without using digital to analog converter; the direct digital speaker inherently exhibits a frequency response throughout its entire frequency range; method comprising:

a. providing a at least two filters each having a distinct cutoff frequency such that each filter exhibits substantially no attenuation below its cutoff frequency and an attenuation response above said filter's cutoff frequency;

b. selecting at least one of said filters according to a selection criterion that depends on at least a desired volume and frequency of generated sound, and applying said filter to said input signal for generating a filtered signal that is configured to be fed to said speaker.

In accordance with a still further embodiment of the invention, at least one of said filters is applied to an input signal received in real time.

In accordance with a still further embodiment of the invention, said applying includes pre-processing at least one of said filters to an input signal.

Further regarding terminology used herein:

Array: This term is intended to include any set of moving elements whose axes are preferably disposed in mutually parallel orientation and flush with one another so as to define a surface which may be planar or curved.

Above, Below: It is appreciated that the terms "above" and "below" and the like are used herein assuming that, as illustrated by way of example, the direction of motion of the moving elements is up and down however this need not be the case and alternatively the moving elements may move along any desired axis such as a horizontal axis.

Actuator: This term is intended to include transducers and other devices for inter-conversion of energy forms. When the term "transducers" is used, this is merely by way of example and it is intended to refer to all suitable actuators such as speakers, including loudspeakers.

Actuator element: This term is intended to include any "column" of components which, typically in conjunction with many other such columns, forms an actuator, each column typically including a moving element, a pair of latches or "latching elements" therefore, each latching element including one or more electrodes and insulative spacing material separating the moving element from the electrodes.

Coil: It is appreciated that the alternating electromagnetic force applied to the array of moving elements in accordance with a preferred embodiment of the present invention may be generated by an alternating electric current oriented to produce a magnetic field gradient which is co-linear to the desired axes of motion of the moving elements. This electric current may comprise current flowing through a suitably oriented conductive coil or conductive element of any other suitable configuration. The term "coil" is used throughout the present specification as an example, however it is appreciated that there is no intention to limit the invention which is intended to include all apparatus for applying an alternating electromagnetic force e.g. as described above. When "coil" is used to indicate a conductor, it is appreciated that the conductor may have any suitable configuration such as a circle or other closed figure or substantial portion thereof and is not intended to be limited to configurations having multiple turns.

Channels, also termed "holes" or "tunnels": These are illustrated as being cylindrical merely by way of example, although this need not be the case.

Electrode: An electro-static latch. Includes either the bottom or top electro-static latch which latches its corresponding moving element by virtue of its being oppositely charged such that each latch and its moving element constitute a pair of oppositely charged electrodes.

Flexure: at least one flexible element on which an object is mounted, imparting at least one degree of freedom of motion to that object, for example, one or more flexible thin or small elements peripheral to and typically integrally formed e.g. from a single sheet of material, with a central portion on which another object may or may not be mounted, thereby to impart at least one degree of freedom of motion to the central portion and objects mounted thereupon.

Latch, latching layer, latching mechanism: This term is intended to include any device for selectively locking one or more moving elements into a fixed position. Typically, "top" and "bottom" latching layers are provided, which may be side by side and need not be one atop the other, and each latching layer includes one or many latching mechanisms which may or may not correspond in number to the number of moving elements to be latched. The term "latch pair" is a pair of latches for an individual moving element e.g. including a top latch and a bottom latch, which may be side by side and need not be one atop the other.

Moving elements: These are intended to include any moving elements each constrained to travel alternately back and forth along an axis in response to an alternating electromagnetic force applied thereto. Moving elements are also termed herein "micro-speakers", "pixels", "micro-actuators", "membranes" (individually or collectively) and "pistons".

Spacers, also termed "space maintainers": Include any element or elements mechanically maintaining the respective positions of the electrodes and moving elements.

The term "direct digital speaker" is used herein to include speakers that accept a digital signal and translate the signal into sound-waves without the use of a separate digital to analog converter. Such speakers may sometime include an analog to digital converter as to allow them to translate analog signals instead or in addition to digital signals. Such speakers may include DDS (Direct Digital Speakers), DDL (Direct Digital Loudspeakers), DSR (Digital Sound Reconstruction) speakers, digital uniform loudspeaker arrays, matrix speakers, and MEMS speakers. The term "direct digital speaker" as used herein is intended to include speaker apparatus having a multiplicity of pressure-producing elements, which generate pressure either by virtue of their motion e.g. as specifically described herein or by heating and cooling the medium in which they reside, e.g. air, or by accelerating the medium in which they reside e.g. by ionizing the medium and providing a potential difference along an axis, or by operating as valves to selectively tap reservoirs of medium e.g. air, pressurized differently from the surrounding environment. The number of operating pressure producing elements (i.e. elements which are operating to generate pressure) is typically a monotonically increasing function of, e.g. proportional to, the intensity of the input signal, if analog, or to the digitally encoded intensity of the input signal, if digital.

The term "clock" used herein refers to the time duration associated with a single interval of the system clock.

The term "directivity pattern" as used herein refers to the pattern of the spatial distribution of the acoustic energy generated by speaker apparatus.

BRIEF DESCRIPTION OF THE DRAWINGS

Preferred embodiments of the present invention are illustrated in the following drawings.

DETAILED DESCRIPTION OF PREFERRED EMBODIMENTS

The technical field of the invention is that of a digital transducer array of long-stroke electromechanical micro actuators constructed using fabrication materials and techniques to produce low cost devices for a wide variety of applications, such as audio speakers, biomedical dispensing applications, medical and industrial sensing systems, optical switching, light reflection for display systems and any other application that requires or can derive benefit from longer-travel actuation and/or the displacement of greater volumes of fluid e.g. air or liquid relative to the transducer size.

A preferred embodiment of the present invention seeks to provide a transducer structure, a digital control mechanism and various fabrication techniques to create transducer arrays with a number, N, of micro actuators. The array is typically constructed out of a structure of typically three primary layers which in certain embodiments would comprise of a membrane layer fabricated out of a material of particular low-fatigue properties that has typically been layered on both sides with particular polar aligned magnetic coatings and etched with a number, N, of unique "serpentine like" shapes, so as to enable portions of the membrane bidirectional linear freedom of movement (the actuator). The bidirectional linear travel of each moving section of the membrane is confined within a chamber (actuator channels) naturally formed typically by sandwiching the membrane layer between two mirror image support structures constructed out of dielectric, Silicon, Polymer or any other like insulating substrate, are typically fabricated with N precisely sized through holes equal in number to the N serpentine etchings of the membrane and typically precisely positioned in a pattern which precisely aligns each through hole with each serpentine etching of the membrane. Further affixed to the outer surfaces of both the top and bottom layers of the support structure are, typically, conductive overhanging surfaces such as conductive rings or discs ("addressable electrodes"), which serve to attract and hold each actuator as it reaches its end of stroke typically by applying electrostatic charge.

A device constructed and operative in accordance with a preferred embodiment of the present invention is now described with reference to FIGS. 1B, 2A-2C, 3A-3C, 4A, 5, 6A, 7A-7B, 8A-8B, 9, 10A, 11A, 12A, 13, 14, 15A, 16A-C, 17-19.

Figure 1A:
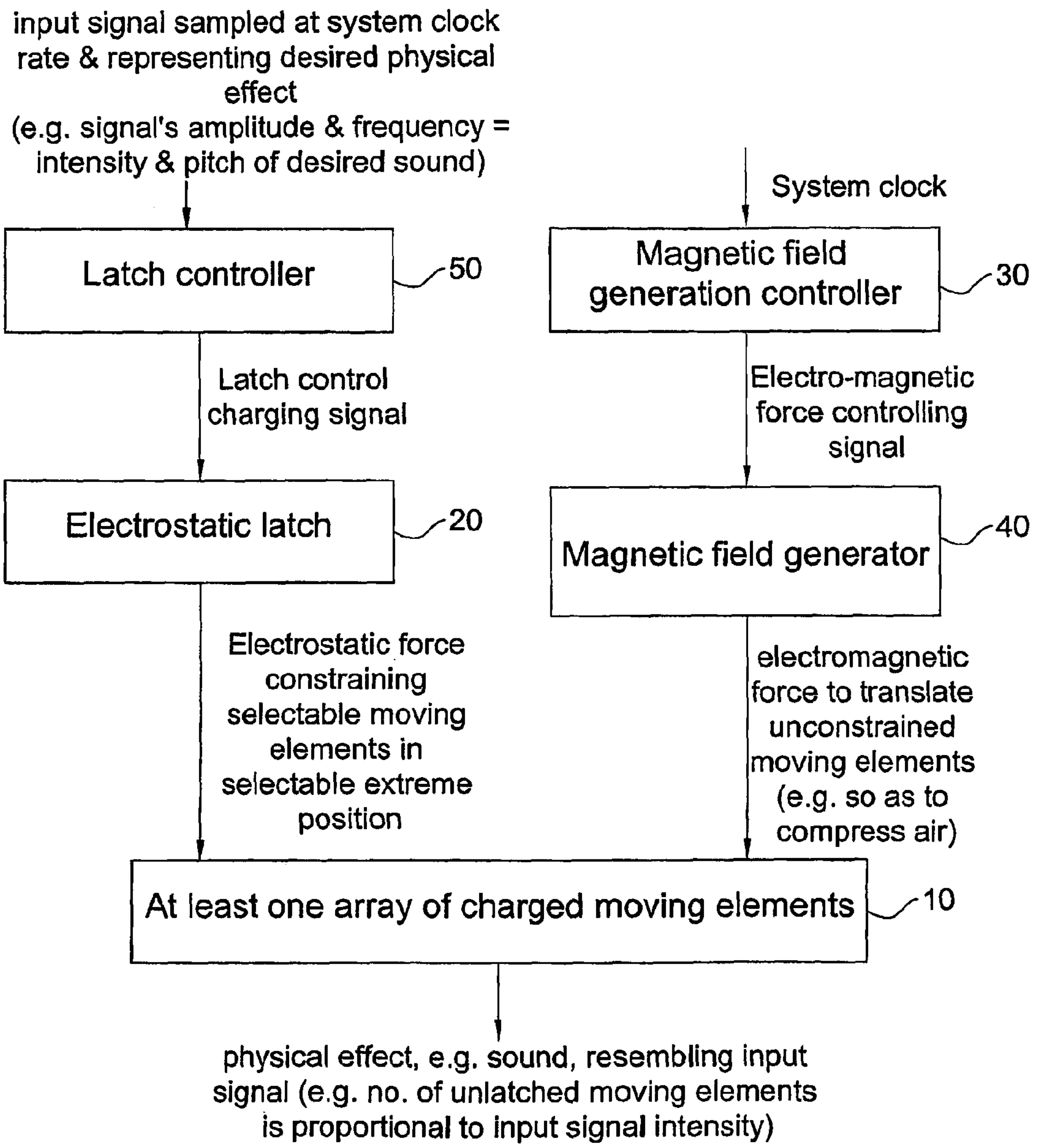
FIG. 1A is a simplified functional block diagram illustration of actuator apparatus constructed and operative in accordance with a preferred embodiment of the present invention.
Figure 1B:
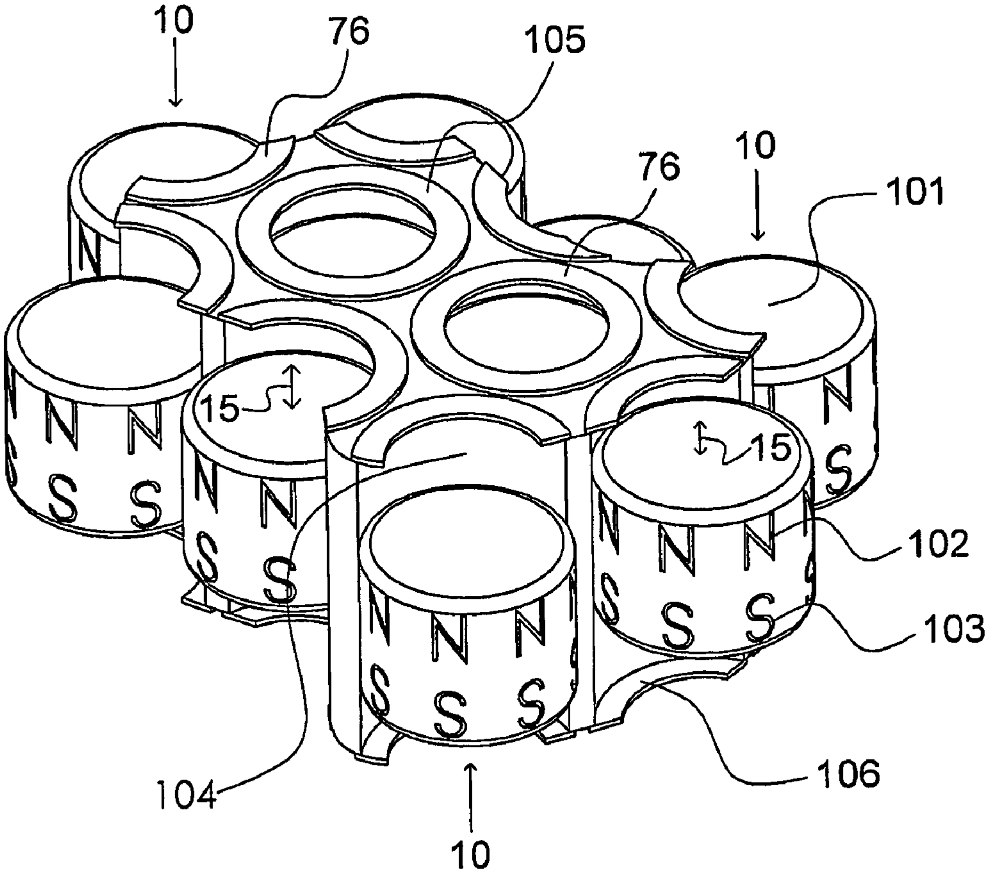
FIG. 1B is an isometric illustration of the array of moving elements of FIG. 1A constructed and operative in accordance with a preferred embodiment of the present invention in which each moving element comprises a magnet and each is constrained to travel, except when latched, alternately back and forth along a respective axis in response to an alternating electromagnetic force applied to the array of moving elements.
Figure 2A:
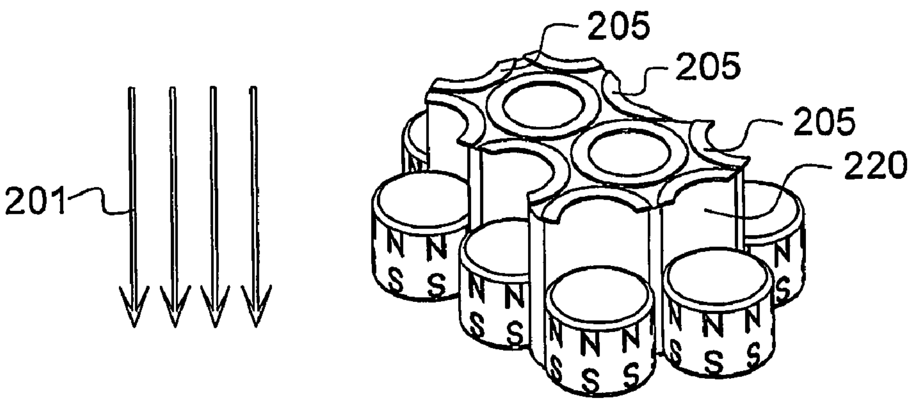
FIG. 2A shows the array of FIG. 1B in a first, bottom extreme position responsive to an electromagnetic force applied downward.
Figure 2B:
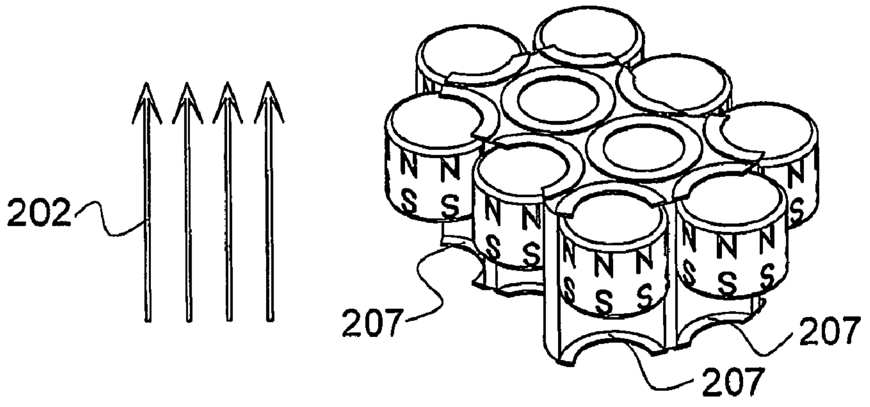
FIG. 2B shows the array of FIG. 1B in a second, top extreme position responsive to an electromagnetic force applied upward.
Figure 2C:
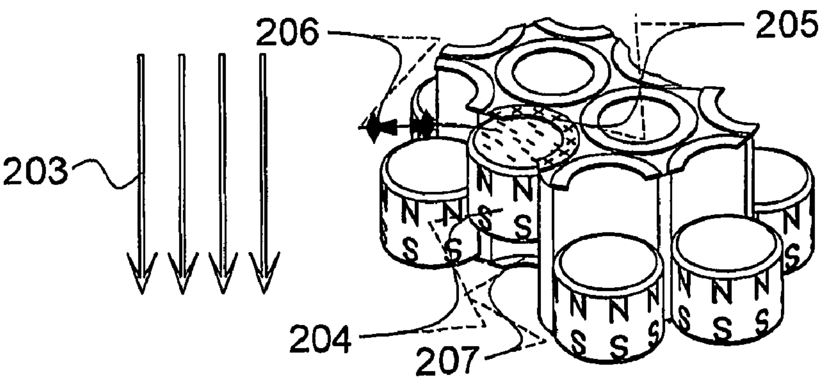
FIG. 2C is similar to FIG. 2B except that one of the individual moving magnets is not responding to the upward force because that individual magnet is latched into its top extreme position by a corresponding electric charge disposed above the individual moving magnet and functioning as a top latch.
Figure 3A:
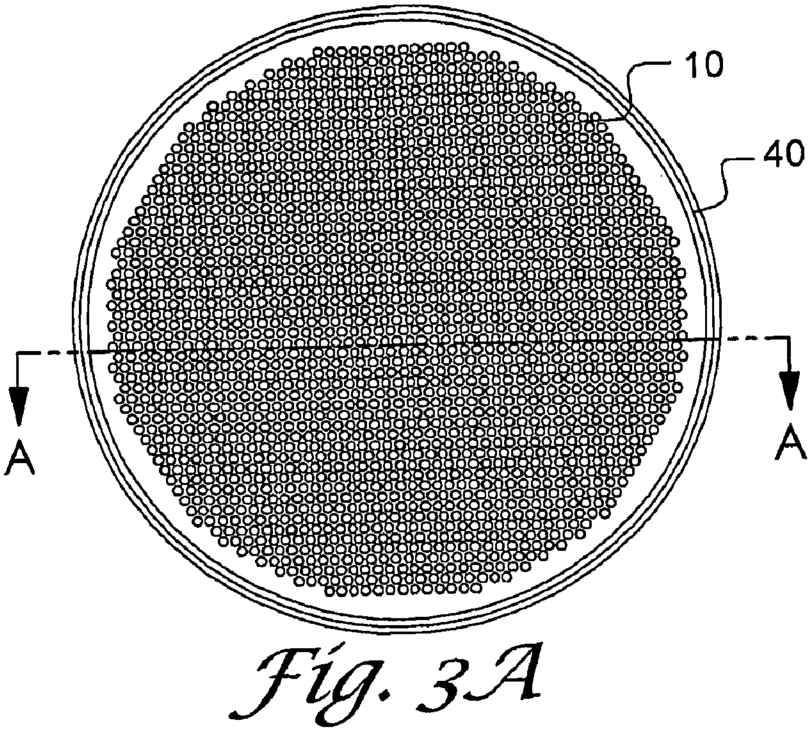
FIGS. 3A-3C are respective top, cross-sectional and isometric views of a skewed array of moving elements each constrained to travel alternately back and forth along a respective axis in response to an alternating electromagnetic force applied to the array of moving elements by a coil wrapped around the array.
Figure 3B:
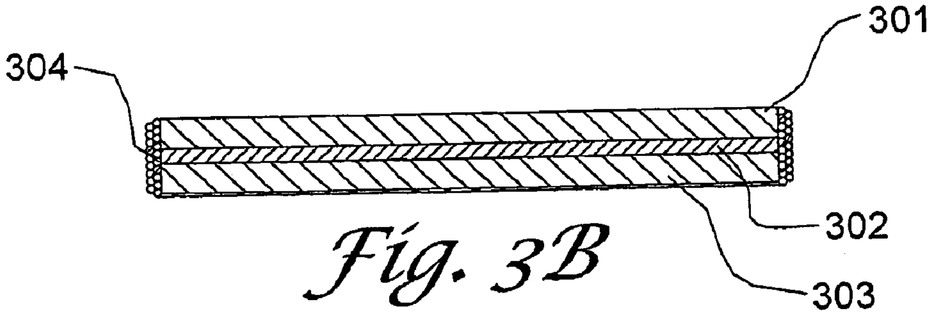
Figure 3C:
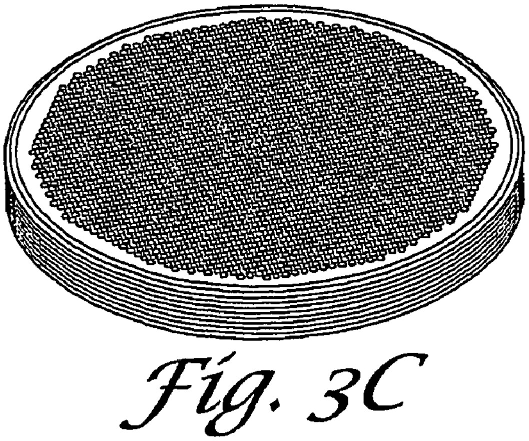

FIG. 1B is a conceptual overview of a small section of the device. FIG. 2A depicts the movement of the moving elements under magnetic field. FIG. 2B depicts the movement of the same moving elements under an opposite magnetic field. FIG. 2C depicts the movement of the moving elements under a magnetic field while one electrode is charged. FIGS. 3A-3C are respective top, cross-sectional and perspective views of one preferred embodiment of the present invention.

Figure 4A:
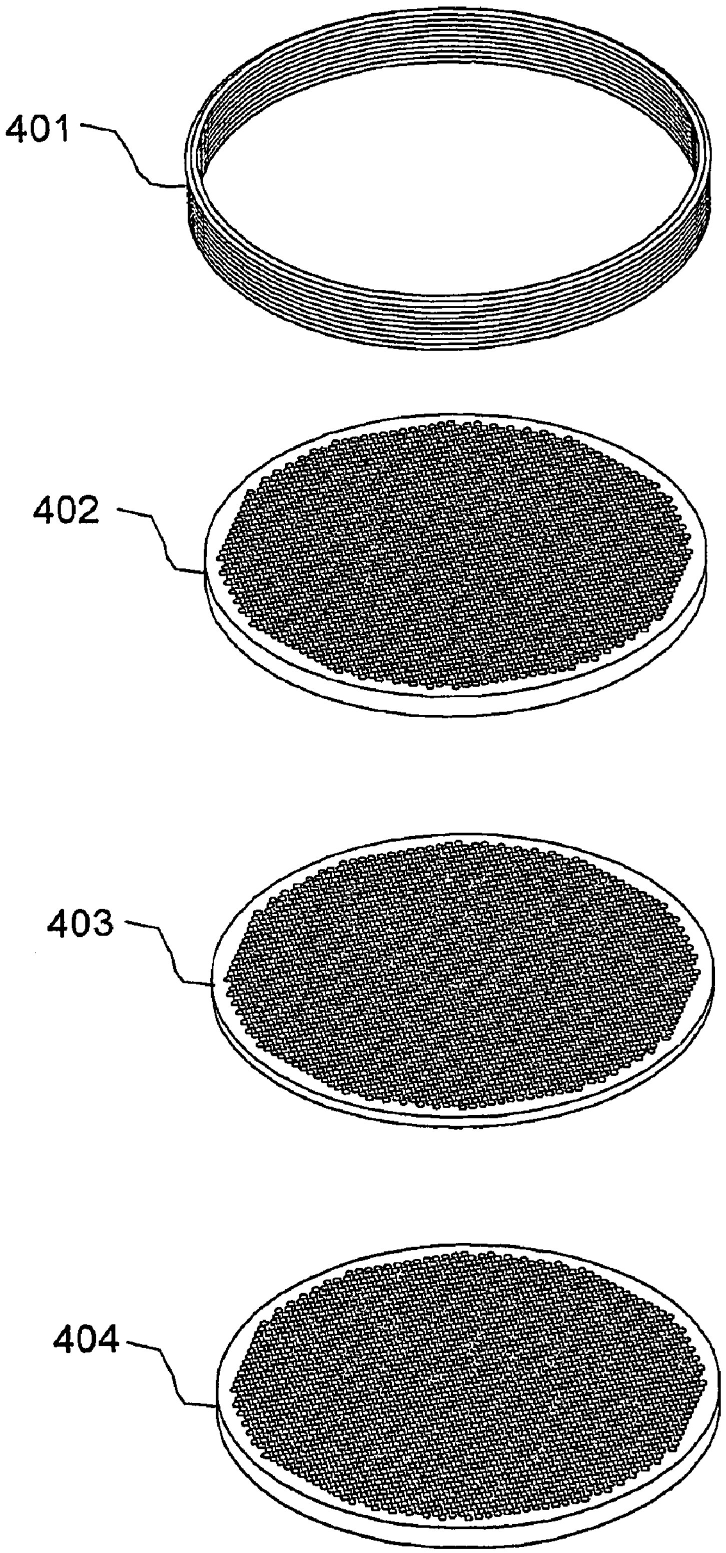
FIG. 4A is an exploded view of an actuator device including an array of moving elements each constrained to travel alternately back and forth along a respective axis in response to an alternating electromagnetic force applied to the array of moving elements by a coil, and a latch, formed as a layer, operative to selectively latch at least one subset of the moving elements in at least one latching position thereby to prevent the individual moving elements from responding to the electromagnetic force.
Figure 5:
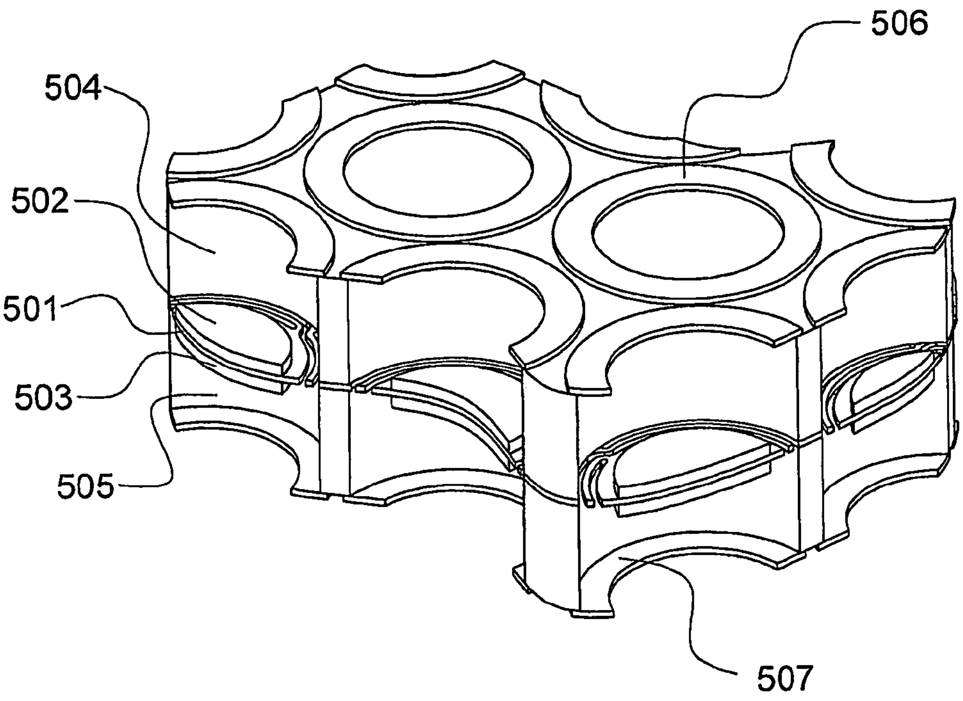
FIG. 5 is an isometric static view of the actuator device of FIG. 4A constructed and operative in accordance with a preferred embodiment of the present invention in which the array of moving elements is formed of thin foil, each moving element being constrained by integrally formed flexures surrounding it.
Figure 6A:
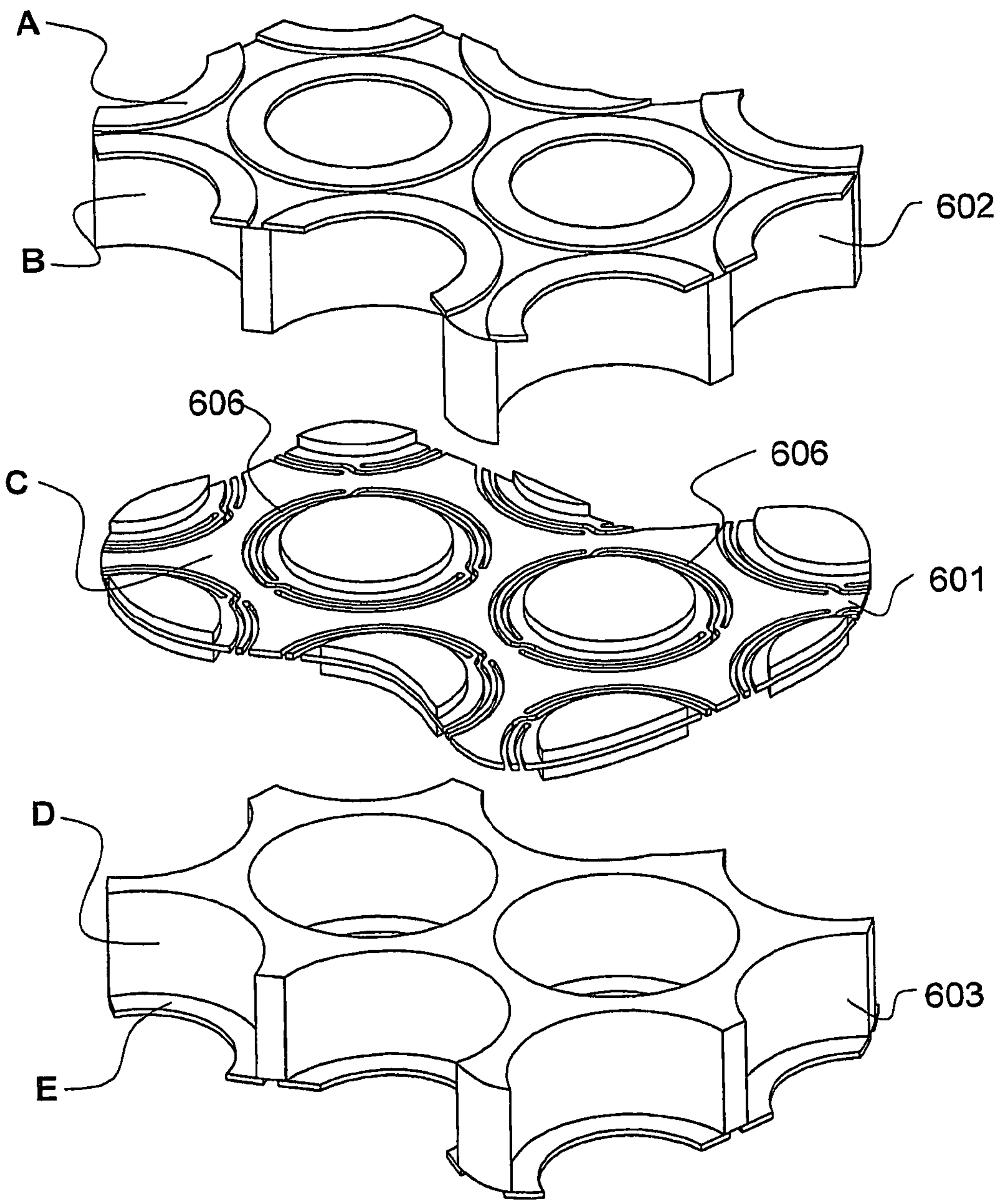
FIG. 6A is an exploded view of a portion of the actuator device of FIG. 5.
Figure 7A:
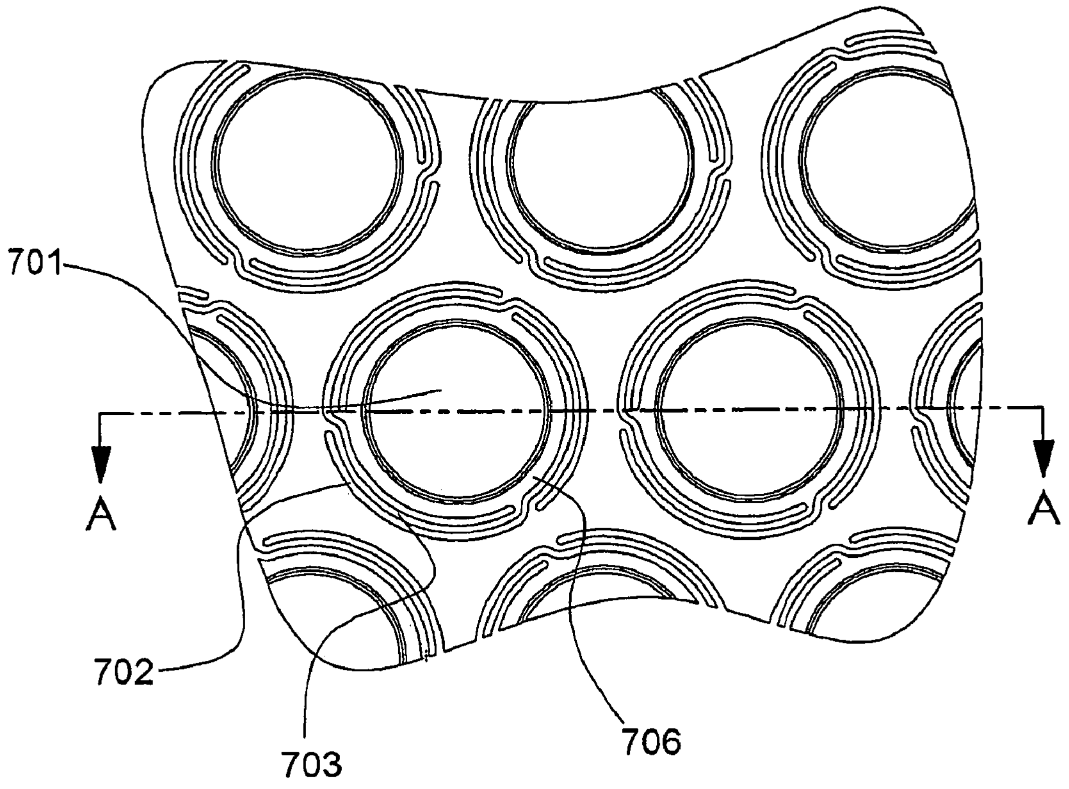
FIG. 7A is a static partial top view illustration of the moving element layer of FIGS. 5-6C.
Figure 7B:
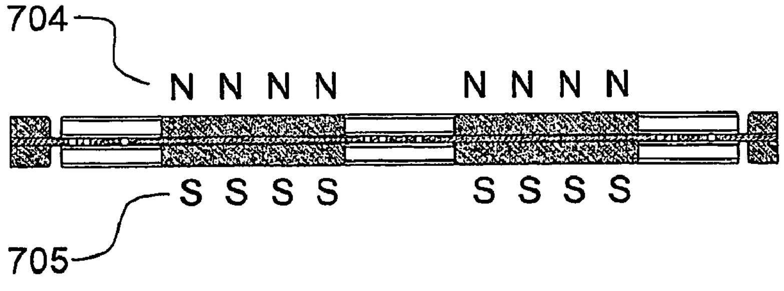
FIG. 7B is a cross-sectional view of the moving element layer of FIGS. 5-6 taken along the A-A axis shown in FIG. 7A.
Figure 8A:
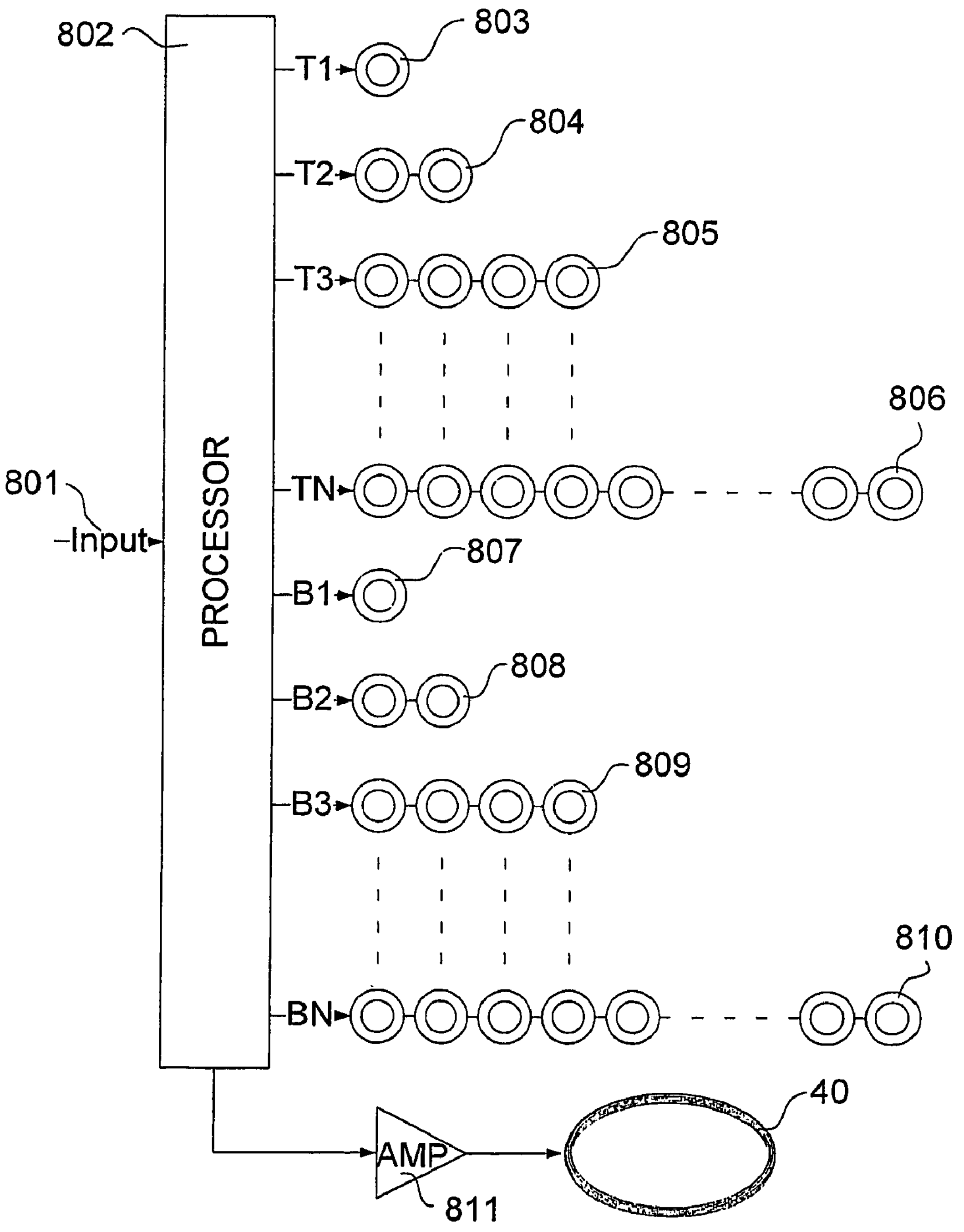
FIG. 8A is a control diagram illustrating control of the latches and of the coil-induced electromagnetic force for a particular example in which the moving elements are arranged in groups that can each, selectively, be actuated collectively, wherein each latch in the latching layer is associated with a permanent magnet, and wherein the poles of all of the permanent magnets in the latching layer are all identically disposed.
Figure 8B:
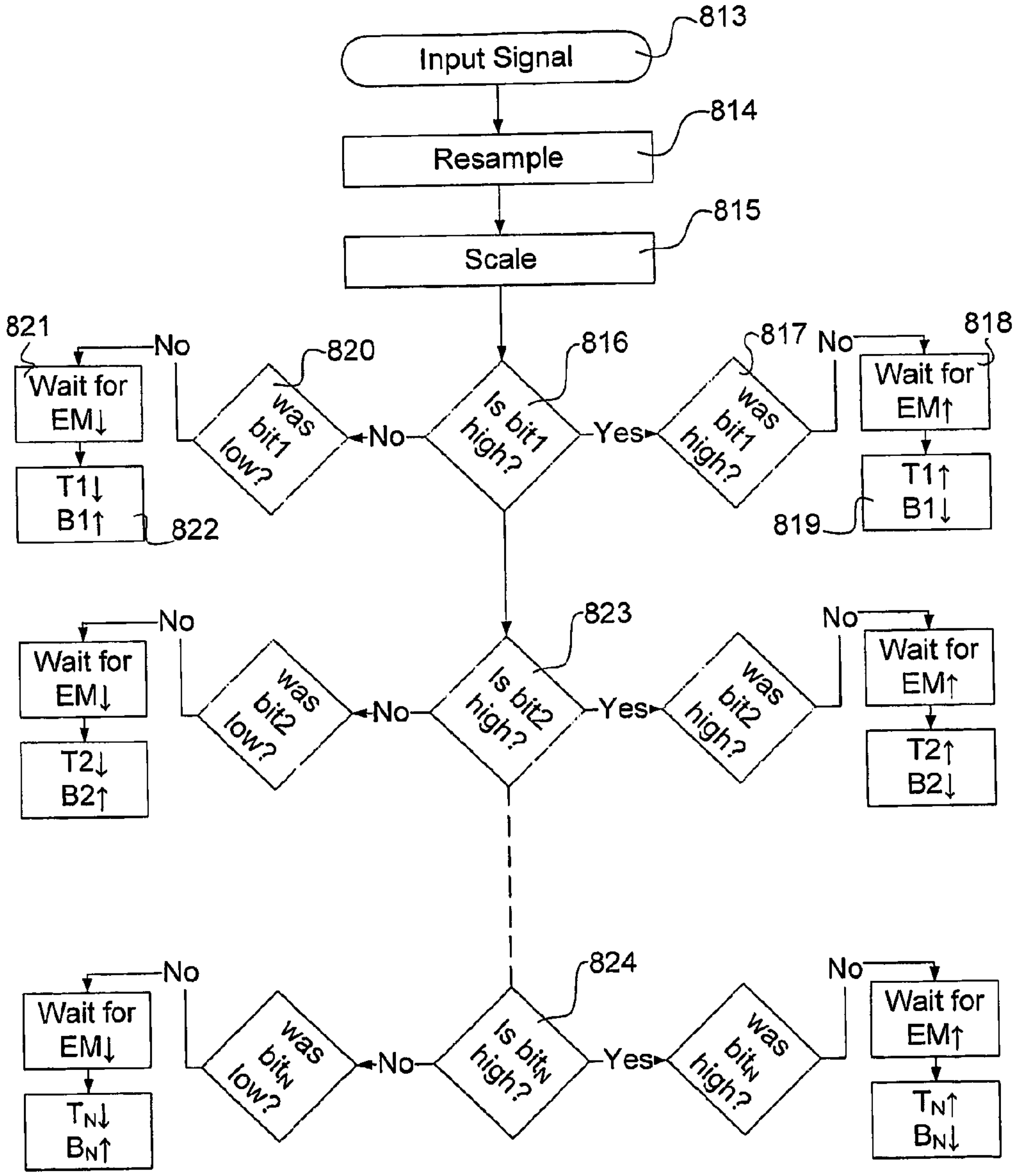
FIG. 8B is a flowchart illustrating a preferred method whereby a latching controller may process an incoming input signal and control moving elements' latches accordingly, in groups.
Figure 9A:
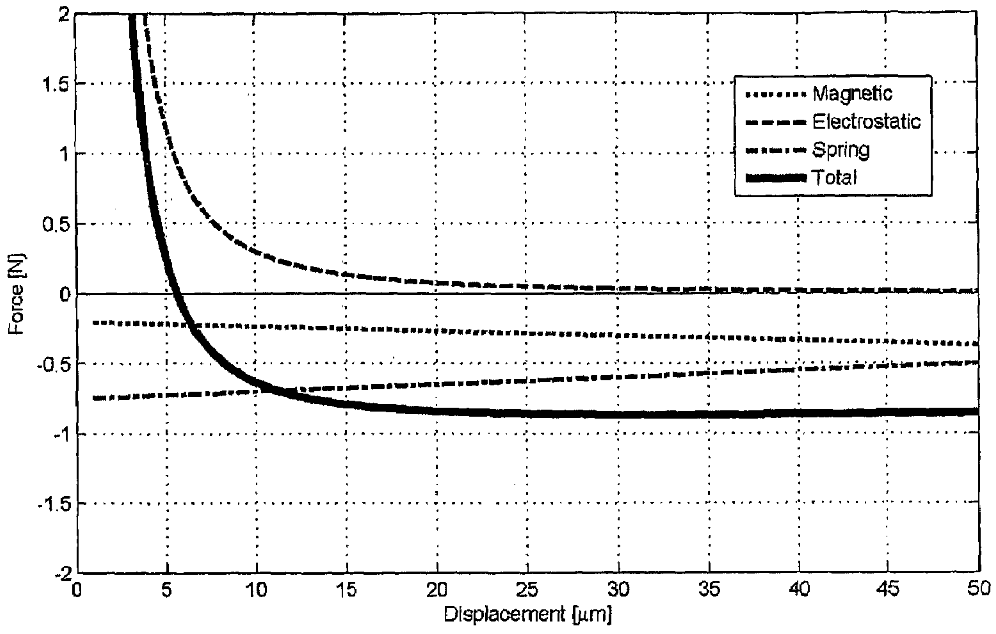
FIG. 9A is a graph summarizing certain, although typically not all, of the forces brought to bear on moving elements in accordance with a preferred embodiment of the present invention.

FIG. 4A is an exploded view of a device constructed and operative in accordance with a preferred embodiment of the present invention. FIG. 5 is a detailed illustration of a small section of the device constructed and operative in accordance with a preferred embodiment of the present invention. FIG. 6A is an exploded view of the same small section. FIG. 7A is a pictorial illustration of a serpentine and moving elements subassembly constructed and operative in accordance with a preferred embodiment of the present invention. FIG. 7B is an illustrative view of a single element, constructed and operative in accordance with a preferred embodiment of the present invention, in motion. FIG. 8A is a block diagram of a speaker system constructed and operative in accordance with a preferred embodiment of the present invention. FIG. 8B is a flow diagram of the speaker system constructed and operative in accordance with a preferred embodiment of the present invention. FIG. 9A illustrates a preferred relationship between the different forces applied to the moving elements.

Figure 10A:
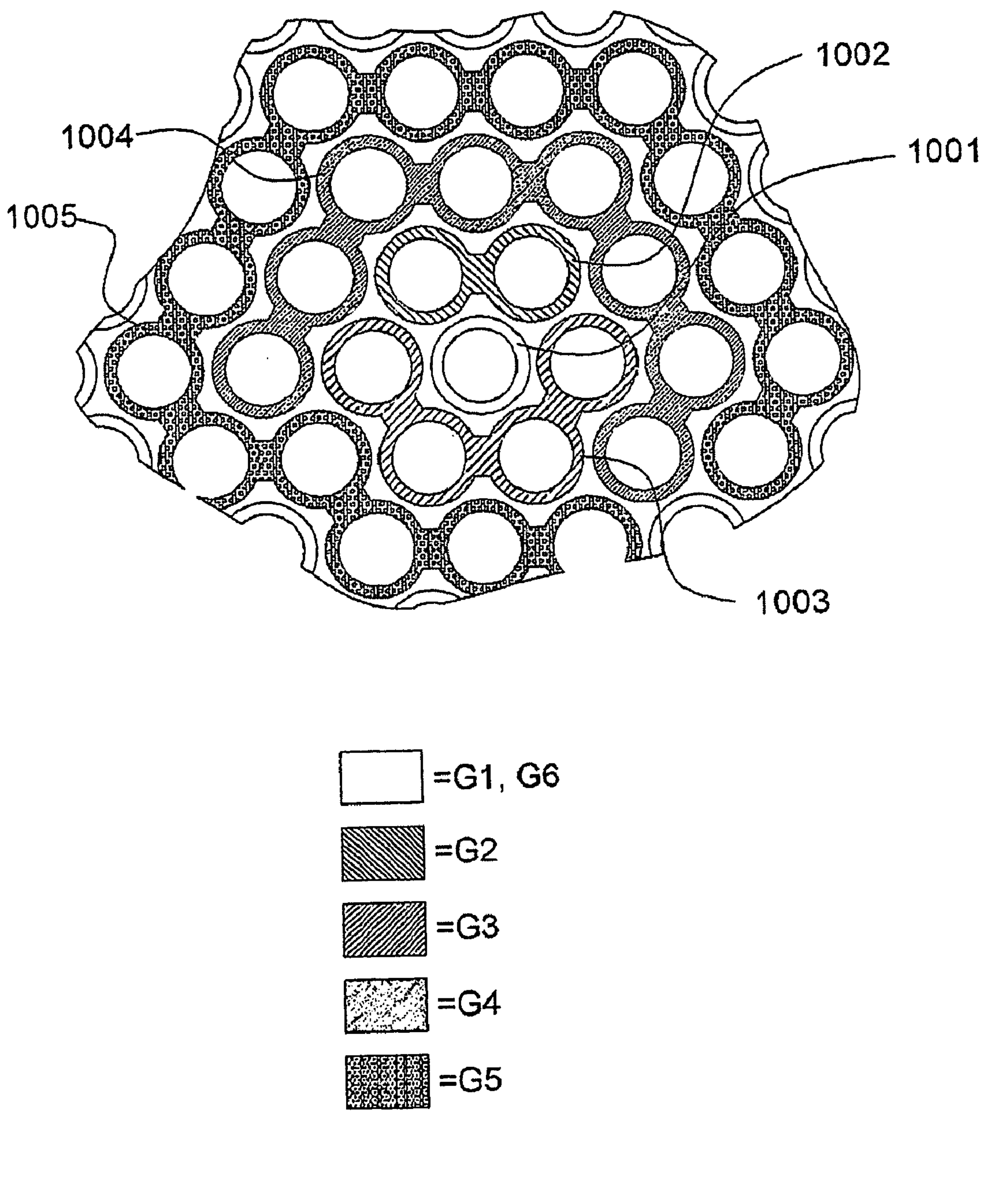
FIG. 10A is a simplified top cross-sectional illustration of a latching layer suitable for latching moving elements partitioned into several groups characterized in that any number of moving elements may be actuated by collectively actuating selected groups from among the partitioned groups, each latch in the latching layer being associated with a permanent magnet, wherein the poles of all of the permanent magnets in the latching layer are all identically disposed.
Figure 11A:
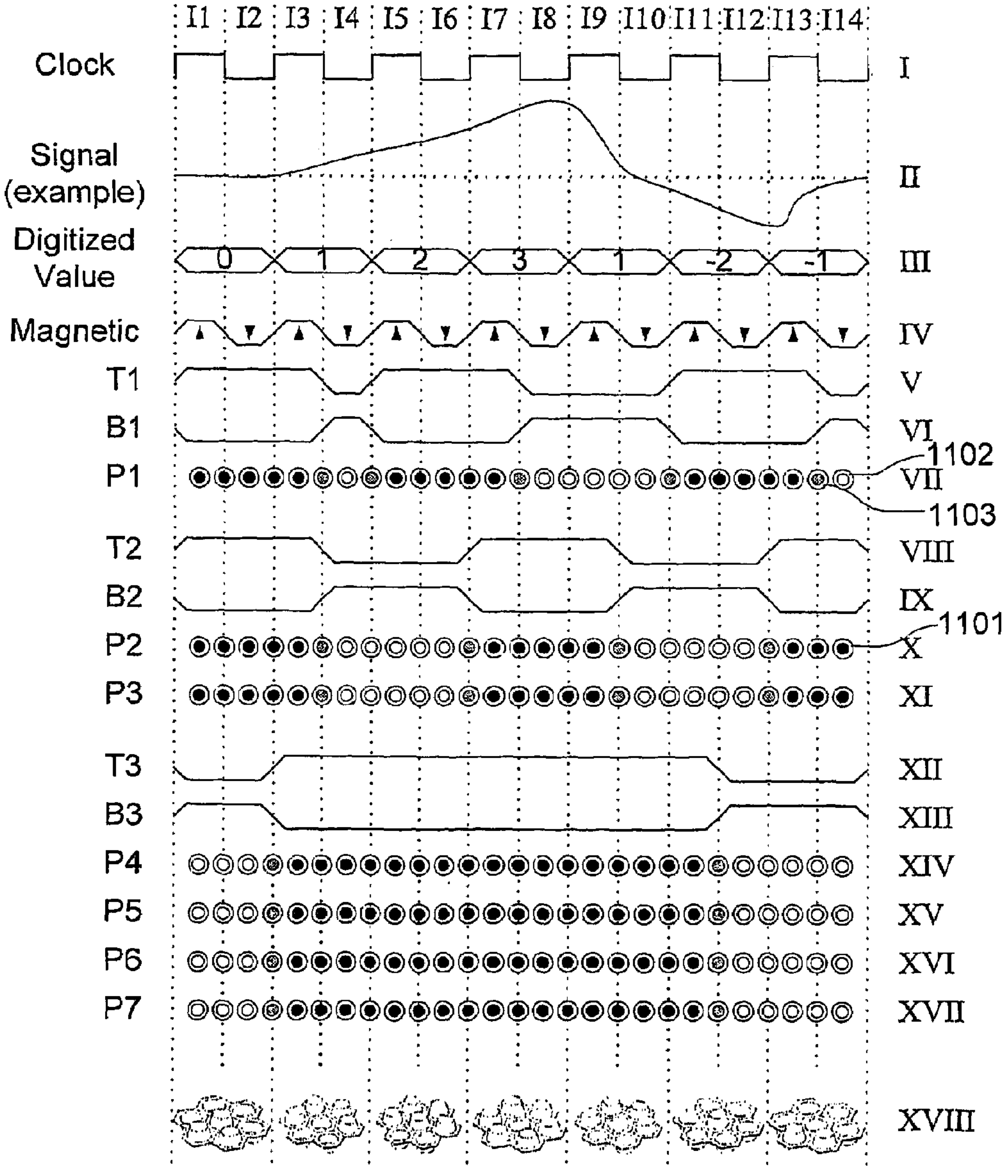
FIG. 11A is a timing diagram showing a preferred control scheme used by the latch controller in unidirectional speaker applications wherein an input signal representing a desired sound is received, and moving elements constructed and operative in accordance with a preferred embodiment of the present invention are controlled responsively, so as to obtain a sound pattern in which the volume in front of the speaker is greater than in other areas, each latch in the latching layer being associated with a permanent magnet, and the poles of all of the permanent magnets in the latching layer preferably all or substantially all being similarly or identically disposed.
Figure 12A:
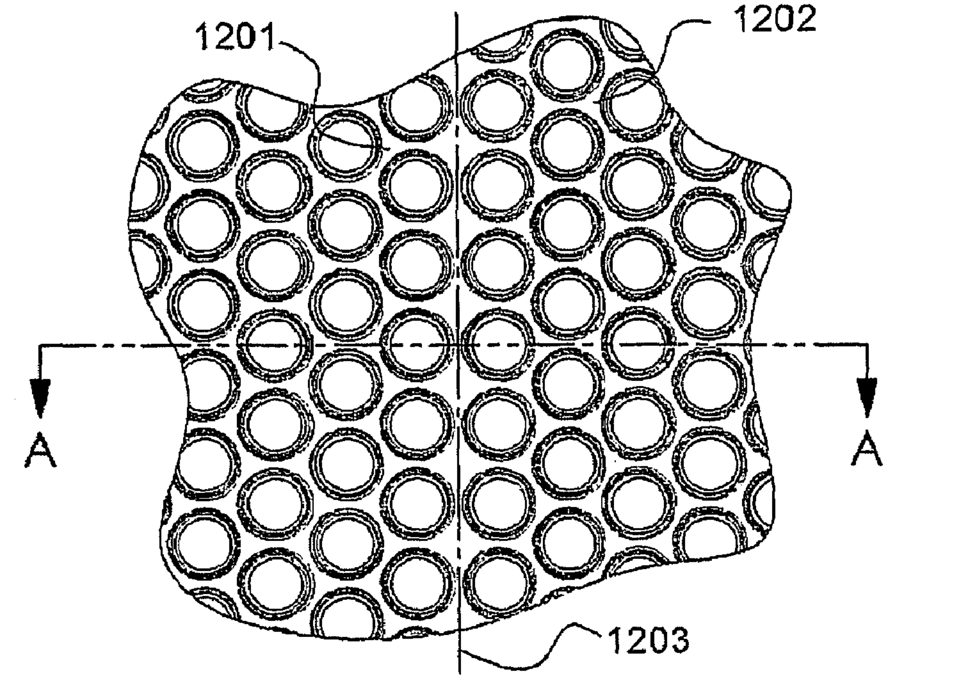
FIGS. 12A and 12B are respectively simplified top view and cross-sectional view illustrations of the moving element layer in accordance with an alternative embodiment in which half of the permanent magnets are placed north pole upward and half north pole downward.
Figure 13:
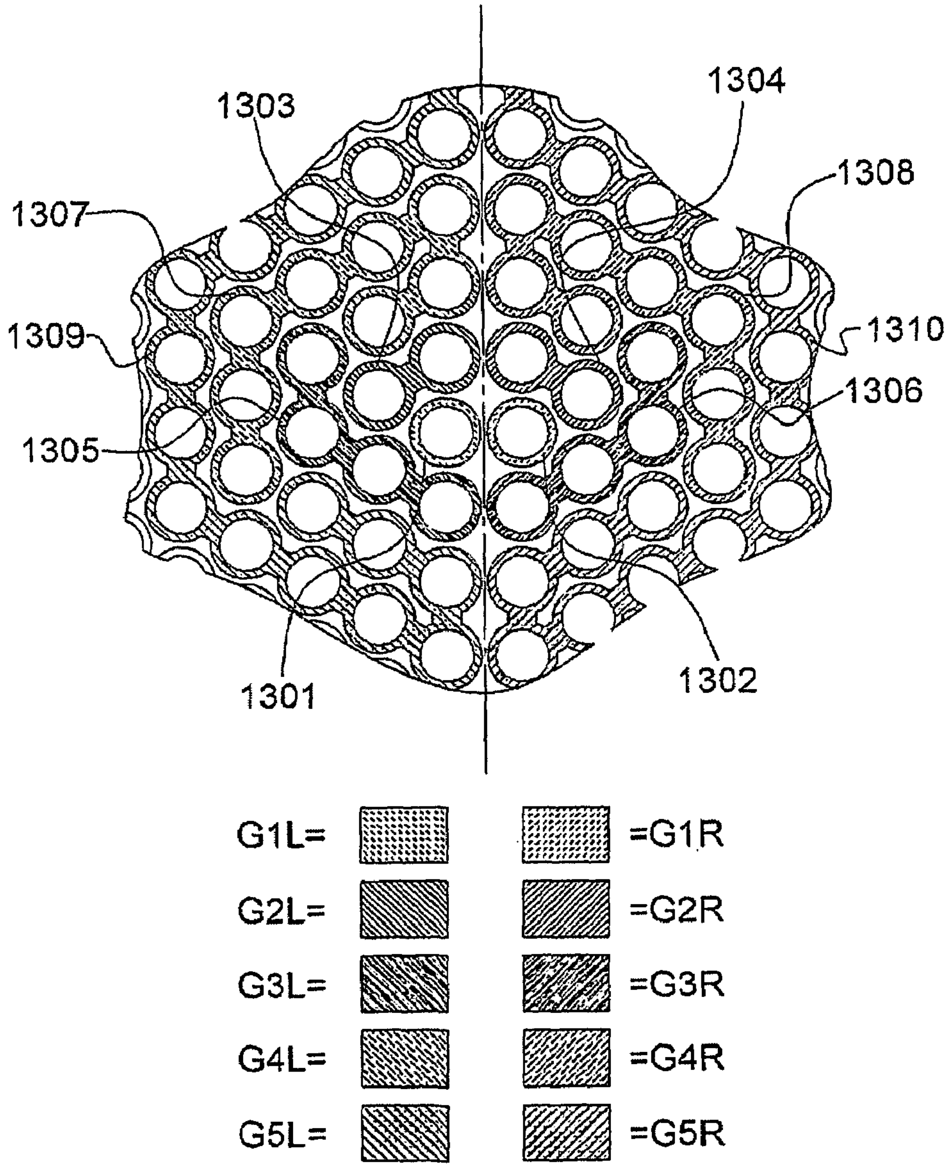
FIG. 13 is a simplified top view illustration similar to FIG. 10A except that half of the permanent magnets in the latching layer are disposed north pole upward and the remaining half of the permanent magnets in the latching layer are disposed north pole downward.
Figure 14:
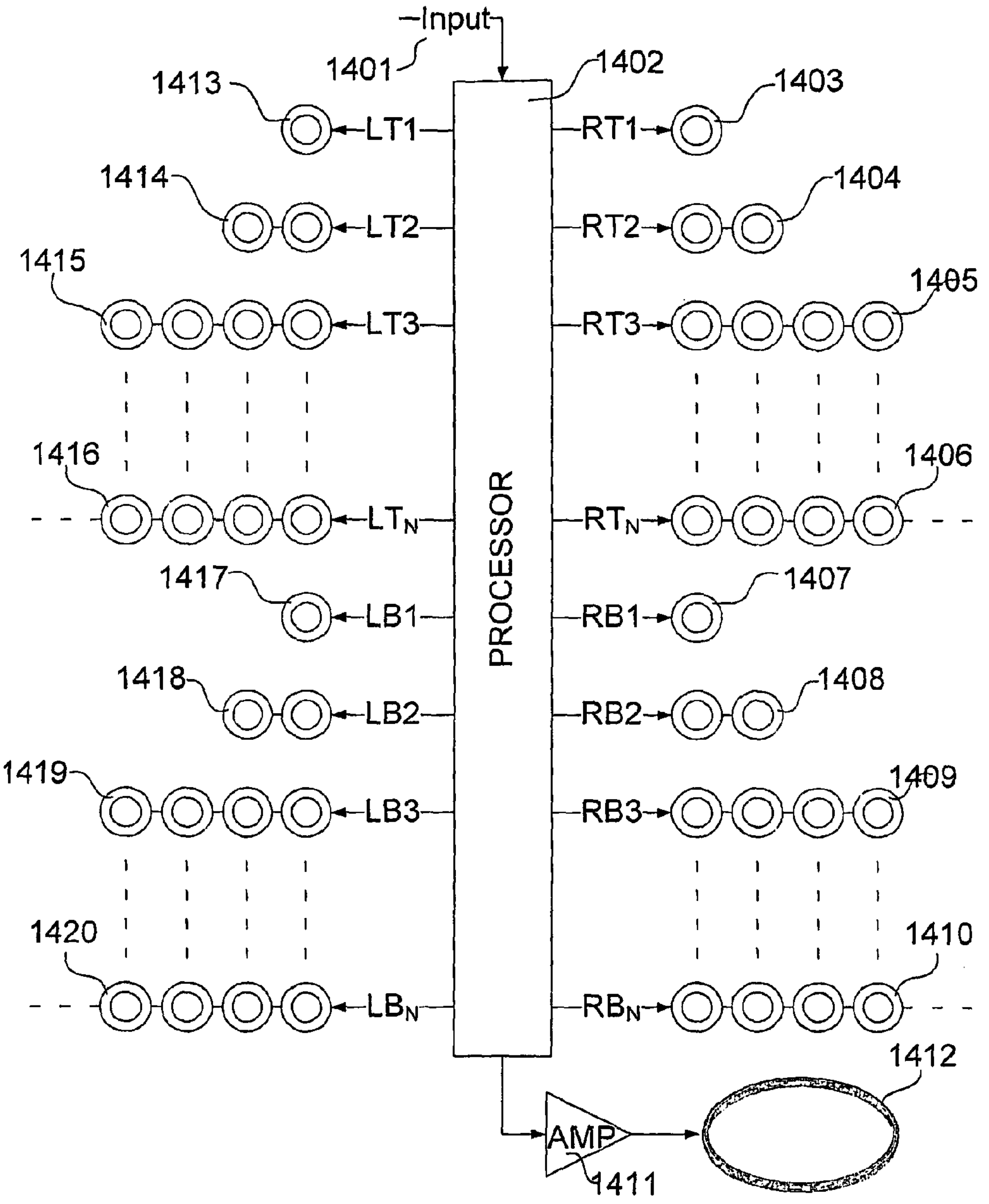
FIG. 14 is a control diagram illustrating control of the latches and of the coil-induced electromagnetic force for a particular example in which the moving elements are arranged in groups that can each, selectively, be actuated collectively, similar to FIG. 8A except that half of the permanent magnets in the latching layer are disposed north pole upward and the remaining half of the permanent magnets in the latching layer are disposed north pole downward.
Figure 15A:
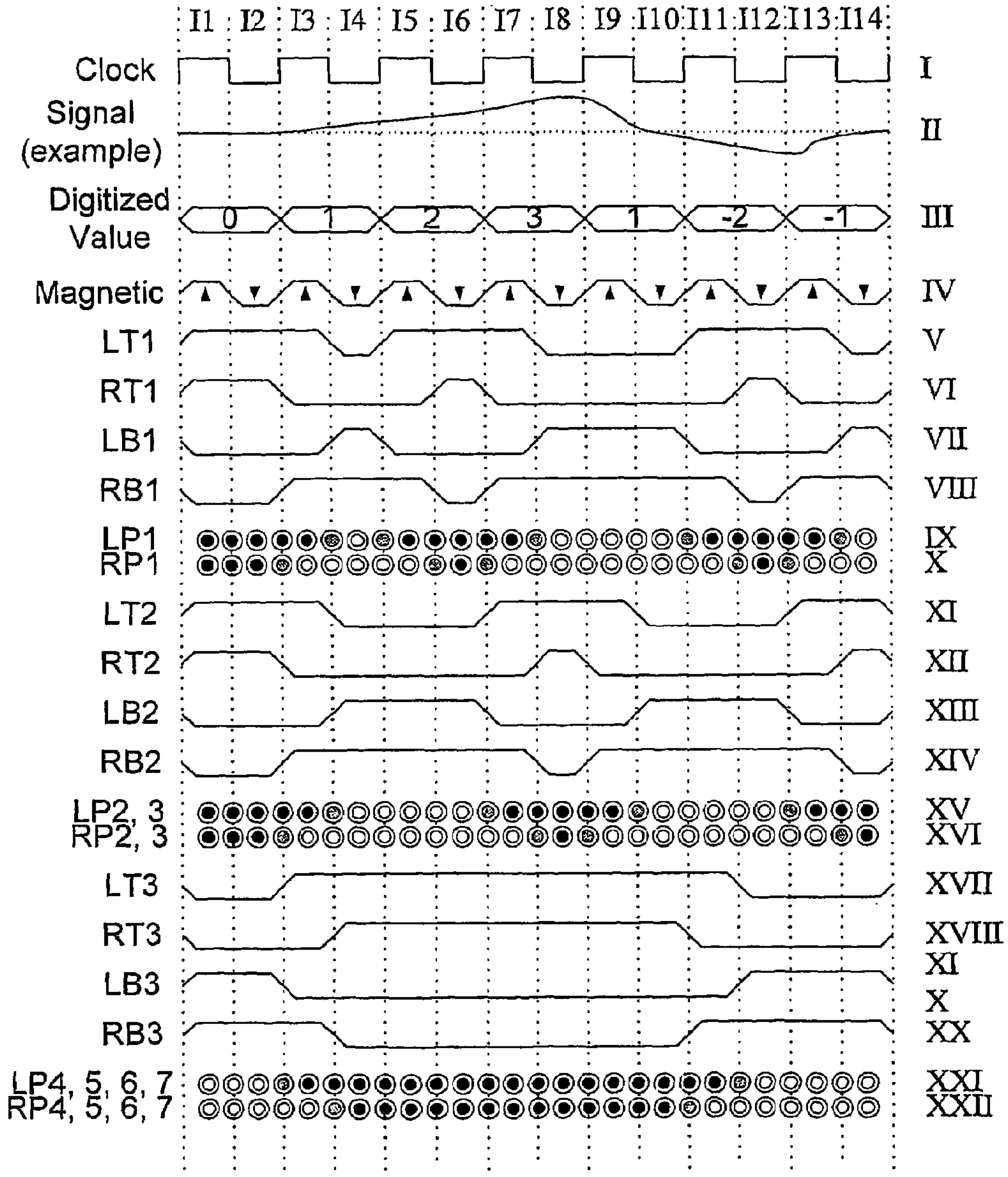
FIG. 15A is a timing diagram showing a preferred control scheme used by the latch controller in unidirectional speaker applications, which is similar to the timing diagram of FIG. 11A except that half of the permanent magnets in the latching layer are disposed north pole upward and the remaining half of the permanent magnets in the latching layer are disposed north pole downward.
Figure 16A:
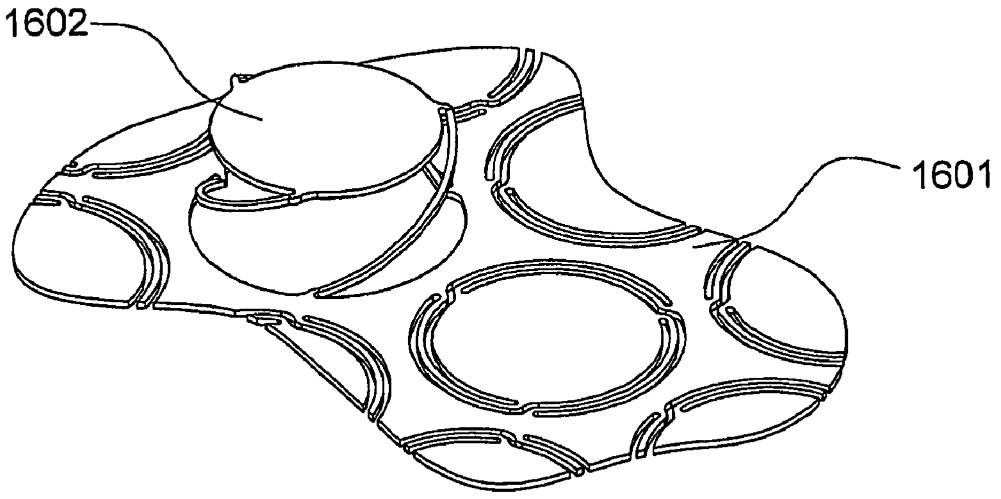
FIG. 16A illustrates a moving element layer which is an alternative to the moving element layer shown in FIGS. 1A and 2A-2C in which the layer is formed from a thin foil such that each moving element comprises a central portion and surrounding portions.
Figure 16B:
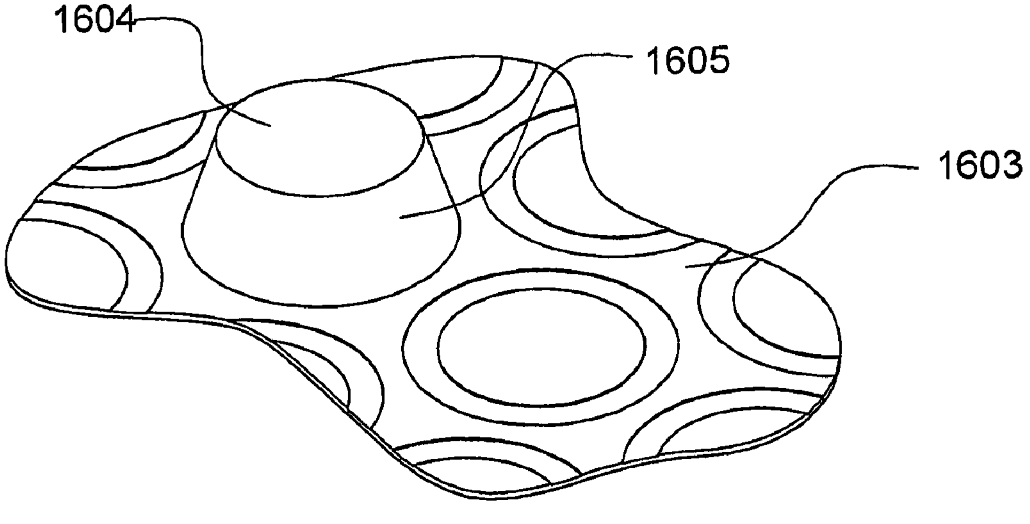
FIG. 16B is still another alternative to the moving element layer shown in FIGS. 1A and 2A-2C in which a sheet of flexible material e.g. rubber capable of enabling motion i.e. there are rigid discs under the magnet. The magnet might be the rigid element but it might not be rigid enough.

FIG. 10A is a grouping view of the electrodes constructed and operative in accordance with a preferred embodiment of the present invention. FIG. 11A is a timing and control chart constructed and operative in accordance with a preferred embodiment of the present invention. FIG. 12A illustrates magnetic properties of moving elements for an alternative addressing embodiment. FIG. 13 illustrates grouping of electrodes in an alternative addressing embodiment. FIG. 14 is a simplified block diagram of the speaker system in an alternative addressing embodiment. FIG. 15A is a timing and control chart for an alternative embodiment. FIG. 16A is a small section of the moving elements subassembly constructed and operative in accordance with a preferred embodiment of the present invention. FIG. 16B is a small section of a different embodiment of the moving elements subassembly, using a flexible substrate constructed and operative in accordance with a preferred embodiment of the present invention.

Figure 17:
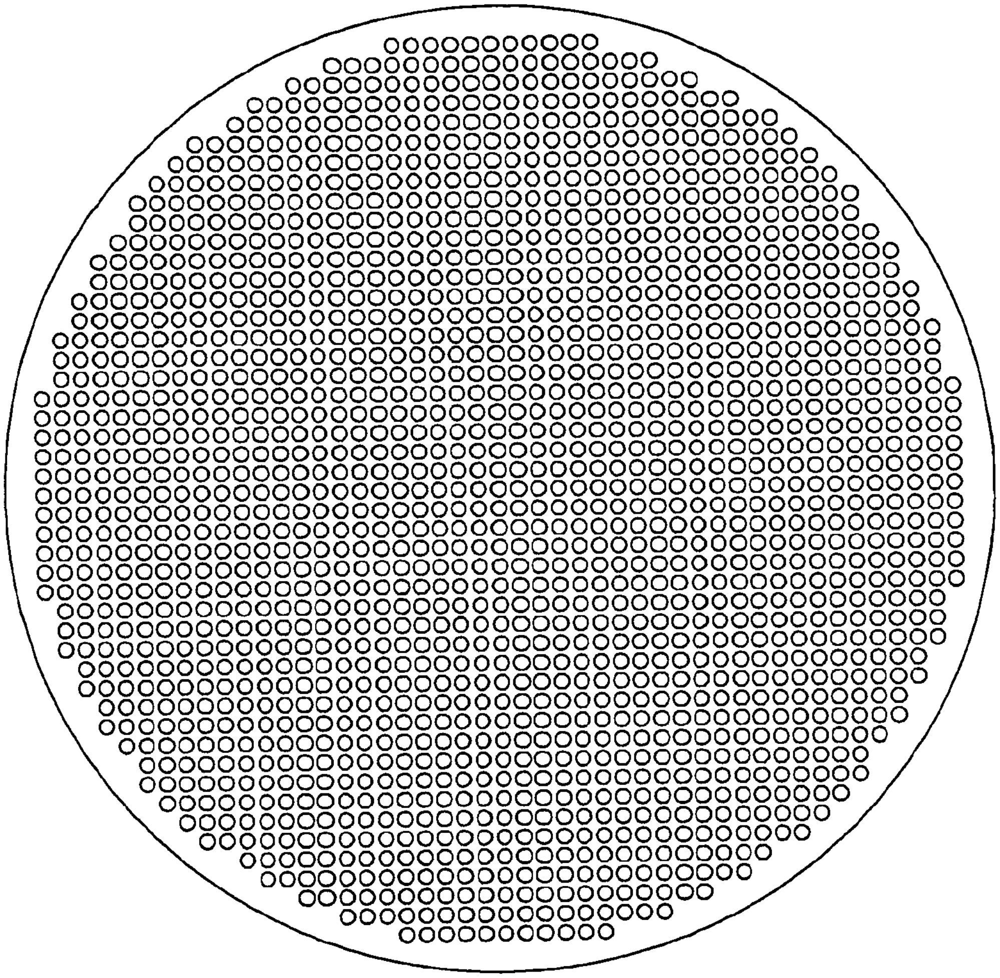
FIG. 17 is a top cross-sectional view illustration of an array of actuator elements similar to the array of FIG. 3A except that whereas in FIG. 3A, consecutive rows of individual moving elements or latches are respectively skewed so as to increase the number of actuator elements that can be packed into a given area, the rows in FIG. 17 are unskewed and typically comprise a rectangular array.
Figure 18:
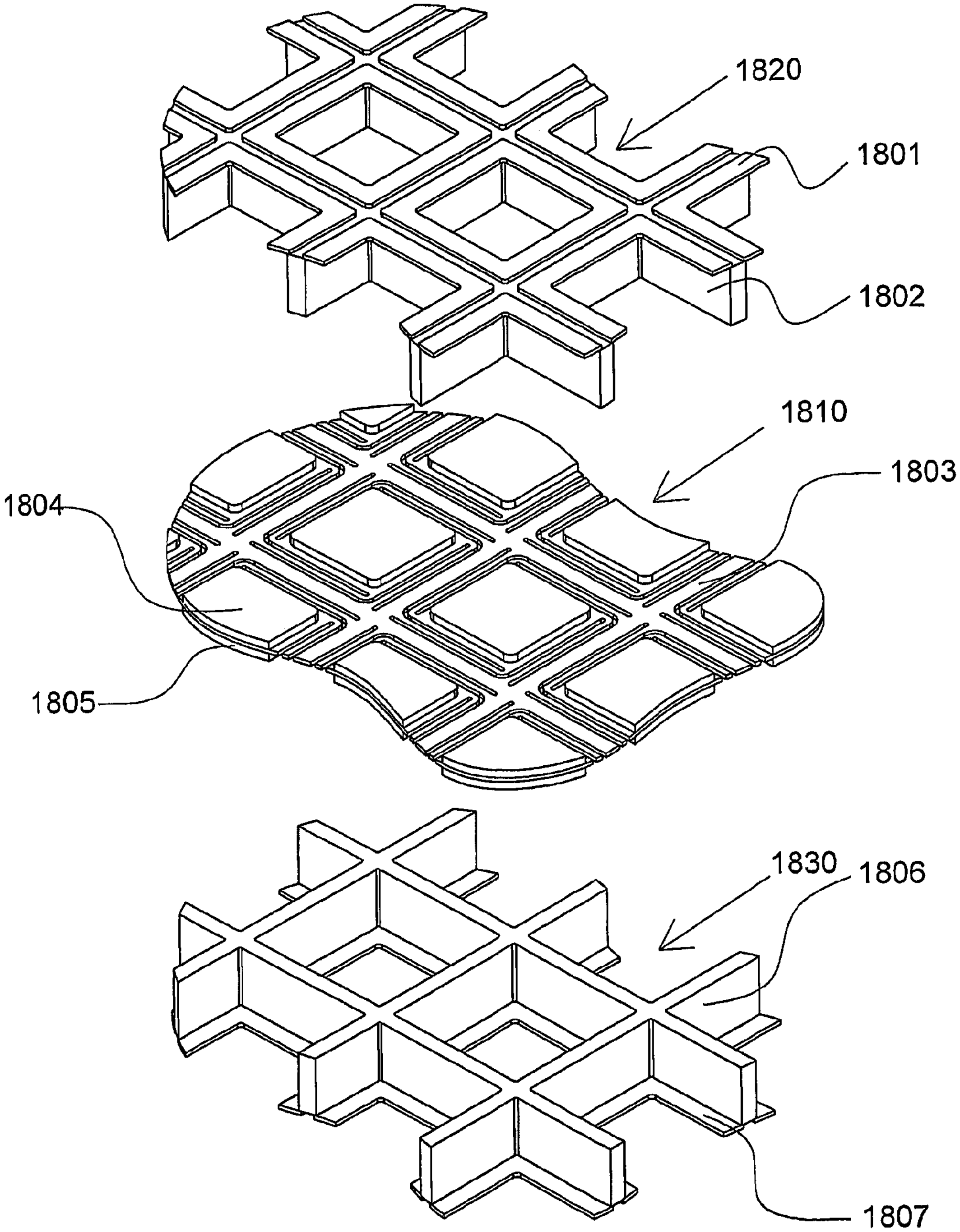
FIG. 18 is an exploded view of an alternative embodiment of an array of actuator elements in which the cross-section of each actuator element is square rather than round.
Figure 19:
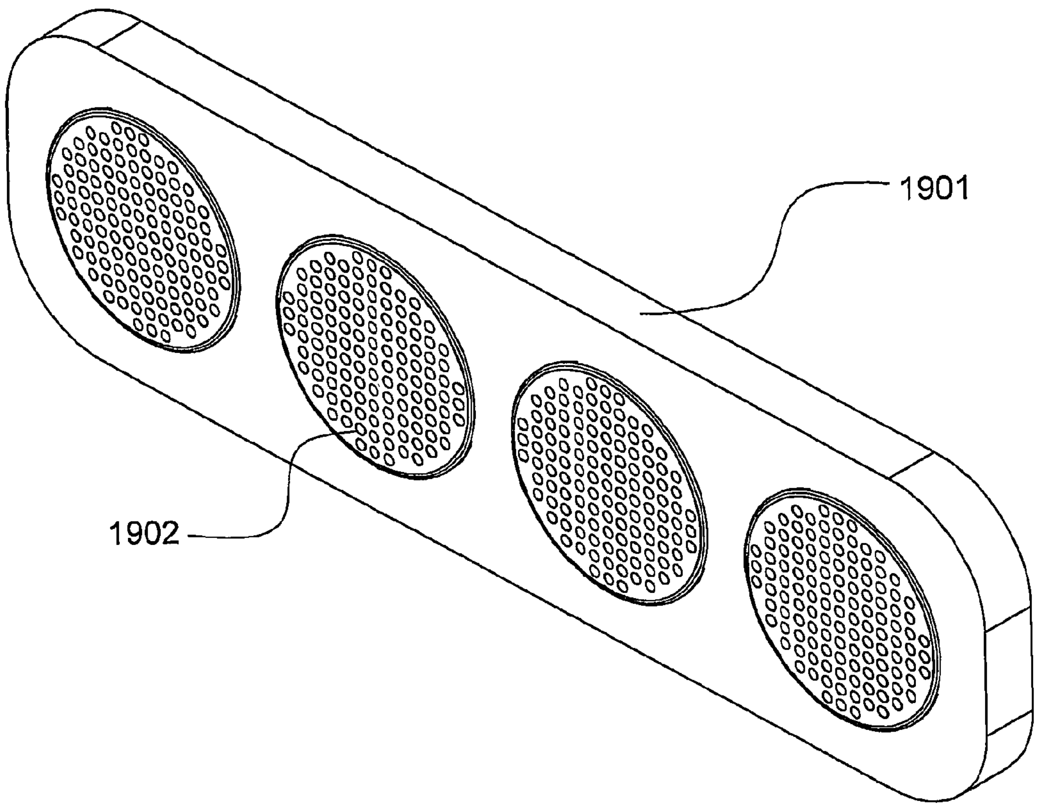
FIG. 19 is an isometric array of actuators supported within a support frame providing an active area which is the sum of the active areas of the individual actuator arrays.

Whereas FIGS. 3A-3C above illustrate an array of elements in a honeycomb construction constructed and operative in accordance with a preferred embodiment of the present invention, FIG. 17 illustrates an array of elements in a square construction, which is constructed and operative in accordance with a preferred embodiment of the present invention. FIG. 18 is an exploded view of a small section of an embodiment using square shaped elements. FIG. 19 illustrates an apparatus using a plurality (array) of devices.

Effective addressing is typically achieved through unique patterns of interconnects between select electrodes and unique signal processing algorithms which typically effectively segments the total number of actuators in a single transducer, into N addressable actuator groups of different sizes, beginning with a group of one actuator followed by a group of double the number of actuators of its previous group, until all N actuators in the transducer have been so grouped.

To attain actuator strokes the transducer is typically encompassed with a wire coil, which, when electrical current is applied, creates an electromagnetic field across the entire transducer. The electromagnetic field causes the moving part of the membrane to move typically in a linear fashion through the actuator channels. If the current alternates its polarity, it causes the moving part of the membrane to vibrate. When electrostatic charge is applied to particular addressable electrode groups, it will typically cause all actuators in that group to lock at the end of the stroke, either on top or bottom of the support structure in accordance with the application requirement. Collectively the displacement provided by the transducer is achieved from the sum total of the N actuators that are not locked at any particular interval (super position).

The transducer construction is typically fully scalable in the number of actuators per transducer, the size of each actuator, and the length of stroke of each actuator, and the number of addressable actuator groups. In certain embodiments, the actuator elements may be constructed by etching various shapes into a particular material, or by using layered metallic disks that have been coated with a flexible material or by using free floating actuator elements. The membrane (flexure) materials may include Silicon, Beryllium Copper, Copper Tungsten alloys, Copper Titanium alloys, stainless steel or any other low fatigue material. The addressable electrodes of the support structure may be grouped in any pattern as to attain addressing as appropriate for the transducer application. The addressable electrodes may be affixed such that contact is created with the membrane actuator or in such a manner that there is no physical contact with the membrane. The substrate material may be of any insulating material such as FR4, silicon, ceramic or any variety of plastics. In some embodiments the material may contain ferrite particles. The number of serpentine shapes etched into the membrane, or floating actuator elements and the corresponding channels of the support structure may be round, square or any other shape. The electromagnetic field may be created by winding a coil around the entire transducer, around sections of the transducer or around each actuator element or by placing one or more coils next to one or more actuator elements.

In certain embodiments a direct digital method is used to produce sound using an array of micro-speakers. Digital sound reconstruction typically involves the summation of discrete acoustic pulses of energy to produce sound-waves. These pulses may be based on a digital signal coming from audio electronics or digital media in which each signal bit controls a group of micro-speakers. In one preferred embodiment of the current invention, the nth bit of the incoming digital signal controls $2^n$ micro-speakers in the array, where the most significant bit (MSB) controls about half of the micro-speakers and the least significant bit (LSB) controls at least a single micro-speaker. When the signal for a particular bit is high, all of the speakers in the group assigned to the bit are typically activated for that sample interval. The number of speakers in the array and the pulse frequency determine the resolution of the resulting sound-wave. In a typical embodiment, the pulse frequency may be the source-sampling rate. Through the post application of an acoustic low-pass filter from the human ear or other source, the listener typically hears an acoustically smoother signal identical to the original analog waveform represented by the digital signal.

According to the sound reconstruction method described herein, the generated sound pressure is proportional to the number of operating speakers. Different frequencies are produced by varying the number of speaker pulses over time. Unlike analog speakers, individual micro-spealers typically operate in a non-linear region to maximize dynamic range while still being able to produce low frequency sounds. The net linearity of the array typically results from linearity of the acoustic wave equation and uniformity between individual speakers. The total number of non-linear components in the generated sound-wave is typically inversely related to the number of micro-speakers in the device.

In a preferred embodiment a digital transducer array is employed to implement true, direct digital sound reconstruction. The produced sound's dynamic range is proportional to the number of micro-speakers in the array. The maximal sound pressure is proportional to the stroke of each micro-speaker. It is therefore desirable to generate long stroke transducers and to use as many as possible. Several digital transducer array devices have been developed over the years. One worth mentioning is a CMOS-MEMS micro-speaker developed at Carnegie Mellon University. Using CMOS fabrication process, they designed an 8-bit digital speaker chip with 255 square micro-speakers, each micro-speaker 216 μm on a side. The membrane is composed of a serpentine Al—SiO2 mesh coated with polymer and can be electrostatically actuated by applying a varying electrical potential between the CMOS metal stack and silicon substrate. The resulting out of plane motion is the source of pressure waves that produce sound. Each membrane has a stroke of about 10 μm. Such short strokes are insufficient and the generated sound levels are too soft for a loudspeaker. Another issue is that the device requires a driving voltage of 40V. Such voltage requires complex and expensive switching electronics. Preferred embodiments of the device described herein overcome some or all of these limitations and generate much louder sound levels while eliminating the need for high switching voltages.

It is believed that the shape of each transducer has no significant effect on the acoustic performance of the speaker. Transducers may be packed in square, triangle or hexagonal grids, inter alia.

The current invention typically makes use of a combination of magnetic and electrostatic forces to allow a long stroke while avoiding the problems associated with traditional magnetic or electrostatic actuators.

The moving elements of the transducer array are typically made to conduct electricity and may be magnetized so that the magnetic poles are perpendicular to the transducer array surface. Moderate conduction is sufficient. A coil surrounds the entire transducer array or is placed next to each element and generates the actuation force. Applying alternating current or alternating current pulses to the coil creates an alternating magnetic field gradient that forces all the moving elements to move up and down at the same frequency as the alternating current. To control each moving element, two electrodes may be employed, one above and one below the moving elements.

The current applied to the coil typically drives the moving elements into close proximity with the top and bottom electrode in turn. A small electrostatic charge is applied to the moving elements. Applying an opposite charge to one of the electrodes generates an attracting force between the moving element and the electrode. When the moving element is very close to the electrode, the attracting force typically becomes larger than the force generated by the coil magnetic field and the retracting spring and the moving element is latched to the electrode. Removing the charge or some of it from the electrode typically allows the moving element to move along with all the other moving elements, under the influence of the coil magnetic field and the flexures.

In accordance with certain embodiments, the actuator array may be manufactured from 5 plates or layers:

Top electrode layer
Top spacers (together shown as layer 402)
Moving elements 403
Bottom spacers
Bottom electrode layer (together shown as layer 404)

In accordance with certain embodiments, the array is surrounded by a large coil 401. The diameter of this coil is typically much larger than that of traditional coils used in prior art magnetic actuators. The coil can be manufactured using conventional production methods.

In certain embodiments the moving element is made of a conductive and magnetic material. Moderate electrical conduction is typically sufficient. The moving element may be manufactured using many types of materials, including but not limited to rubber, silicon, or metals and their alloys. If the material cannot be magnetized or a stronger magnet is desired, a magnet may be attached to it or it may be coated with magnetic material. This coating is typically done by application, using a screen printing process or other techniques known in the art, by epoxy or another resin loaded with magnetic powder. In some embodiments, screen printing can be performed using a resin mask created through a photolithographic process. This layer is typically removed after curing the resin/magnetic powder matrix. In certain embodiments the epoxy or resin is cured while the device is subjected to a strong magnetic field, orienting the powder particles in the resin matrix to the desired direction. The geometry of the moving elements can vary. In yet other embodiments, part of the moving elements may be coated with the magnet and cured with a magnetic field oriented in one direction while the rest are coated later and cured in an opposite magnetic field causing the elements to move in opposite directions under the same external magnetic field. In one preferred embodiment, the moving element comprises a plate that has a serpentine shape surrounding it, typically cut out from thin foil. Alternatively, in certain embodiments it is possible to use a thick material thinned only in the flexure area or by bonding relatively thick plates to a thin layer patterned as flexures. This shape allows part of the foil to move while the serpentine shape serves as a compliant flexure. In certain other embodiments, the moving part is a cylinder or a sphere, free to move about between the top and bottom electrodes.

FIG. 1B, which illustrates a conceptual overview of small section of the device in accordance with certain embodiments of the invention, serves to provide a conception overview of the complete transducer array structure. In the illustrated embodiment the moving elements are pistons 101 which are typically magnetized so that one pole 102 is on the top and the other 103 at the bottom of each piston. A magnetic field generator (not shown) that typically influences the entire transducer array structure creates a magnetic field across the entire transducer array, typically causing pistons 101 to move up and down, thereby forcing the air out of the cavity 104. An electrostatic electrode typically resides on both the top 105 and bottom 106 of each cavity. The electrodes serve as latching mechanisms that attract and hold each piston as it nears its end of stroke typically preventing the piston from moving until the latch is released, while allowing the pushed air to easily pass through. In certain embodiments, the pistons 101 are made of an electrically conductive material or coated with such material. At least one of the elements, the piston and/or the electrostatic electrode is typically covered by a dielectric layer to avoid shorting as pull-down occurs.

FIGS. 2A-2C, taken together, illustrate the element movement according to a preferred embodiment of the present invention. In this embodiment a coil (not shown) typically surrounds the entire transducer array structure, creating a magnetic field across the entire transducer array which causes any magnetic element with freedom of movement to travel according to the alternating direction of the field. This causes the pistons to move typically up and down.

In FIG. 2A the magnetic field 201 direction is downwards. The magnetic field creates a force, driving the pistons 101 of the entire array downwards.

In FIG. 2B the magnetic field 202 direction has changed and is pointing upwards. The magnetic field creates a force, driving the pistons 101 of the entire array upwards.

In FIG. 2C a positive electric charge is applied to one of the top electrodes 205. The positive charge typically attracts the electrons in the piston 204, causing the top of the piston 206 to be negatively charged. The opposite charges 205 and 206 create an attraction force which, when the gap is below a critical distance, typically act to pull-down the two elements together. The magnetic field 203 direction has changed again and is pointing downwards. The piston 204 is typically held in place due to magnetic attraction while the rest of the pistons are free to move, and move to the bottom due to the influence of the magnetic field 203. In this particular embodiment the charge applied to the electrode is positive. Alternatively, a negative charge may be applied to the electrodes, which will induct a negative charge to accumulate in the near-side of the adjacent piston.

FIGS. 3A-3C show top, cross-sectional and perspective views of one preferred embodiment.

In certain embodiments a coil 304 wrapped around the entire transducer array generates an electromagnetic field across the entire array structure, so that when current is applied, the electromagnetic field causes the pistons 302 to move up 301 and down 303.

FIG. 4A shows an exploded view of the device constructed and operative in accordance with certain embodiments of the invention. As shown, the exploded view of a transducer array structure reveals that it comprises the following primary parts:

(a) A coil surrounding the entire transducer array 401 generates an electromagnetic field across the entire array structure when voltage is applied to it. A preferred embodiment for the coil is described herein with reference to FIGS. 9B-9D.

(b) In certain embodiments a top layer construction 402 may comprise a spacer layer and electrode layer. In a certain embodiment this layer may comprise a printed circuit board (herein after "PCB") layer with an array of accurately spaced cavities each typically having an electrode ring affixed at the top of each cavity.

(c) The moving elements ("pistons") 403 in the current embodiment may be comprised of a thin foil of conductive magnetized material cut or etched with many very accurate plates typically surrounded by "serpentine" shapes that serve as compliant flexures that impart the foils with a specific measure of freedom of movement.

(d) A bottom layer construction 404 may comprise a spacer layer and electrode layer. In a certain embodiment this layer may comprise a dielectric layer with an array of accurately spaced cavities each typically having an electrode ring affixed at the bottom of each cavity.

FIG. 5 shows details of a small section of a device constructed and operative in accordance with a preferred embodiment of the present invention. A cross section detailed dimensional view of the transducer array according to the illustrated embodiment shows the following structure: the moving elements ("pistons"), typically made from a thin foil 501 that has been cut or etched into precise plate and serpentine shapes having a magnetized layer on the top 502 and bottom 503, is accurately positioned so the center of each plate shape is precisely aligned with the center of each of the cavities of a top layer dielectric 504 and the bottom layer dielectric cavity 505 that collectively serve as travel guides and air ducts. At the external edges of each duct both on the top 506 and on the bottom 507 is a copper ring (“electrode”) latching mechanism which, when electrostatic charge is applied, typically attracts each moving element to create contact between the moving elements (“pistons”) and latches and holds each moving element (“piston”) as it nears the end of each stroke, thereby preventing the moving element (“piston”) from moving until the latch is released typically by terminating the electrostatic charge to the electrode.

FIG. 6A shows an exploded view of the same small section as shown in FIG. 5. and reveals that in this embodiment the thin foil which has been etched with precise serpentine shapes to create a moving element (“piston”) with the center of each shape affixed with a magnetized layer on the top and bottom, is centered and enclosed in the cavities of mirror image on the top 602 and bottom 603 dielectric.

FIG. 7A shows a serpentine shape and moving elements subassembly constructed and operative in accordance with a preferred embodiment of the present invention. A top static view of the thin foil shows the moving element in this embodiment is typically constructed by etching a precise round serpentine shape that allows the center of the shape 701 freedom of movement restrained by the flexures of the shapes 703 which have been etched out of the material, thereby to form interspersing cavities 702. A cross sectional view reveals that the foil typically has polar aligned layers of magnets, affixed to both the top 704 and the bottom 705 of the tin foil moving element layer. As an alternative to this embodiment, a layer of magnets may be affixed only to one side of the thin foil.

FIG. 7B is an illustrative view of a single element in motion, showing the upward freedom of movement of certain embodiments where the magnetized center 706 of a single serpentine shape is free to extend upward while being guided and restrained by the serpentine etched flexures 707. Not shown in the illustration is the opposite (downward) movement of the serpentine shape as it travels in the opposite direction, and by doing so the flexures extend downward.

In certain embodiments the top of each shape center 708 and the bottom of each layer 709 are affixed magnetized layers that have been aligned in the same magnetic polarity.

FIG. 8A shows a block diagram of the speaker system in accordance with a preferred embodiment of the present invention. In certain embodiments the digital input signal (common protocols are I2S, I2C or SPDIF) 801 enters into a logic processor 802 which in turn translates the signal to define the latching mechanism of each grouping of moving elements. Group addressing is typically separated into two primary groups, one for latching the moving elements at the top, and one for latching the moving elements at the bottom of their strokes. Each group is typically then further separated into logical addressing groups typically starting with a group of at least one moving element, followed by another group that doubles the moving elements of the previous group, followed by another group which again doubles the number of elements of the previous, and so on, until all moving elements of the entire array have been grouped. The Nth group comprises $2^{N-1}$ moving elements.

In the embodiment depicted in the block diagram of FIG. 8A, the top group of one element group 803, a two element group 804 and then a four element group 805 are shown and so on, until the total numbers of moving elements in the transducer array assembly have been addressed to receive a control signal from the processor 802.

The same grouping pattern is typically replicated for the bottom latching mechanisms where a one element group 807 may be followed by a two element group 808 and then a four element group 809 and so on, until the total numbers of moving elements in the transducer array assembly have been addressed to receive a control signal from the processor 802.

The processor 802 may also control an alternating current flow to the coil that surrounds the entire transducer array 812, thus creating and controlling the magnetic field across the entire array. In certain embodiments a power amplifier 811 may be used to boost current to the coil.

FIG. 8B illustrates a flow diagram of the speaker system. In certain embodiments where the sampling rate of the digital input signal 813 might be different from the device natural sampling rate, the resampling module 814 may re-sample the signal, so that it matches the device’s sampling-rate. Otherwise, the resampling module 814 passes the signal through as unmodified.

The scaling module 815 typically adds a bias level to the signal and scales it, assuming the incoming signal 813 resolution is M bits per sample, and the sample values X range between $-2^{(M-1)}$ and $2^{(M-1)})-1$.

It is also assumed that in certain embodiments the speaker array has N element groups (numbered 1 . . . N), as described in FIG. 8A.

K is defined to be: K=N−M

Typically, if the input resolution is higher than the number of groups in the speaker (M>N), K is negative and the input signal is scaled down. If the input resolution is lower than the number of groups in the speaker (M<N), K is positive and the input signal is scaled up. If they are equal, the input signal is not scaled, only biased. The output Y of the scaling module 815 may be: $Y=2^K[X+2^{M-1}]$. The output Y is rounded to the nearest integer. The value of Y now ranges between 0 and 2N−1.

The bits comprising the binary value of Y are inspected. Each bit controls a different group of moving elements. The least significant bit (bit1) controls the smallest group (group 1). The next bit (bit2) controls a group twice as big (group 2). The next bit (bit3) controls a group twice as big as group 2 etc. The most significant bit (bitN) controls the largest group (group N). The states of all the bits comprising Y are typically inspected simultaneously by blocks 816, 823, . . . 824.

The bits are handled in a similar manner. Following is a preferred algorithm for inspecting bit1:

Block 816 checks bit1 (least significant bit) of Y. If it is high, it is compared to its previous state 817. If bit1 was high previously, there is no need to change the position of the moving elements in group 1. If it was low before this, the processor waits for the magnetic field to point upwards, as indicated by reference numeral 818 and then, as indicated by reference numeral 819, the processor typically releases the bottom latching mechanism B1, while engaging the top latching mechanism T1, allowing the moving elements in group 1 to move from the bottom to the top of the device.

If block 816 determines that bit1 of Y is low, it is compared to its previous state 820. If bit1 was low previously, there is no need to change the position of the moving elements in group 1. If its previous state was high, the processor waits for the magnetic field to point downwards, as indicated by reference numeral 821 and then, as indicated by reference numeral 822, the processor releases the top latching mechanism T1 while engaging the top latching mechanism B1, allowing the moving elements in group 1 to move from the top to the bottom of the device.

FIG. 9A shows typical relationships between the different major forces applied to moving elements. The different forces being applied to the moving elements typically work in harmony to counterbalance each other in order to achieve the desired function. Forces toward the center are shown as negative forces, while forces driving the element further away from the center (either toward the up or down latching mechanisms) are shown as positive forces.

In the present embodiment the moving element is influenced by 3 major forces:

a. Magnetic force, created by the interaction of the magnetic field and the hard magnet. The direction of this force depends on the polarity of the moving element magnet, the direction of the magnetic field and the magnetic field gradient.

b. Electrostatic force, typically created by applying a certain charge to the electrode and an opposite charge to the moving element. The direction of this force is such as to attract the moving element to the electrode (defined as positive in this figure). This force increases significantly when the distance between the moving element and the electrode becomes very small, and/or where this gap comprises material with a high dielectric constant.

c. Retracting force created by the flexures, (which act as springs). The direction of this force is always towards the center of the device (defined as negative in this figure). This force is relatively small since the flexures are compliant, and is linear in nature.

The relationship between the forces shows that typically, as the moving element increasingly nears the end of its stroke, the electrostatic force (generated by the latching mechanism) increases, ultimately achieving sufficient force to attract and latch the moving element. When the latch is released, the retracting and magnetic forces are typically able to pull the moving element away from the latch toward the center, thereby inducing travel of the moving element. As the moving element travels to the center, typically, the retracting force of the flexure diminishes and ultimately is overcome, and is then controlled by the electromagnetic force and the kinetic energy of the moving element.

FIG. 10A shows a sectional view of the grouping pattern applied in certain embodiments to the moving element ("pistons") for purposes of digital addressing, as described previously in FIG. 8. In this embodiment there is a group of one element in the center 1001 followed by a two element group 1002, followed by a four element group 1003, followed by a eight element group 1004, followed by a 16 element group 1005, and so on.

As shown in this embodiment, to the extent possible each increasing group has been arranged to extend around the previous group, however this geometrical configuration can be altered in order to accomplish different audio and/or constructive objectives. For example moving the "epicenter" to the outer circumference of the transducer array enables easier wire routing between each group and the processor 802 (refer to FIGS. 8A-8B).

FIG. 11A shows a preferred timing and control chart. The time chart describes preferred logic and algorithms for generating a specific sound-wave form. In the scope of this description, the timeline is divided into slots, numbered I1, I2 and so on. This simple example shows a device that uses 7 moving elements divided into 3 groups. The first group comprises one moving element "P1" and is controlled by the top latching mechanism "T1" and the bottom latching mechanism "B1". The second group comprises two moving elements "P2" and "P3" which are synchronized and move together. This group is controlled by the top latching mechanism "T2" and the bottom latching mechanism "B2". The second group comprises four moving elements "P4", "P5", "P6" and "P7", which are synchronized and move together. This group is controlled by the top latching mechanism "T3" and the bottom latching mechanism "B3".

The "clock" chart at the top of the figure represents the system clock. This clock is typically generated outside the device and is transferred to the processor 802 (refer to FIG. 8) alongside the sound signal. In a typical embodiment, the sampling rate of the device is 44100 Hz. In such a case, the duration of each clock interval is 22 μsec and the clock changes its state every 11 μsec.

The "signal" shown in this example is the analog waveform that the device is generating. The "value" chart shows the digital sample value of the signal at each clock interval. The "magnetic" chart shows the direction (polarity) of the magnetic field generated by the coil. The polarity changes synchronously with the system clock.

This figure shows the state of each moving element using the following display convention: An element ("P1" . . . "P7") that is latched at the top 1101 is colored in black. An element that is latched at the bottom 1102 is colored in white and an element that is moving 1103 is hatched.

The digital sample value dictates how many elements may be latched to the top and how many to the bottom of the array. In this example, digital sample values of −3, −2, −1, 0, 1, 2, 3, and 4 are possible. Each value is represented by 0, 1, 2, 3, 4, 5, 6 and 7 elements, respectively, latched to the top.

In time slice I1 the digital sample value is 0. This requires 3 elements latched to the top and 4 to the bottom. The magnetic field polarity is up. The top latching mechanisms T1 and T2 are engaged and so is the bottom latching mechanism B3. At the same time, the bottom latching mechanisms B1 and B2 are disengaged and so is the top latching mechanism T3. Moving elements P1, P2 and P3 are latched to the top while P4, P5, P6 and P7 are latched to the bottom.

In time slice I3, the digital sample value changes to 1. This requires 4 elements latched to the top and 3 to the bottom. The magnetic field polarization is up. The bottom latch B3 is disengaged, releasing elements P4, P5, P6 and P7 to move freely. At the same time, the top latching mechanism T3 is engaged. The elements move upwards under the influence of the magnetic field and are latched by the currently engaged T3.

At this point, all 7 moving elements are latched to the top. In the next slice I14, the moving elements P1, P2 and P3 would be latched to the bottom, to ensure the device is in the desired state (4 elements at the top and 3 at the bottom). In slice I4, the polarity of the magnetic field changes and is directed downwards. The top latching mechanisms T1 and T2 disengage and release the moving elements P1, P2 and P3. At the same time, the bottom latching mechanisms B1 and B2 are engaged and the approaching moving elements P1, P2 and P3 are latched to the bottom position. The moving elements P4, P5, P6 and P7 are held in place by the top latching mechanism T3 and are therefore restrained from moving downwards along with the other moving elements. The state of the device at this point is: P1, P2 and P3 are latched to the bottom and P4, P5, P6 and P7 are latched to the top. In time slices I5 to I4, the latching mechanisms are engaged and disengaged to allow the moving elements to move and change their state according to the digital sample values.

FIG. 12A shows preferred magnetic properties of moving elements for addressing an alternative embodiment. A static top view of the moving element foil shows one possible alternative embodiment to the moving elements. In this embodiment two distinct group segments of the moving elements 1201 and 1202 have been created, enabling a single transducer array to process and generate a louder signal, or alternatively two separate signals (such as the left and right audio signal of stereo). The cross section view shows that in order to accomplish the two groups of this embodiment (discernible by the separated line 1203), each distinct group segment typically has opposite magnetic polarity.

In one section group 1201 the layer of magnets affixed to the moving element of the thin foil has been polarized so that North (N) is on the top side of the foil 1204 and South (S) is on the bottom side 1205; while in the second section group 1202 the layer of magnets of the thin foil moving element have been polarized so that South (S) is on the top side of the foil 1206 and North (N) is on the bottom side 1207.

FIG. 13 shows grouping of electrodes in an alternative embodiment. Similar to FIG. 10A, FIG. 13 depicts an alternative addressing scheme for the alternative embodiment that is described in FIG. 12A. In this case the grouping pattern applied to the moving element for purposes of digital addressing is divided into two primary group segments, half the transducer array in one primary segment group, and the other half in another primary segment group, as described in FIG. 12A.

In this embodiment there are two equal groups each with an equal number of moving elements beginning with two groups 1301 and 1302 of one moving element each followed by two groups 1303 and 1304 with two elements in each group followed by two groupings 1305 and 1306 of four elements in each group, followed by two grouping 1307 and 1308 of eight elements in each group, followed by two groupings 1309 and 1310 of sixteen elements in each group and so on, until all moving elements of the transducer array have been grouped and addressed.

As shown in the current embodiment, to the extent possible, each increasing group has been arranged to extend around the previous group, however this geometrical configuration can be altered in order to accomplish different audio and/or constructive objectives, for example moving the "epicenters" to the primary groups to opposite sides of the outer circumference of the transducer array enables easier wire routing between each group and the processor 1402 (refer to FIG. 14). It also enables the device to operate in two modes: monophonic, where both groups are used to generate one waveform at twice the amplitude, and stereophonic, where each group generates a separate sound-wave, as to allow reconstruction of a stereophonic signal.

FIG. 14 shows a block diagram of the speaker system in an alternative addressing embodiment. FIG. 14 describes addressing of the alternative embodiment shown in FIGS. 12 and 13. The digital input signal (I2S, I2C or SPDIF protocols) 1401 enters a logic processor 1402 which in turn translates the signal to define the latching mechanism of each of the two primary grouping of moving elements. Each addressing group is separated into two primary groups, one for top and one for bottom latching mechanisms. Each group is then further separated into logical addressing groups starting with a group of one moving element, followed by another group that doubles the moving elements of the previous group, followed by a another group of double the number of elements of the previous group, and so on, until all moving elements of the entire array have been grouped.

In the embodiment depicted in the block diagram of FIG. 14, the top stroke of one primary segments of moving elements begins with a one element group 1403, and then a two element group 1404, and then a four element group 1405, and so on, until the total numbers of moving elements in the transducer array assembly have been addressed to receive a control signal from the processor 1402.

The same grouping pattern is replicated for the down stroke where a group of one element 1407 is followed by a two element group 1408, and then a four element group 1409, and so on, until the total numbers of moving elements in the transducer array assembly have been addressed to receive a control signal from the processor 1402.

This same pattern is replicated for the second primary segment of moving elements with the top stroke group starting with a one element group 1413, and then a two element group 1414, and then a four element group 1415, and so on, until the total numbers of moving elements in the transducer array assembly have been addressed to receive a control signal from the processor 1402.

This is replicated for the down stroke of the second segment beginning with a group of one element 1417, followed by a two element group 1418, and then a four element group 1419, and so on, until the total numbers of moving elements in the transducer array assembly have been addressed to receive a control signal from the processor 1402.

The processor 1402 will also control an alternating current flow to the coil that typically surrounds the entire transducer array, including both primary segments 1412, thus creating and controlling the magnetic field across the entire array. In certain embodiments a power amplifier 1411 may be used to boost current to the coil.

FIG. 15A shows a timing and control chart for an alternative embodiment. A time chart, describing the logic and algorithms, may be used to generate a specific sound-wave form in the alternative embodiment described in FIGS. 12 through 14. The display conventions are similar to those used in FIG. 11A, and the same signal is reproduced.

The timeline is divided into slots, numbered I1, I2 and so on. This simple example shows a device that uses 14 moving elements divided into two major groups (L and R), each divided into 3 minor groups 1, 2 and 3.

The digital sample value dictates how many elements may be latched to the top and how many to the bottom of the array. In this example, digital sample values of −3, −2, −1, 0, 1, 2, 3, and 4 are possible. Each value is represented by 0, 2, 4, 6, 8, 10, 12 and 14 elements, respectively, latched to the top.

On time slice I3, the digital sample value changes from 0 to 1. This requires 8 elements latched to the top and 6 to the bottom. The magnetic field polarization is up. The top latches RT1 and RT2 as well as the bottom latch LB3 are disengaged, releasing elements RP1, RP2, RP3, LP4, LP5, LP6 and LP7 to move freely. The magnetic polarity of LP4, LP5, LP6 and LP7 creates an upwards force, driving these elements upwards. The magnetic polarity of RP1, RP2 and RP3 is opposite and the driving force is downwards. At the same time, the latching mechanisms opposite to the element movement are engaged to grab the approaching moving elements and latch them in place.

On slice I4, the polarity of the magnetic field changes and is directed downwards. The top latches LT1 and LT2 as well as the bottom latch RB3 are disengaged, releasing elements LP1, LP2, LP3, RP4, RP5, RP6 and RP7 to move freely. The magnetic polarity of RP4, RP5, RP6 and RP7 creates an upwards force, driving these elements upwards. The magnetic polarity of LP1, LP2 and LP3 is opposite and the driving force is downwards. At the same time, the latching mechanisms opposite to the element movement are engaged to grab the approaching moving elements and latch them in place.

On time slices I5 to I14, the latching mechanisms are engaged and disengaged to allow the moving elements to move and change their state according to the digital sample values.

Figure 15B:
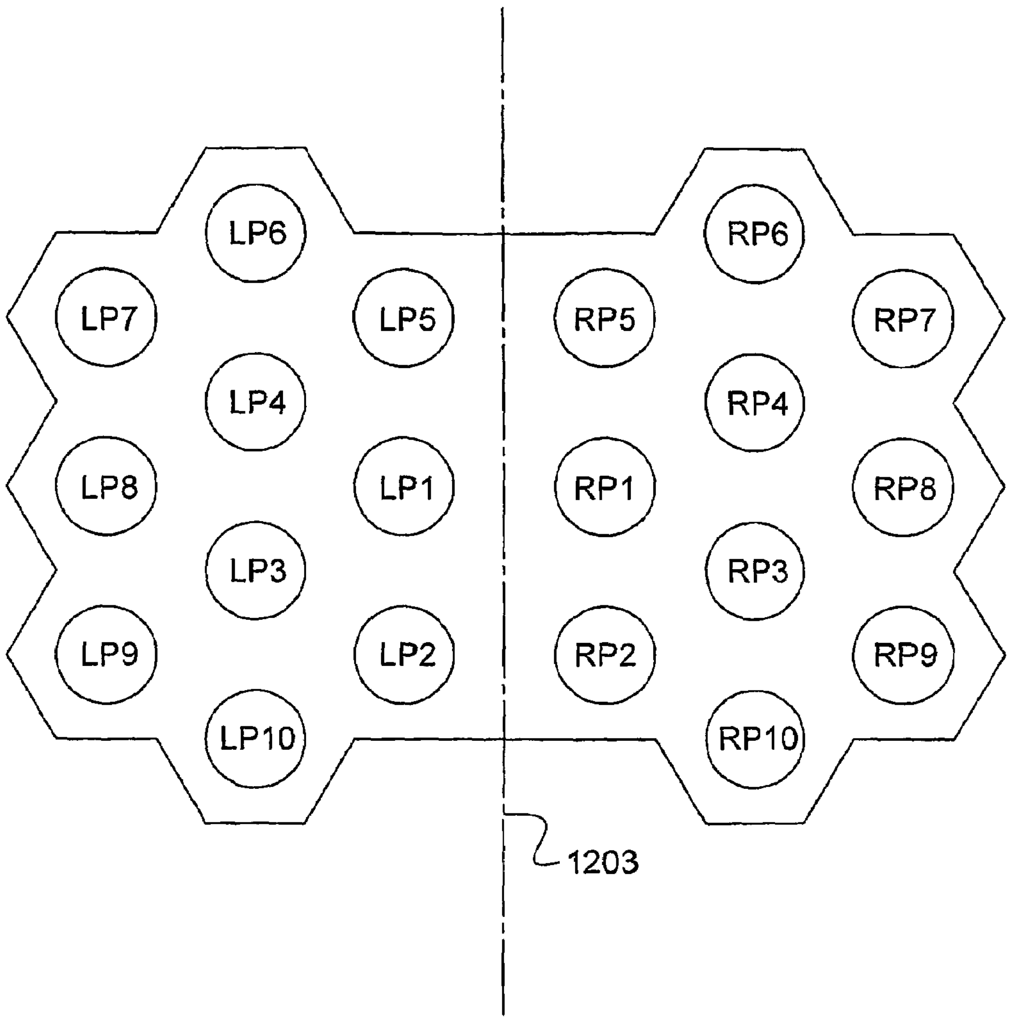
FIG. 15B is a schematic illustration of an example array of moving elements to which the timing diagram of FIG. 15A pertains.
Figure 15C:
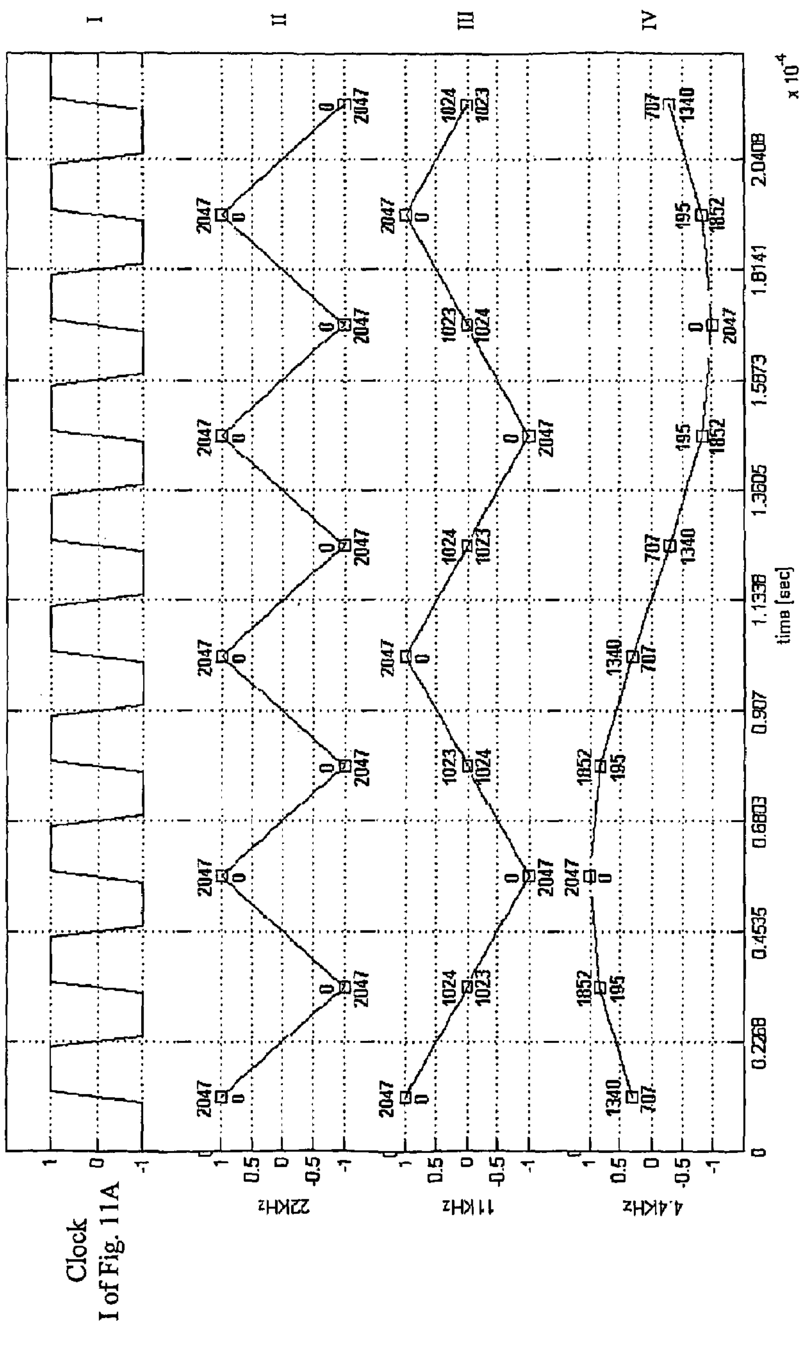
FIG. 15C is a graph showing changes in the number of moving elements disposed in top and bottom extreme positions at different times and as a function of the frequency of the input signal received by the latching controller of FIG. 8C.

FIG. 15C illustrates production of three different pitches (22 KHz, 11 KHz and 4.4 KHz) of sound graphs II-IV respectively. Graph I shows the system clock which, in the illustrated example is 44 KHz. In the illustrated embodiment, the speaker used to generate these pitches has 2047 moving elements. When the 22 KHz sound (half of the clock) is generated, all 2047 elements change position (from top to bottom or vice versa) at each clock. When the 11 KHz (quarter of the clock) sound is generated, half of the 2047 moving elements change position at each clock. For example, if in the first clock all 2047 moving elements are in their top position, in the second clock, 1023 of these are lowered, in the third clock the remaining 1024 elements are lowered, in the fourth clock 1023 are raised, in the fifth clock the remaining 1024 elements are raised, and so forth. When the 4.4 KHz (1/10 of the clock) sound is generated, the numbers of elements which are in their top position at each clock (1340, 1852, . . . ) are shown on top of Graph IV whereas the numbers of elements which are in their bottom position at each clock (707, 195, . . . ) are shown on the bottom of Graph IV.

FIG. 16A shows a small section of the moving elements subassembly.

FIGS. 16A and 16B provide illustrated views of the moving elements in different embodiments.

The embodiment shown in FIG. 16A is of moving elements ("Pistons") constructed from a thin foil material 1601 with a precise round serpentine shape etched into the material which enables the center of the shape 1602 freedom of movement that is restrained by the flexures of the shape.

FIG. 16B shows a small section of a different embodiment of the moving elements subassembly, using a flexible substrate. This embodiment is of moving elements ("pistons") constructed from a material with sufficient elasticity, such as rubber polyethylene material 1603, which either has magnetic material deposits in specific shapes and dimensions on the top and bottom of the material surface, or the material is affixed to a magnetized disk of particular dimensions 1604, enabling freedom of movement that is restrained by the material itself.

FIG. 2C shows a small section of a different embodiment of the moving elements subassembly, using free-floating components. This embodiment is of free floating moving elements ("pistons") constructed from magnetized material with polar opposites at each end. In this particular embodiment North is on top and South on the bottom.

FIG. 3B illustrates a top view of a complete transducer array structure in certain embodiments, based on a honeycomb design, which enables a fill factor of 48 percent of the surface area. FIG. 17 illustrates a top view of a completed transducer array structure in certain embodiments, based on a square design, which enables a fill factor of 38 percent of the surface area.

FIG. 18 shows an exploded view of a small section of an embodiment using square shaped elements. This embodiment shows a transducer array structure that utilizes square shape elements intended to increase the fill factor and allow higher sound pressure levels per transducer area.

As in previous embodiments, the same structural elements are used. A coil surrounds the entire transducer array (not shown). When voltage is applied, the coil generates an electromagnetic actuation force across the entire array structure.

A top layer construction, typically comprising a dielectric layer with an array of accurately spaced cavities 1802, each having an electrode ring, is affixed at the top of each cavity, to create an electrostatic latching mechanism 1801.

The moving elements ("pistons") in this embodiment comprises a thin foil of conductive magnetized material cut or etched with many very accurate "serpentine" shapes, that imparts the foils a specific measure of freedom of movement 1803 with a magnetized top 1804 and bottom 1805. Each moving element is guided and restrained by four flexures.

A bottom layer construction, typically comprising a dielectric layer with an array of accurately spaced cavities 1806, each having an electrode ring affixed at the bottom of each cavity, creates an electrostatic latching mechanism 1807.

FIG. 19 shows an apparatus including a plurality (array) of devices. The structure shows the use of plurality in certain embodiments of array transducers 1902 as to create a device 1901 capable of generating louder sound pressure levels or use beam-forming techniques (which extend beyond the scope of this invention) to create directional sound-waves.

The array may have any desired shape, and the round shapes in the description are only for illustrative purposes.

The device constructed and operative in accordance with one embodiment of the present invention and described above with reference to FIGS. 1B, 2A-2C, 3A-3C, 4A, 5, 6A, 7A-7B, 8A-8B, 9A, 10A, 11A, 12A, 13, 14, 15A, 16A-C, 17-19 is now described both more generally, e.g. with reference to FIG. 1A, and in further detail. Alternative embodiments are also described.

Reference is now made to FIG. 1A which is a simplified functional block diagram illustration of actuator apparatus for generating a physical effect, at least one attribute of which corresponds to at least one characteristic of a digital input signal sampled periodically in accordance with a clock. According to a preferred embodiment of the present invention, the apparatus of FIG. 1A comprises at least one actuator device, each actuating device including an array 10 of moving elements each typically constrained to travel alternately back and forth along a respective axis in response to an alternating electromagnetic force applied to the array 10 of moving elements. Each moving element is constructed and operative to be responsive to electromagnetic force. Each moving element may therefore comprise a conductor, may be formed of a ferro magnetic material, may comprise a permanent magnet e.g. as shown in FIG. 6C, and may comprise a current-bearing coil.

A latch 20 is operative to selectively latch at least one subset of the moving elements 10 in at least one latching position thereby to prevent the individual moving elements 10 from responding to the electromagnetic force. An electromagnetic field controller 30 is operative to receive the clock and, accordingly, to control application of the electromagnetic force by a magnetic field generator, 40, to the array of moving elements. A latch controller 50 is operative to receive the digital input signal and to control the latch accordingly. The latch controller 50, in at least one mode of latch control operation, is operative to set the number of moving elements 10 which oscillate freely responsive to the electromagnetic force applied by the magnetic field generator, e.g. coil 40 to be substantially proportional to the intensity of the sound, coded into the digital input signal it receives. Preferably, when the intensity of sound coded into the digital input signal is at a positive local maximum, all moving elements are latched into a first extreme position. When the intensity of sound coded into the digital input signal is at a negative local maximum, all moving elements are latched into a second, opposing, extreme position.

Preferably, a physical effect, e.g. sound, resembling the input signal is achieved by matching the number of moving elements in an extreme position e.g. a top position as described herein, to the digital sample value, typically after resampling and scaling as described in detail below. For example, if the digital sample value is currently 10, 10 moving elements termed herein ME1, . . . ME10 may be in their top positions. If the digital sample value then changes to 13, three additional moving elements termed herein ME11, ME12 and ME13 may be raised to their top position to reflect this. If the next sample value is still 13, no moving elements need be put into motion to reflect this. If the digital sample value then changes to 16, 3 different moving elements (since ME11, ME12 and ME13 are already in their top positions), termed herein M14, M15 and M16, may be raised to their top positions to reflect this.

In some embodiments, as described in detail below, moving elements are constructed and operative to be operated collectively in groups, such as a set of groups whose number of moving elements are all sequential powers of two, such as 31 moving elements constructed to be operated in groups having 1, 2, 4, 8, 16 moving elements, respectively, each. In this case, and using the above example, when the sample value is, say, 10, the two groups including 8 and 2 moving elements respectively are both, say, up i.e. all moving elements in them are in their top positions. When the sample value changes to 13, however, it is typically impractical to directly shift 3 moving elements from their bottom positions to their top positions since in this example, due to the binary grouping, this can only be done by raising the two groups including 1 and 2 moving elements respectively, however, the group including 2 moving elements is already raised. But the number of top pixels may be otherwise matched to the sample value, 13: Since 13=8+4+1, the two groups including 4 and 1 pixels may be raised, and the group including 2 pixels may be lowered, generating a net pressure change of +3, thereby to generate a sound resembling the input signal as desired, typically after re-sampling and scaling.

More generally, moving elements translated toward a first extreme position such as upward generate pressure in a first direction termed herein positive pressure. Moving elements translated toward the opposite extreme position such as downward generate pressure in the opposite direction termed herein negative pressure. A certain amount of positive or negative pressure may be obtained either by translating the appropriate number of moving elements in the corresponding direction, or by translating n moving elements in the corresponding direction and others, m in number, in the opposite direction, such that the difference n−m corresponds to e.g. equals the sampled signal value, typically after re-sampling and scaling.

The moving elements are typically formed of a material which is at least moderately electrically conductive such as silicon or silicon coated by a metal such as gold.

If the moving elements comprise permanent magnets, the permanent magnets are typically magnetized during production such that the magnetic poles are co-linear to the desired axes of motion. A coil that typically surrounds the entire transducer array generates the actuation force. To control each moving element, two latch elements (typically comprising electro static latches or "electrodes") are typically used, e.g. one above and one below the moving elements.

According to one embodiment, the actuator is a speaker and the array of moving elements 10 is disposed within a fluid medium. The controllers 30 and 50 are then operative to define at least one attribute of the sound to correspond to at least one characteristic of the digital input signal. The sound has at least one wavelength thereby to define a shortest wavelength present in the sound and each moving element 10 typically defines a cross section which is perpendicular to the moving element's axis and which defines a largest dimension thereof, the largest dimension of each cross-section typically being small relative to, e.g. an order of magnitude smaller than, the shortest wavelength. FIG. 1B is an isometric illustration of the array 10 of moving elements constructed and operative in accordance with a preferred embodiment of the present invention. In this embodiment, each moving element 10 comprises a magnet and each is constrained to travel, except when and if latched, alternately back and forth along a respective axis in response to an alternating electromagnetic force applied to the array of moving elements 10 by the magnetic field generator 40.

Figure 1F:
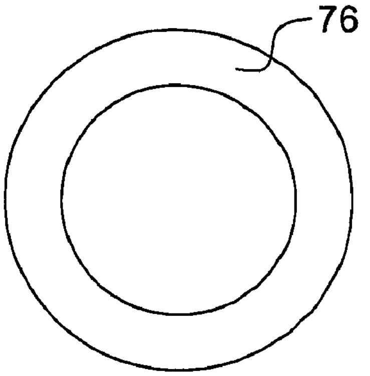
FIGS. 1C-1G are simplified top view illustrations of latches constructed and operative in accordance with five alternative embodiments of the present invention which can serve as alternatives to the latch specifically shown in FIG. 1B.
Figure 1D:
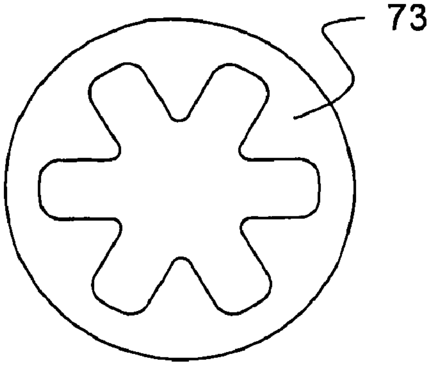
Figure 1C:
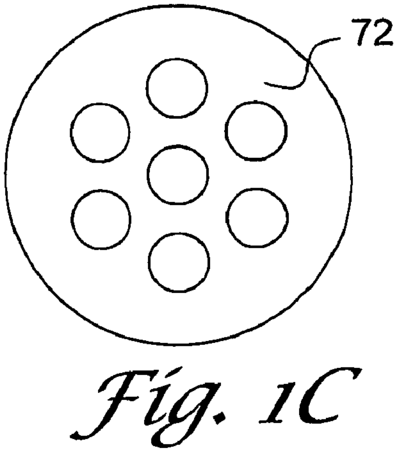
Figure 1E:
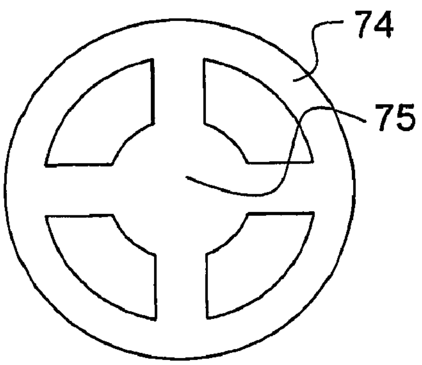
Figure 1G:
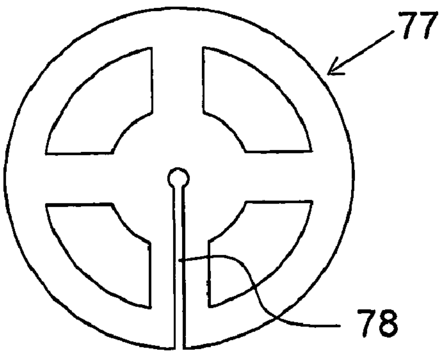

FIGS. 1C-1G are simplified top view illustrations of latch elements 72, 73, 74, 76, and 77, any of which may, in combination with similar or dissimilar others form the electrostatic latch 20 in accordance with alternative embodiments of the present invention. At least one of the latch elements, 72, may have a perforated configuration, as shown in FIG. 1C. In FIG. 1D, a latch element 73 is shown having a notched configuration as to allow concentration of electrostatic charge at the sharp portions of the latch thereby to increase the latching force applied to the corresponding moving element. In FIG. 1E, at least one latch element, 74, has a configuration which includes a central area 75 which prevents air from passing so as to retard escape of air, thereby to cushion contact between the moving element 10 and the latching element itself. At least one latch element, 76, may have a ring configuration, as shown in FIG. 1F and, by way of example, in FIG. 1B. Latch element 77 of FIG. 1G is still another alternative embodiment which is similar to latch element 74 of FIG. 1E except that at least one radial groove 78 is provided so as to eliminate induced current in the latch.

FIG. 2A shows the array of FIG. 1B in a first, bottom extreme position responsive to an electromagnetic force applied, by coil or other magnetic field generator 40 of FIG. 1A, downward. FIG. 2B shows the array of FIG. 1B in a second, top extreme position responsive to an electromagnetic force applied, by coil or other magnetic field generator 40 of FIG. 1A, upward. FIG. 2C is similar to FIG. 2B except that one of the individual moving magnets, 204, is not responding to the upward force applied by magnetic field generator 40 because that individual magnet is latched into its top extreme position by a corresponding electric charge disposed above the individual moving element and functioning as a top latch. It is appreciated that in the embodiment of FIGS. 1A-2C, the latch 20 comprises an electrostatic latch, however this need not be the case.

Typically, the apparatus of FIGS. 2A-2C comprises a pair of latch elements 205 and 207 for each moving element, termed herein "top" and "bottom" latch elements for simplicity although one need not be above the other, the latch elements including one or more electrodes and a space maintainer 220 separating the electrodes. In embodiments in which the latch 20 comprises an electrostatic latch, the space maintainer 220 may be formed of an insulating material.

Each pair of latching elements is operative to selectively latch its individual moving element 10 in a selectable one of two latching positions, termed herein the first and second latching positions or, for simplicity the "top" and "bottom" latching positions, thereby to prevent the individual moving elements from responding to the electromagnetic force. If the axis along which each moving element 10 moves is regarded as comprising a first half-axis and a second co-linear half-axis, the first latching position is typically disposed within the first half-axis and the second latching position is typically disposed within the second half-axis as shown e.g. in FIGS. 2A-2C.

FIGS. 3A-3C are respective top, cross-sectional and isometric views of a skewed array of moving elements 10 each constrained to travel alternately back and forth along a respective axis in response to an alternating electromagnetic force applied to the array of moving elements 10 e.g. by a coil 40 wrapped around the array as shown. FIG. 4A is an exploded view of a layered actuator device including an array of moving elements 403 each constrained to travel alternately back and forth along a respective axis in response to an alternating electromagnetic force applied to the array of moving elements 403 by a coil 401, and a latch, formed as at least one layer, operative to selectively latch at least one subset of the moving elements 403 in at least one latching position thereby to prevent the individual moving elements 403 from responding to the electromagnetic force. Typically, the electromagnetic force is generated using a coil 401 that surrounds the array 403 as shown.

The latch typically comprises a pair of layers: a top latch layer 402 and bottom latch layer 404 which, when charged, and when the moving elements are in an appropriate electromagnetic field as described herein, latch the moving elements into top and bottom extreme positions respectively. Each of the latch layers 402 and 404 typically comprises an electrode layer and spacer layer as shown in detail in FIGS. 5-6A. The spacer layers 402 and 404 may generally be formed from any suitable dielectric material. Optionally, ferrite or ferro-magnetic particles may be added to the dielectric material to decrease undesirable interaction between the magnets in the magnet layer.

In FIGS. 5-6A, both flexures and annular magnets or conductors or ferromagnets are provided, however it is appreciated that this is not intended to be limiting. Alternatively, for example, other shaped magnets may be provided, or the annular elements may be replaced by coils, and free-floating moving elements may be provided without flexures, or the moving elements may have a peripheral elastic or flexible portion or be associated with a peripheral elastic or flexible member, all as shown and described in detail herein.

Figure 4B:
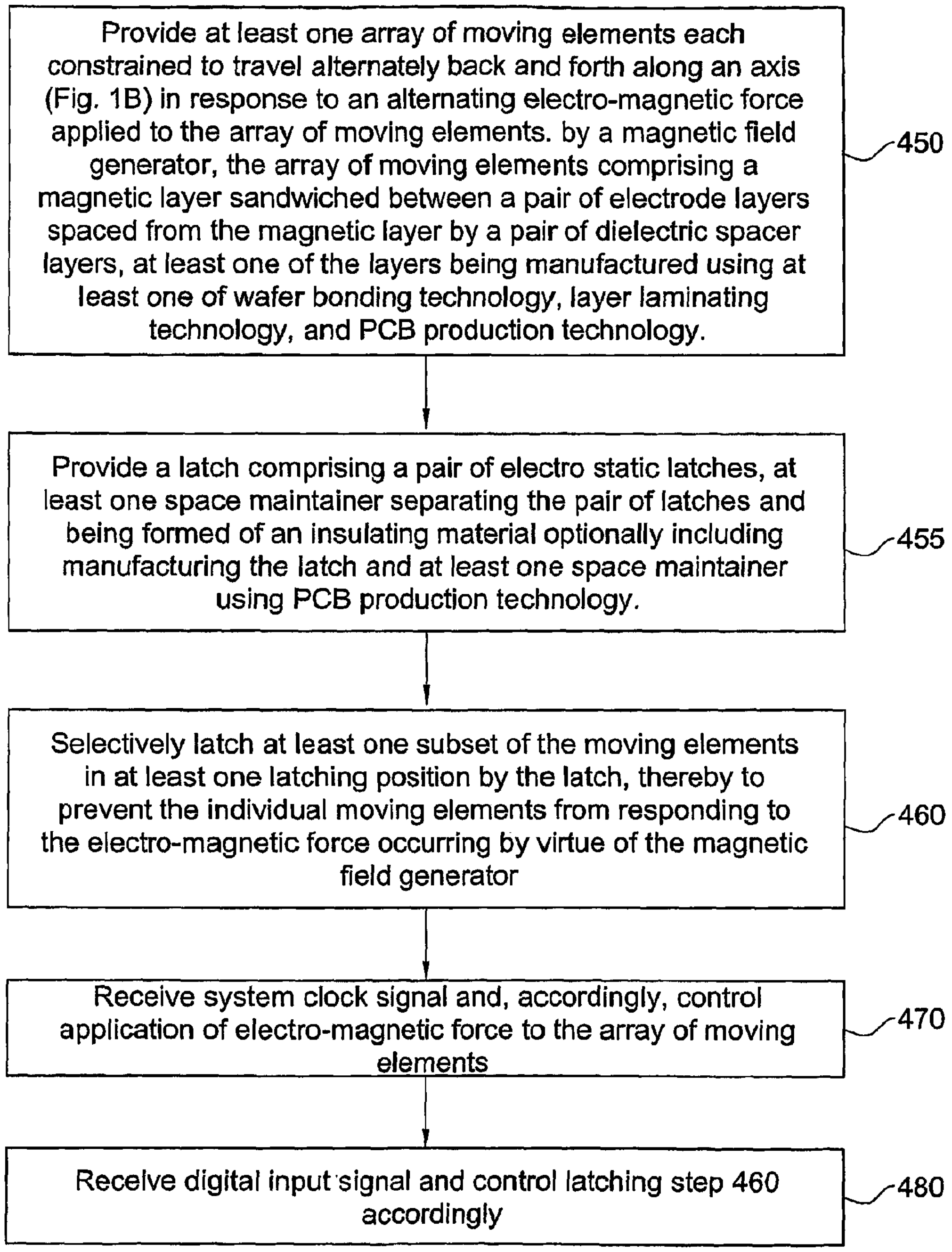
FIG. 4B is a simplified flowchart illustration of a preferred actuation method operative in accordance with a preferred embodiment of the present invention.

FIG. 4B is a simplified flowchart illustration of a preferred actuation method operative in accordance with a preferred embodiment of the present invention. In FIG. 4B, a physical effect is generated, at least one attribute of which corresponds to at least one characteristic of a digital input signal sampled periodically in accordance with a system clock signal. As shown, the method typically comprises (step 450) providing at least one array of moving elements 10 each constrained to travel alternately back and forth along an axis 15 (FIG. 1B) in response to an alternating electromagnetic force applied to the array of moving elements 10 e.g. by magnetic field generator 40. In step 460, at least one subset of the moving elements 10 is selectively latched in at least one latching position by a latch 20 thereby to prevent the individual moving elements 10 from responding to the electromagnetic force applied by magnetic field generator 40. In step 470, the system clock signal is received and, accordingly, application of the electromagnetic force to the array of moving elements is controlled. In step 480, the digital input signal is received, and the latching step 460 is controlled accordingly. Typically, as described above, the latch 20 comprises a pair of layers, each layer comprising an array of electrostatic latch elements and at least one space maintainer layer separates the electrostatic latch layers and is formed of an insulating material. Typically, the latch and at least one space maintainer are manufactured using PCB production technology (FIG. 4B, step 450). The array of moving elements typically comprises a magnetic layer 403 sandwiched between a pair of electrode layers spaced from the magnetic layer by a pair of dielectric spacer layers. Typically, at least one of the layers is manufactured using wafer bonding technology, layer laminating technology, and/or PCB production technology and/or combination of these technologies (FIG. 4B, step 455).

FIG. 5 is an isometric static view of the actuator device of FIG. 4A constructed and operative in accordance with a preferred embodiment of the present invention in which the array of moving elements 10 is formed of thin foil, each moving element being constrained by integrally formed flexures 606 surrounding it. The flexures typically include foil portions 703 interspersed with cut-out portions 702. FIG. 6A is an exploded view of a portion of the actuator device of FIG. 5.

According to a preferred embodiment of the present invention, 3 flexures are provided since at least three flexures are required to define a plane. In the case of the moving elements shown and described herein, the plane defined by the flexures is typically a plane perpendicular to the desired axes of motion of the moving elements or any plane suitably selected to constrain the moving elements to travel along the desired axes.

Generally, it is desired to minimize the area of the flexures so as to exploit the available area of the device for the moving elements themselves since the process of actuation is performed by the moving elements such that, from the point of view of the functionality of the device, the area of the flexures is overhead. For example, if the actuator is a speaker, the moving elements push air thereby to create sound whereas the flexures and the gaps defining them do not. Therefore, it is generally desirable that the total length of the flexures be similar to the perimeter of the moving elements (e.g. as opposed to being double the perimeter of the moving elements). Therefore, it may be desired to treat the total length of the flexures as given and consequently, the more flexures provided, the shorter each flexure which translates into higher stress under the same translation i.e. to achieve the same amplitude of motion of the moving elements.

As a result, it is believed to be preferable to provide only three flexures i.e. no more than the minimum number of flexures required to securely hold the moving element, e.g. to define a plane normal to the axis of motion of the moving elements.

Figure 6B:
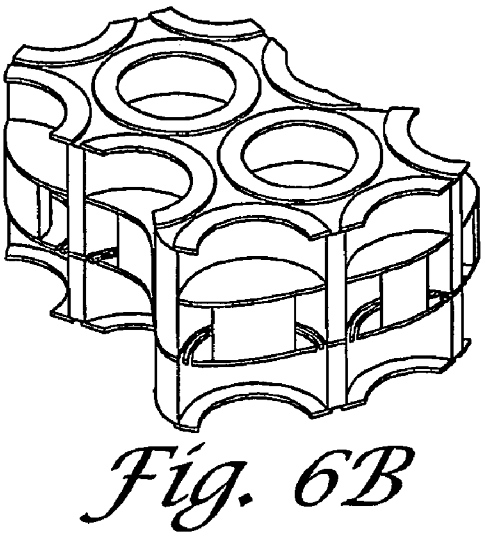
FIGS. 6B and 6C are a perspective view illustration and an exploded view, respectively, of an assembly of moving elements and associated flexures, latches and spacer elements constructed and operative in accordance with a preferred embodiment of the present invention which reduces leakage of air through the flexures.
Figure 6C:
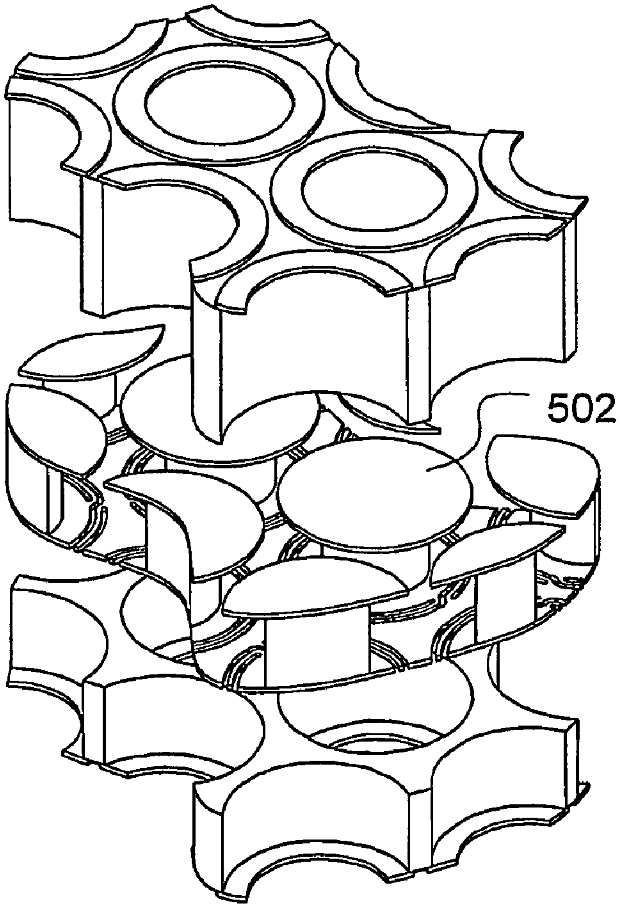

FIGS. 6B and 6C are isometric and exploded view illustrations, respectively, of an assembly of moving elements, latches and spacer elements constructed and operative in accordance with a preferred, low air leakage, embodiment of the present invention. Air leakage refers to air passing from the space above the moving element to the space below the moving element or vice versa.

Figures 6D, 6E:
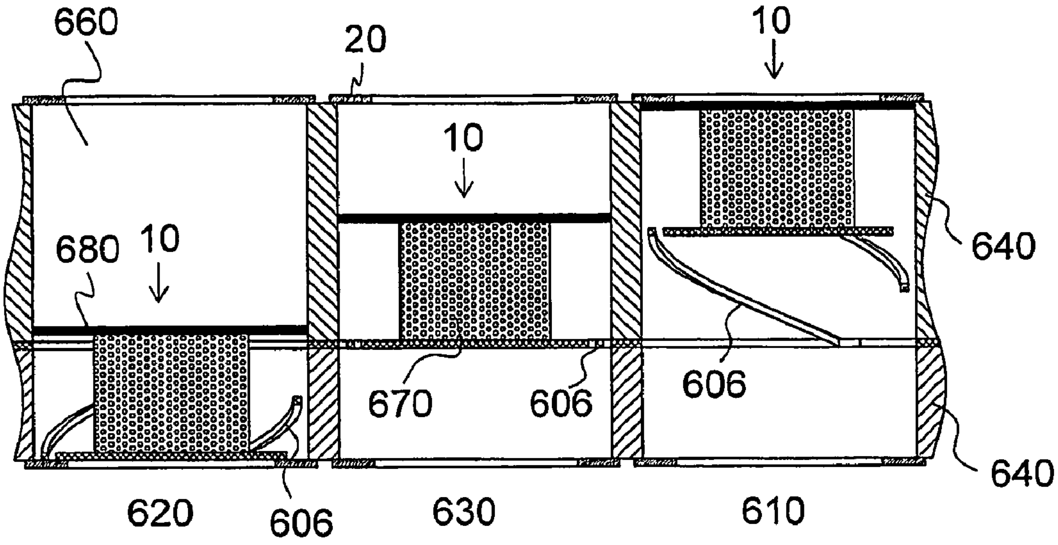
FIG. 6D is a cross-sectional view of the apparatus of FIGS. 6B-6C showing three moving elements in top extreme, bottom extreme and intermediate positions respectively.
FIG. 6E is a legend for FIG. 6D.

FIG. 6D is a cross-sectional view of the apparatus of FIGS. 6B-6C showing three moving elements 10 in top extreme, bottom extreme and intermediate positions 610, 620 and 630 respectively. FIG. 6E is a legend for FIG. 6D. Typically, in the embodiment of FIGS. 6B-6E, at least one of the moving elements is configured to prevent leakage of air through the at least one flexure. As shown, at least one space maintainer 640 is disposed between the array of moving elements 10 and the latching mechanism 20, the space maintainer defining a cylinder 660 having a cross section, and wherein at least one of the moving elements 10 comprises an elongate element 670 whose cross-section is small enough to avoid the flexures and a head element 680 mounted thereupon whose cross-section is similar to the cross-section of the cylinder 660. It is appreciated that for simplicity, only a portion of flexures 606 are shown.

Figure 7C:
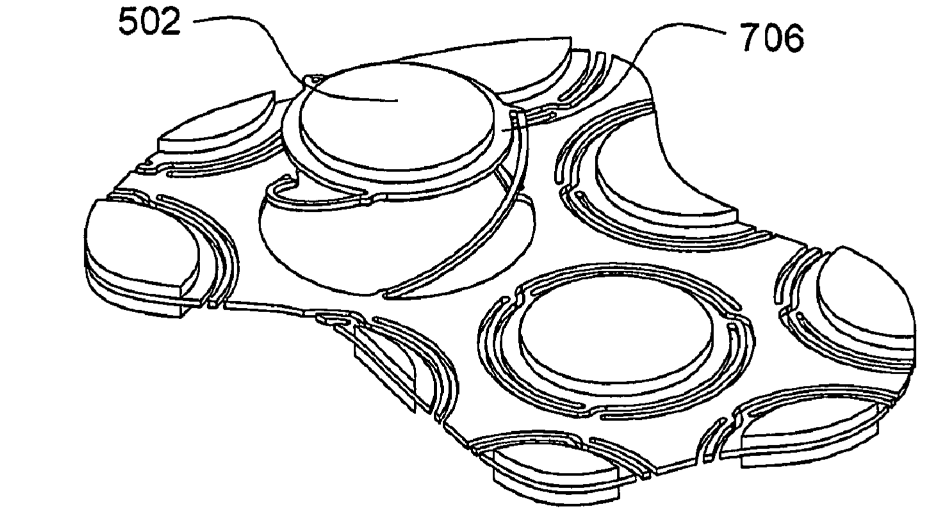
FIG. 7C is a perspective view of the moving element layer of FIGS. 5-7B wherein an individual moving element is shown moving upward toward its top extreme position such that its flexures extend upward out of the plane of the thin foil.

FIG. 7A is a static partial top view illustration of the moving element layer of FIGS. 5-6C. FIG. 7B is a cross-sectional view of the moving element layer of FIGS. 5-6 taken along the A-A axis shown in FIG. 7A. FIG. 7C is a perspective view of the moving element layer of FIGS. 5-7B wherein an individual moving element is shown moving upward toward its top extreme position such that its flexures bend and extend upward out of the plane of the thin foil. As shown, in FIGS. 7A-7C, at least one of the moving elements 10 of FIG. 1A has a cross section defining a periphery 706 and is restrained by at least one flexure attached to the periphery. Typically, at least one moving element 10 and its restraining typically serpentine flexures are formed from a single sheet of material. Alternatively, as shown in FIG. 16B, at least one flexure 1605 may be formed of an elastic material. It is appreciated that the flexure-based embodiment is only one possible embodiment of the present invention. In contrast, as shown e.g. in FIG. 1B, each moving element may simply comprise a free floating element.

Figure 7D:
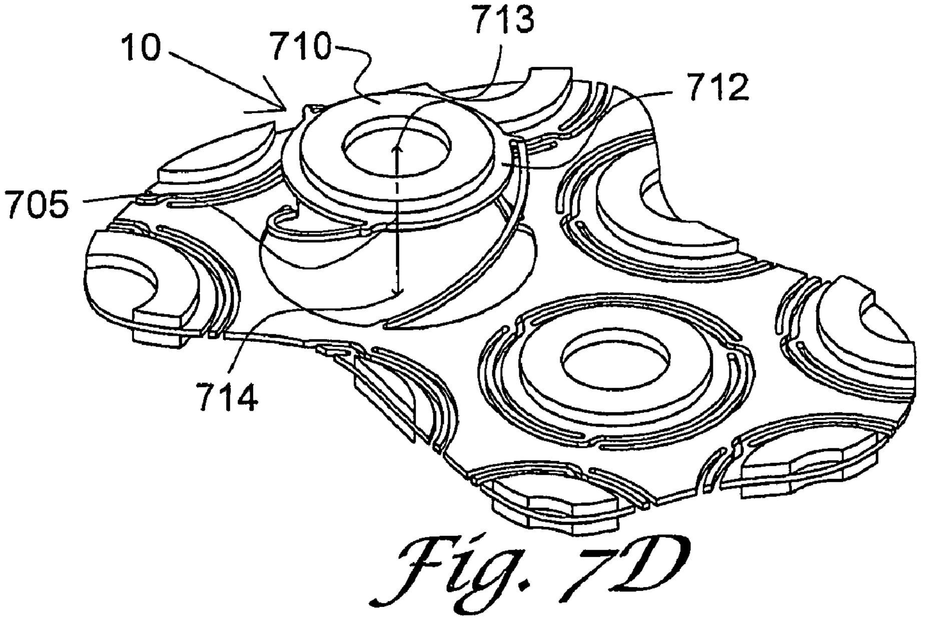
FIG. 7D is a perspective view of a moving element layer constructed and operative in accordance with an alternative embodiment of the present invention in which the disc-shaped permanent magnets of the embodiment of FIGS. 5-7C are replaced by ring-shaped permanent magnets.
Figure 7E:
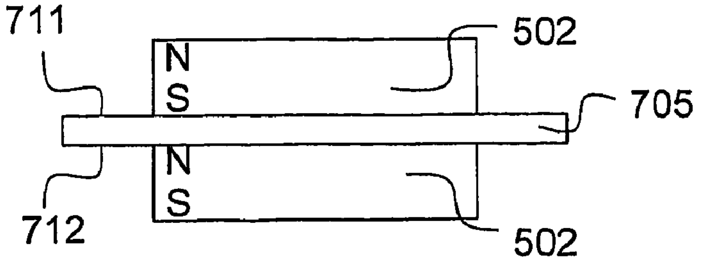
FIG. 7E is a side view illustration of the flexure-restrained central portion of an individual moving element in the embodiment of FIG. 7D.

FIG. 7D is a perspective view of a moving element layer constructed and operative in accordance with an alternative embodiment of the present invention. FIG. 7E is a side view illustration of the flexure-restrained central portion 705 of an individual moving element. In the embodiment of FIGS. 7D-7E, the moving elements 10 of FIG. 1A comprise typically annular permanent magnets 710 rather than the disc-shaped permanent magnets 502 of the embodiments of FIGS. 5-7C. Typically, each moving element 10 has first and second opposing typically circular surfaces 711 and 712 facing first and second endpoints 713 and 714 of the moving element's axis 715 of motion respectively and at least one permanent magnet 710 is disposed on at least one of the first and second circular surfaces 711 and 712. If two permanent magnets 710 are provided, then the two are aligned such that the same pole points in the same direction as shown in FIG. 7E.

FIG. 8A is a control diagram illustrating control of latch 20 by latch controller 50 of FIG. 1A, and of the typically coil-induced electromagnetic force, by controller 30 of FIG. 1A, for a particular example in which the moving elements 10 are arranged in groups G1, G2, . . . GN that can each, selectably, be actuated collectively, wherein each latch in the latching layer is typically associated with a permanent magnet, and wherein the poles of all of the permanent magnets in the latching layer are all identically disposed. The latch typically comprises, for each group or each moving element in each group, a top latch and a bottom latch. The top and bottom latches for group Gk (k=1, . . . , N) are termed Tk and Bk respectively. In FIG. 8A the two controllers are both implemented in processor 802.

FIG. 8B is a flowchart illustrating a preferred method whereby latching controller 50 of FIG. 1A may process an incoming input signal 801 and control latches 20 of moving elements 10 accordingly, in groups. The abbreviation "EM" indicates electromagnetic force applied upward or downward, depending on the direction of the associated arrow, to a relevant group of moving elements. In the embodiment illustrated in FIG. 8B, if at time t, the LSB of the re-scaled PCM signal is 1 (step 816), this indicates that the speaker elements in group G1 may be in the selected end-position. If (step 817) group G1 is already in the selected end-position, no further action is required, however if the group G1 is not yet in the selected end-position, the latching controller 50 waits (step 818) for the electromagnetic field to be upward and then (step 819) releases the bottom latches in set B1 and engages the top latches in set T1. This is also the case, mutatis mutandis, for all other groups G2, . . . GN.

In FIG. 8B, the notation Tk or Bk followed by an upward pointing or downward pointing arrow indicates latching or releasing (upward or downward arrow respectively) of the top or bottom (T or B respectively) latch of the k'th group of moving elements.

Figure 8C:
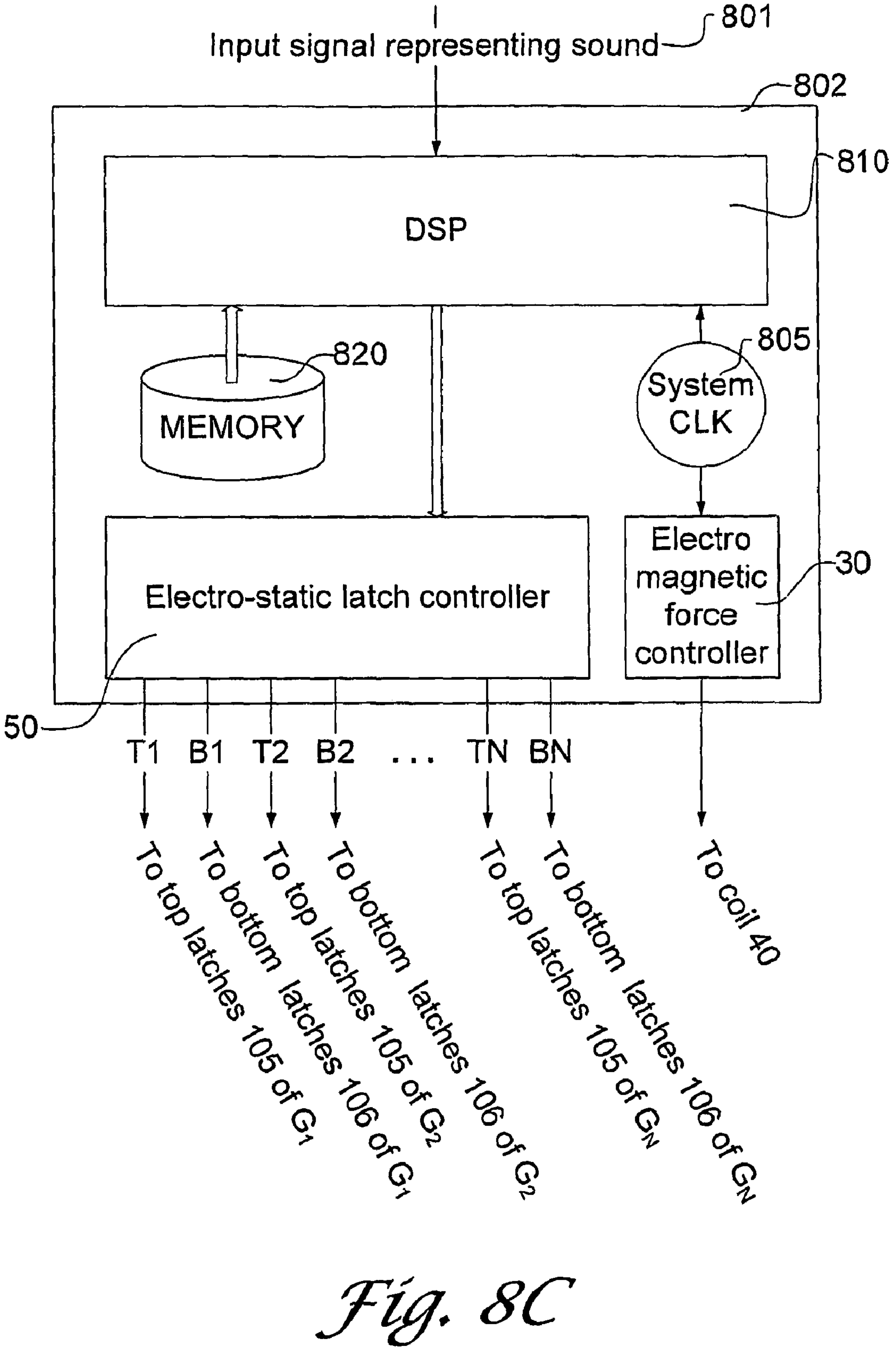
FIG. 8C is a simplified functional block diagram illustration of a processor, such as the processor 802 of FIG. 8A, which is useful in controlling substantially any of the actuator devices with electrostatic latch mechanisms shown and described herein.

FIG. 8C is a simplified functional block diagram illustration of a processor, such as the processor 802 of FIG. 8A, which is useful in controlling substantially any of the actuator devices with electro-static latch mechanisms shown and described herein. A single processor, in the embodiment of FIG. 8C, implements both electromagnetic field controller 30 and latch controller 50. The electromagnetic field controller 30 typically receives the system clock 805 which is typically a square wave and generates a sine wave with the same frequency and phase, providing this to the coil 40 as an actuating signal. The DSP 810 may for example comprise a suitably programmed TI 6000 digital signal processor commercially available from Texas Instruments. The program for the DSP 810 may reside in a suitable memory chip 820 such as a flash memory. The latch controller 50, in at least one mode of latch control operation, is operative to set the number of moving elements which oscillate freely responsive to the electromagnetic force applied by the coil 40 to be substantially proportional to the intensity sound coded in the digital input signal.

The electromagnetic field controller 30 typically controls an alternating current flow to the coil 40 that typically surrounds the entire array of moving elements 10, thus creating and controlling the magnetic field across the entire array. In certain embodiments a power amplifier 811 may be used to boost current to the coil 40. The electromagnetic field controller 30 typically generates an alternating electromagnetic force whose alternation is synchronous with the system clock 805 as described in detail below with reference to FIG. 11A, graph I.

The latch controller 50 is operative to receive the digital input signal 801 and to control the latching mechanism 20 accordingly. Typically, each individual moving element 10 performs at most one transition per clock i.e. during one given clock, each moving element may move from its bottom position to its top position, or move from its top position to its bottom position, or remain at one of either of those two positions. A preferred mode of operation of the latch controller 50 is described below with reference to FIG. 11A. According to a preferred embodiment of the present invention, retention of moving elements 10 in their appropriate end positions is affected by the latching controller 50.

Preferably, the latching controller 50 operates on the moving elements in groups, termed herein "controlled groups". All moving elements in any given group of moving elements are selectably either latched into their top positions, or into their bottom positions, or are unlatched. Preferably, the "controlled groups" form a sequence G1, G2, . . . and the number of speaker elements in each controlled group Gk is an integer, such as 2, to the power of (k−1), thereby allowing any desired number of speaker elements to be operated upon (latched upward, downward or not at all) since any given number can be expressed as a sum of powers of, for example, two or ten or another suitable integer. If the total number of speaker elements is selected to be one less than an integral power (N) of 2 such as 2047, it is possible to partition the total population of speaker elements into an integral number of controlled groups namely N. For example, if there are 2047 speaker elements, the number of controlled groups in the sequence G1, G2, . . . is 11.

In this embodiment, since any individual value of the re-scaled PCM signal can be represented as a sum of integral powers of 2, a suitable number of speaker elements can always be placed in the selected end-position by collectively bringing all members of suitable controlled groups into that end-position. For example, if at time t the value of the re-scaled PCM signal is 100, then since 100=64+32+4, groups G3, G6 and G7 together include exactly 100 speaker elements and therefore, at the time t, all members of these three groups are collectively brought to the selected end position such as the "up" or "top" position and, at the same time, all members of all groups other than these three groups are collectively brought to the un-selected end position such as the "down" or "bottom" position. It is appreciated that each moving element has bottom and top latches, each typically generated by selectively applying suitable local electrostatic forces, associated therewith to latch it into its "down" and "up" positions respectively. The set of bottom and top latches of the speaker elements in group Gk are termed Bk and Tk latches respectively.

Figure 8D:
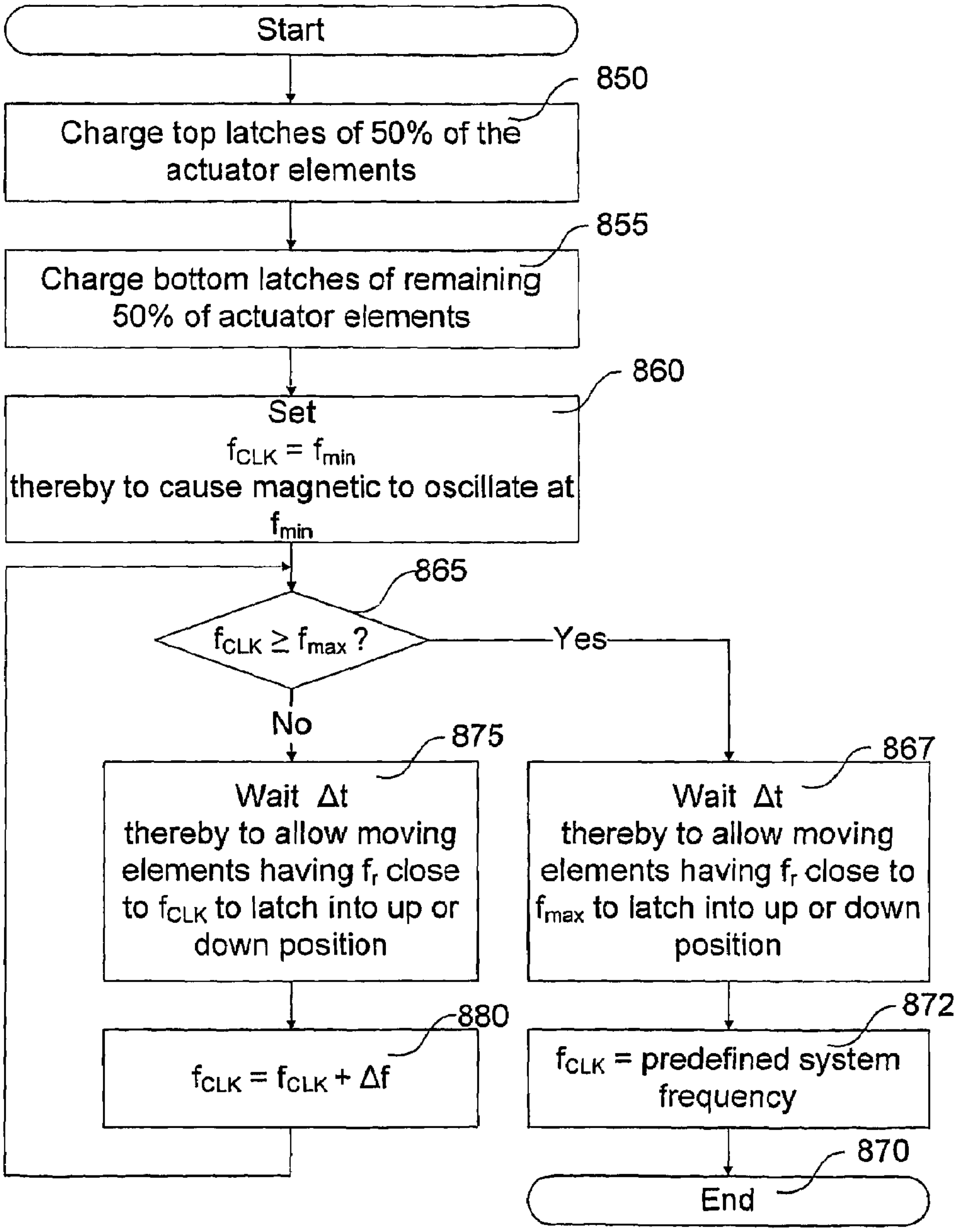
FIG. 8D is a simplified flowchart illustration of a preferred method for initializing the apparatus of FIGS. 1-8C.

FIG. 8D is a simplified flowchart illustration of a preferred method for initializing the apparatus of FIGS. 1A-8C. According to the method of FIG. 8D, the array of moving elements 10 is put into initial motion including bringing each moving element 10 in the array of moving elements into at least one latching position. As described herein, both top and bottom latching positions are typically provided for each moving element 10 in which case the step of bringing each moving element in the array into at least one latching position typically comprises bringing a first subset of the moving elements in the array into their top latching positions and a second subset, comprising all remaining elements in the array, into their bottom latching positions. The first and second subsets are preferably selected such that when the moving elements in the first and second subsets are in their top and bottom latching positions respectively, the total pressure produced by fluid such as air displaced by the moving elements 10 in the first subset is equal in magnitude and opposite in direction to the total pressure produced by fluid such as air displaced by the moving elements in the second subset.

The moving elements 10 typically bear a charge having a predetermined polarity and each of the moving elements defines an individual natural resonance frequency which tends to differ slightly from that of other moving elements due to production tolerances, thereby to define a natural resonance frequency range, such as 42-46 KHz, for the array of moving elements. As described herein, typically, first and second electrostatic latching elements are provided which are operative to latch the moving elements 10 into the top and bottom latching positions respectively and the step of putting the array of moving elements into motion comprises:

Step 850: Charge the first (top or bottom) electrostatic latch of each moving element included in the first subset with a polarity opposite to the pole, on the moving element, facing that latch. The first and second subsets may each comprise 50% of the total number of moving elements.

Step 855: Charge the second (bottom or top) electrostatic latch of each moving element included in the second subset with a polarity opposite to the pole, on the moving element, facing that latch.

Step 860: As described above, the moving elements are designed to have a certain natural resonance frequency, $f_r$. Design tools may include computer aided modeling tools such as finite elements analysis (FEA) software. In step 860, $f_{CLK}$, the frequency of the system clock, which determines the timing of the alternation of the electromagnetic field in which the moving elements are disposed, is set to the natural resonance frequency of the moving element in the array which has the lowest natural resonance frequency, referred to as $f_{min}$ and typically determined experimentally or by computer-aided modeling.

Steps 865-870: The system clock frequency may then be monotonically increased, from an initial value of $f_{min}$ to subsequent frequency values separated by $\Delta f$ until the system clock frequency has reached the natural resonance frequency of the moving element in the array which has the highest natural resonance frequency, referred to as $f_{max}$ and typically determined experimentally or by computer-aided modeling. It is appreciated however that alternatively the system clock frequency might be monotonically decreased, from $f_{max}$ to $f_{min}$, or might be varied non-monotonically.

It is appreciated that when a moving element 10 is excited at its natural resonance frequency, $f_r$, the moving element increases its amplitude with every cycle, until reaching a certain maximal amplitude termed hereinafter $A_{max}$. Typically, the duration $\Delta t$ required for the moving element to reach $A_{max}$ is recorded during set-up and the magnetic force applied during the initialization sequence is selected to be such that $A_{max}$ is twice as large as the gap the moving element needs to travel from its idle state to either the top or bottom latch.

The Q factor or quality factor is a known factor which compares the time constant for decay of an oscillating physical system's amplitude to its oscillation period. Equivalently, it compares the frequency at which a system oscillates to the rate at which it dissipates its energy. A higher Q indicates a lower rate of energy dissipation relative to the oscillation frequency. Preferably, the Q factor of the moving elements is determined either computationally or experimentally. The Q factor as determined describes how far removed the frequency $f_{CLK}$ needs to be from $f_r$ (two possible values, one below $f_r$ and one above $f_r$) before the amplitude drops to 50% of $A_{max}$. The difference between the two possible values is $\Delta f$.

As a result of the above steps, a sequence of electromagnetic forces of alternating polarities is now applied to the array of moving elements. The time interval between consecutive applications of force of the same polarity varies over time due to changes induced in the system clock, thereby to define a changing frequency level for the sequence. This results in an increase, at any time t, of the amplitude of oscillation of all moving elements whose individual natural resonance frequency is sufficiently similar to the frequency level at time t. The frequency level varies sufficiently slowly (i.e. only after a suitable interval $\Delta t$, which may or may not be equal in all iterations) to enable the set S, of all moving elements whose natural resonance frequency is similar to the current frequency level, to be latched before the electromagnetic field alternation frequency level becomes so dissimilar to their natural resonance frequency as to cease increasing the amplitude of oscillation of the set S of moving elements. The extent of variation of the frequency level corresponds to the natural resonance frequency range. Typically, at the end of the initiation sequence (step 872), the system clock $f_{CLK}$ is set to the predefined system frequency, typically being the average or median natural resonance frequency of the moving elements in the array, i.e. 44 KHz.

One method for determining the range of the natural resonance frequencies of the moving elements is to examine the array of moving elements using a vibrometer and excite the array at different frequencies.

Figure 8E:
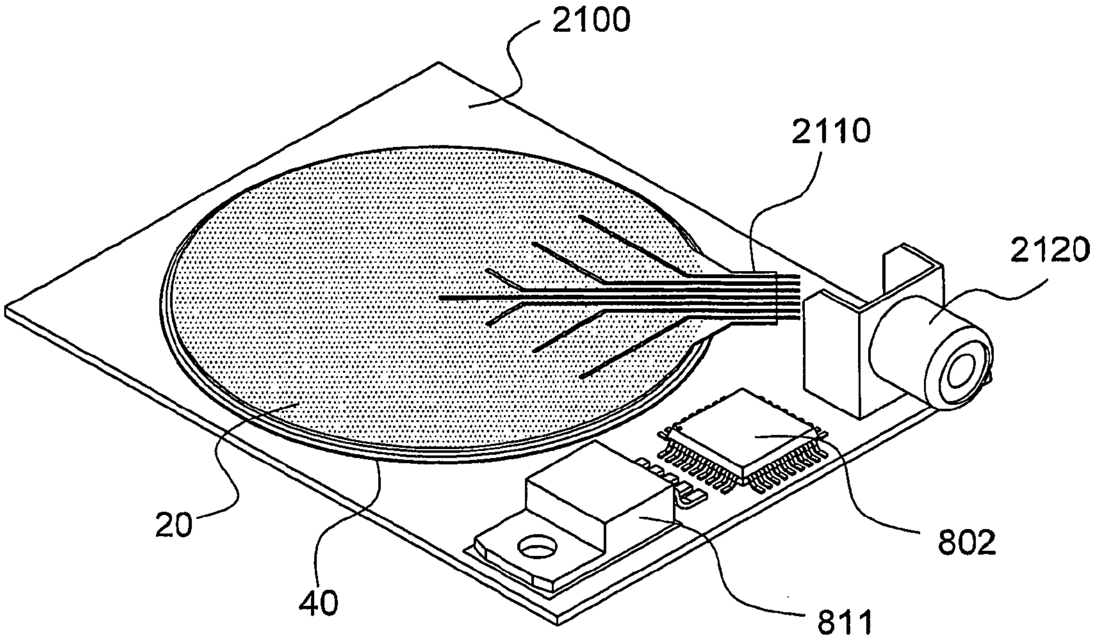
FIG. 8E is a simplified isometric view illustration of an assembled speaker system constructed and operative in accordance with a preferred embodiment of the present invention.

FIG. 8E is a simplified isometric view illustration of an assembled speaker system constructed and operative in accordance with a preferred embodiment of the present invention. Mounted on a PCB 2100 is the array of actuator elements including moving elements 10 (not shown) sandwiched between latching elements 20. The array is surrounded by coil 40. Control lines 2110 are shown over which the latch control signals generated by latch controller 50 (not shown) in processor 802 travel to the latch elements 20. Amplifier 811 amplifies signals provided by the magnetic field generation controller 30 (not shown) in processor 802 to the coil 40. A connector 2120 connects the apparatus of FIG. 8E to a digital sound source. For simplicity, conventional components such as power supply components are not shown.

Figure 8F:
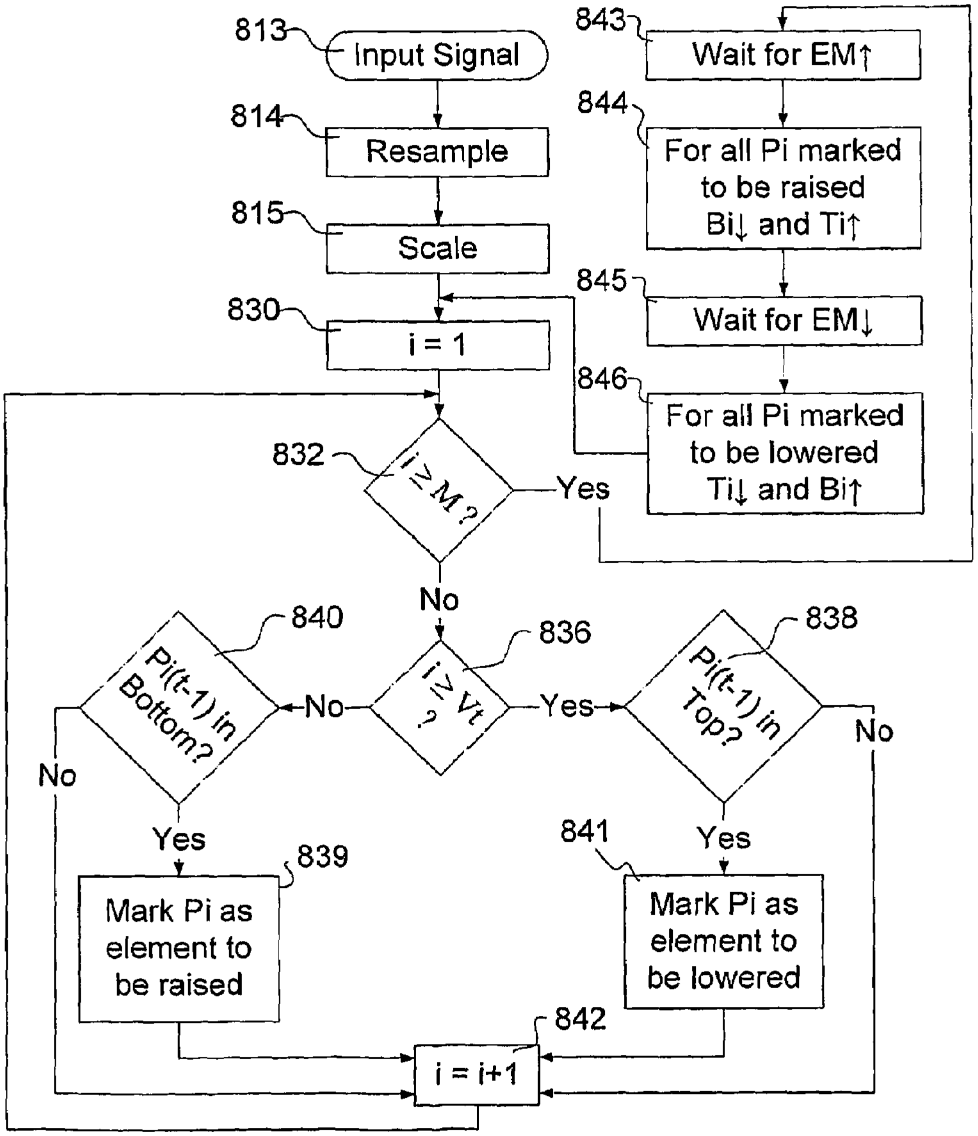
FIG. 8F is a simplified flowchart illustration of a preferred method of operation for generating a sound using apparatus constructed and operative in accordance with an embodiment of the present invention.

A preferred method of operation for generating a sound using apparatus constructed and operative in accordance with an embodiment of the present invention is now described based on FIG. 8F. The method of FIG. 8F is preferably based on the sound's representation in the time domain, typically a PCM (pulse-code modulation) representation.

Resampler 814 of FIG. 8F: Unless the sampling rate of the PCM happens to be the same as the system clock, the PCM is resampled to bring its sampling rate up to or down to the system clock frequency (top row in FIG. 11A) of the apparatus of FIG. 1A.

Generally, any suitable sampling rate may be employed. Specifically, the system of the present invention generates sound-waves having at least two different frequencies, one of which is the desired frequency as determined by the input signal and the other of which is an artifact. The artifact frequency is the clock frequency i.e. the sampling rate of the system. Therefore, preferably, the system sampling rate is selected to be outside of the human hearing range i.e. at least 20 KHz. Nyquist sampling theory teaches that the system clock must be selected to be at least double that of the highest frequency the speaker is designed to produce.

Scaler 815: The PCM word length is typically 8, 16 or 24 bits. 8 bit PCM representations are unsigned, with amplitude values varying over time from 0 to 255, and 16 and 24 bit PCM representations are signed, with amplitude values varying over time from −32768 to 32767 and −8388608 to 8388607 respectively. The speaker of FIGS. 1-2C typically employs an unsigned PCM signal and therefore, if the PCM signal is signed e.g. if the PCM word length is 16 or 24 bits, a suitable bias is added to obtain a corresponding unsigned signal. If the PCM word length is 16 bits, a bias of 32768 amplitude units is added to obtain a new range of 0-65535 amplitude units. If the PCM word length is 24 bits, a bias of 8388608 amplitude units is added to obtain a new range of 0-16777215 amplitude units.

The PCM signal is then further re-scaled as necessary such that its range, in amplitude units, is equal to the number of speaker elements in the apparatus of FIGS. 1-2C. For example, if the number of speaker elements is 2047, and the PCM signal is an 8 bit signal, the signal is multiplied by a factor of 2048/256=8. Or, if the number of speaker elements is 2047, and the PCM signal is a 16 bit signal, the signal is multiplied by a factor of 2048/65536=1/32.

Sound is then generated to represent the re-scaled PCM signal by actuating a suitable number of speaker elements in accordance with the current value of the re-scaled PCM signal. It is appreciated that the speaker elements have two possible end-states, termed herein the "down" and "up" end-states respectively, and illustrated schematically in FIGS. 2A and 2B respectively. An individual one of these end-states is selected and the number of speaker elements in that end-state at any given time matches the current value of the re-scaled PCM signal, the remaining speaker elements at the same time being in the opposite end-state. For example, if there are 2047 speaker elements, the selected end-state is "up" and the value of the re-scaled PCM signal at time t is 100, the number of speaker elements in the "up" and "down" end states at time t are 100 and 1947 respectively. According to certain embodiments of the invention, there is no importance to the particular speaker elements selected to be in the "up" state as long as their total number corresponds to the current value of the re-scaled PCM signal.

The following loop is then performed M times each time a sample is generated by scaler 815. M is the number of actuator elements in the apparatus of FIG. 1A. i is the index of the current loop. $V_t$ is used to designate the current sample value exiting scaler 815 (for which M iterations of the loop are being performed). Generally, the number of moving elements to be latched into their top positions, is exactly equal to the value of $V_t$ and all remaining moving elements are to be latched into their bottom positions. Therefore, while i is still smaller than $V_t$, the i'th moving element or pixel, termed in FIG. 8F "Pi" is latched to its top position. This is done by checking (FIG. 8F, step 840) whether, when moving element i was processed in the previous loop (t−1), it was in its top latching position or in its bottom latching position. If the former was the case, nothing needs to be done and the method jumps to incrementation step 842. If the latter was the case, element i is marked as an element which needs to be latched into its top position (step 839). To latch all remaining moving elements into their bottom positions, do the following for all moving elements whose index exceeds $V_t$: check (step 838) which are already in their bottom positions; these moving elements need no further treatment. All others are marked (step 841) as elements which need to be latched into their bottom positions. Once all M elements have been marked or not marked as above, perform the following:

Verify that the magnetic field points upward, or wait for this (step 843), and, for the $V_t$ or less pixels which are to be raised, discharge the bottom latches and charge the top latches (step 844). Next, wait for the magnetic field to point downward (step 845), and, for the $(M-V_t)$ or less pixels which are to be lowered, discharge the top latches and charge the bottom latches (step 846). At this point, the flow waits for the next sample to be produced by scaler 815 and then begins the M iterations of the loop just described for that sample.

It is appreciated that steps preceding step 843 are preferably executed during the half clock cycle in which the magnetic field polarity is downwards. Step 844 is preferably executed at the moment the magnetic field changes its polarity from downwards to upwards. Similarly, step 846 is preferably executed at the moment the magnetic field changes polarity again from upwards to downwards. It is also appreciated that in order for the device to remain synchronized with the digitized input signal, steps 814-846 are all preferably executed in less than one clock cycle.

FIG. 9A is a graph summarizing the various forces brought to bear on moving elements 10 in accordance with a preferred embodiment of the present invention.

Figure 9B:
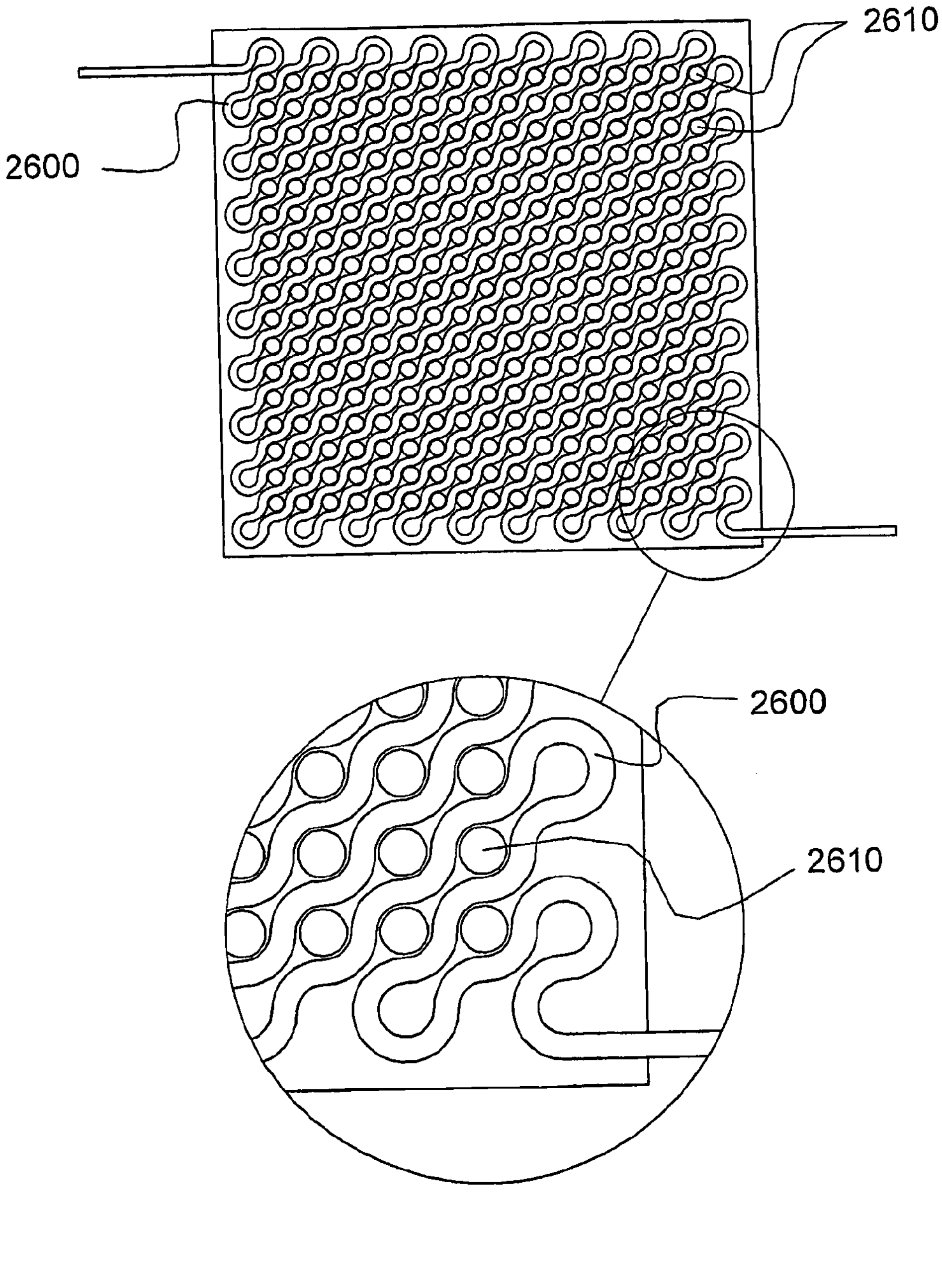
FIG. 9B is a simplified pictorial illustration of a magnetic field gradient inducing layer constructed and operative in accordance with a preferred embodiment of the present invention.

FIG. 9B is a simplified pictorial illustration of a magnetic field gradient inducing layer constructed and operative in accordance with a preferred embodiment of the present invention and comprising at least one winding conductive element 2600 embedded in a dielectric substrate 2605 and typically configured to wind between an array of channels 2610. Typically, there are no channels 2610 along the perimeter of the conductive layer of FIG. 9B so that the gradient induced within channels adjacent the perimeter is substantially the same as the gradient induced in channels adjacent the center of the conductive layer.

If the layer of FIG. 9B is separate from the spacer layers described above, then the channels in the layer of FIG. 9B are disposed opposite and as a continuation of the channels in the spacer layers described in detail above. The cross-sectional dimensions, e.g. diameters, of channels 2610 may be different than the diameters of the channels in the spacer layer. Alternatively, the layer of FIG. 9B may serve both as a spacer layer and as a magnetic field inducing layer in which case the channels 2610 of FIG. 9B are exactly the spacer layer channels described hereinabove. It is appreciated that, for simplicity, the electrodes forming part of the spacer layer are not shown in FIG. 9B.

Figure 9C:
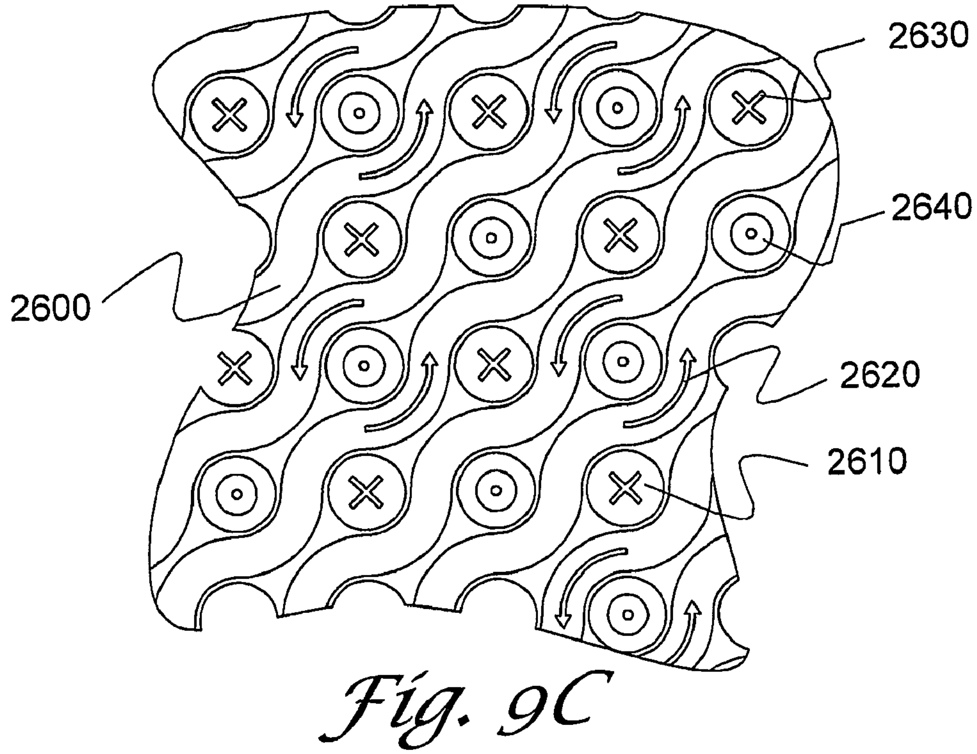
FIGS. 9C-9D illustrate the magnetic field gradient induction function of the conductive layer of FIG. 9B.
Figure 9D:
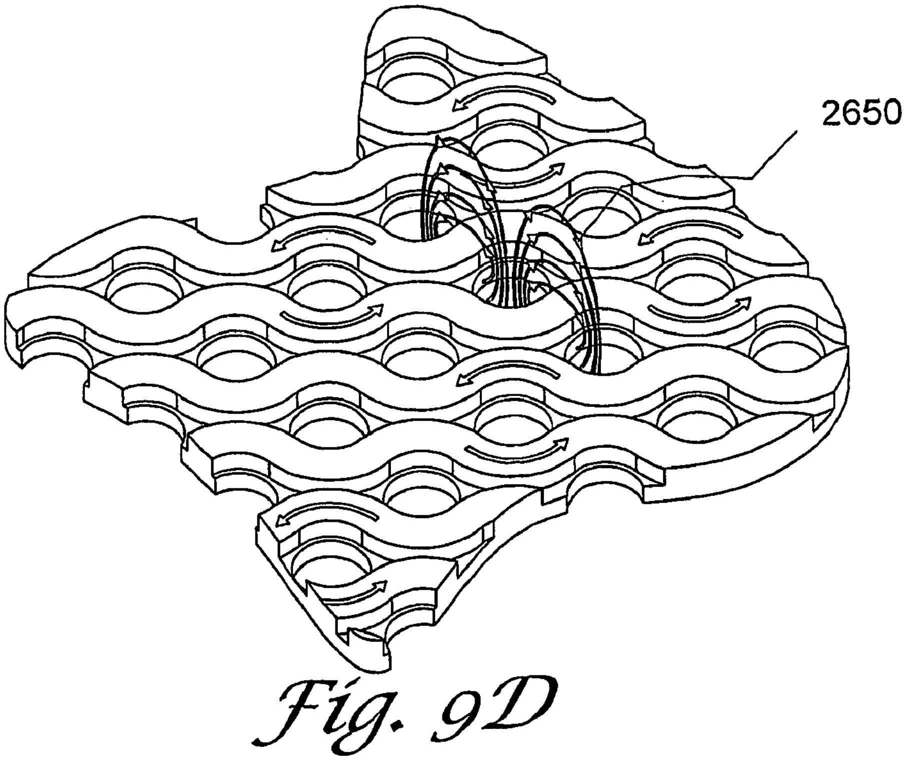

FIGS. 9C and 9D illustrate the magnetic field gradient induction function of the conductive layer of FIG. 9B. In FIG. 9C, the current flowing through the winding element 2600 is indicated by arrows 2620. The direction of the resulting magnetic field is indicated by X's 2630 and encircled dots 2640 in FIG. 9C, indicating locations at which the resulting magnetic field points into and out of the page, respectively.

FIG. 10A is a simplified top cross-sectional illustration of a latching layer included in latch 20 of FIG. 1A in accordance with a preferred embodiment of the present invention. The latching layer of FIG. 10A is suitable for latching moving elements partitioned into several groups G1, G2, . . . whose latches are electrically interconnected as shown so as to allow collective actuation of the latches. This embodiment is typically characterized in that any number of moving elements may be actuated by collectively charging the latches of selected groups from among the partitioned groups, each latch in the latching layer typically being associated with a permanent magnet, wherein the poles of all of the permanent magnets in the latching layer are all identically disposed. Each group Gk may comprise 2 to the power of (k−1) moving elements. The groups of moving elements may spiral out from the center of the array of moving elements, smallest groups being closest to the center as shown.

Figure 10B:
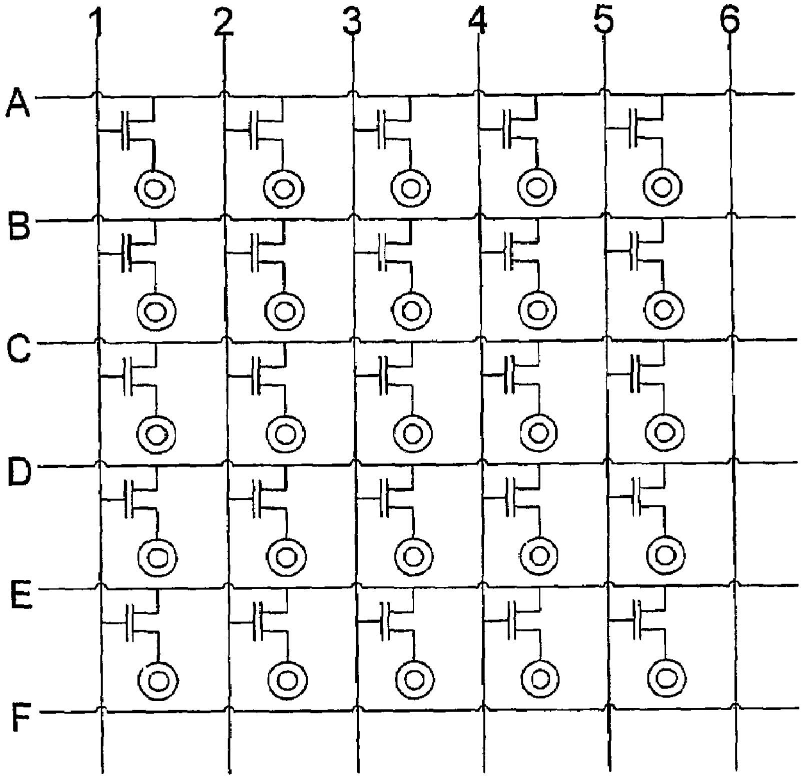
FIG. 10B is a simplified electronic diagram of an alternative embodiment of the latch layer of FIGS. 1-10A in which each latch is individually controlled by the latching controller 50 of FIG. 8C. It is appreciated that the latches are shown to be annular however alternatively may have any other suitable configuration as described herein. The layer of FIG. 10B comprises a grid of vertical and horizontal wires defining junctions. A gate such as a field-effect transistor is typically provided at each junction. To open an individual gate thereby to charge the corresponding latch, voltage is provided along the corresponding vertical and horizontal wires.

FIG. 10B is a simplified electronic diagram of an alternative embodiment of the latching layer of FIG. 10A in which each latch is individually rather than collectively controlled (i.e. charged) by the latching controller 50 of FIG. 1A. It is appreciated that the latches are shown to be annular, however alternatively they may have any other suitable configuration e.g. as described herein. The layer of FIG. 10B comprises a grid of vertical and horizontal wires defining junctions. A gate such as a bi-polar field-effect transistor is typically provided at each junction. To open an individual gate thereby to charge the corresponding latch, suitable voltages are provided along the corresponding vertical and horizontal wires.

Figure 11B:
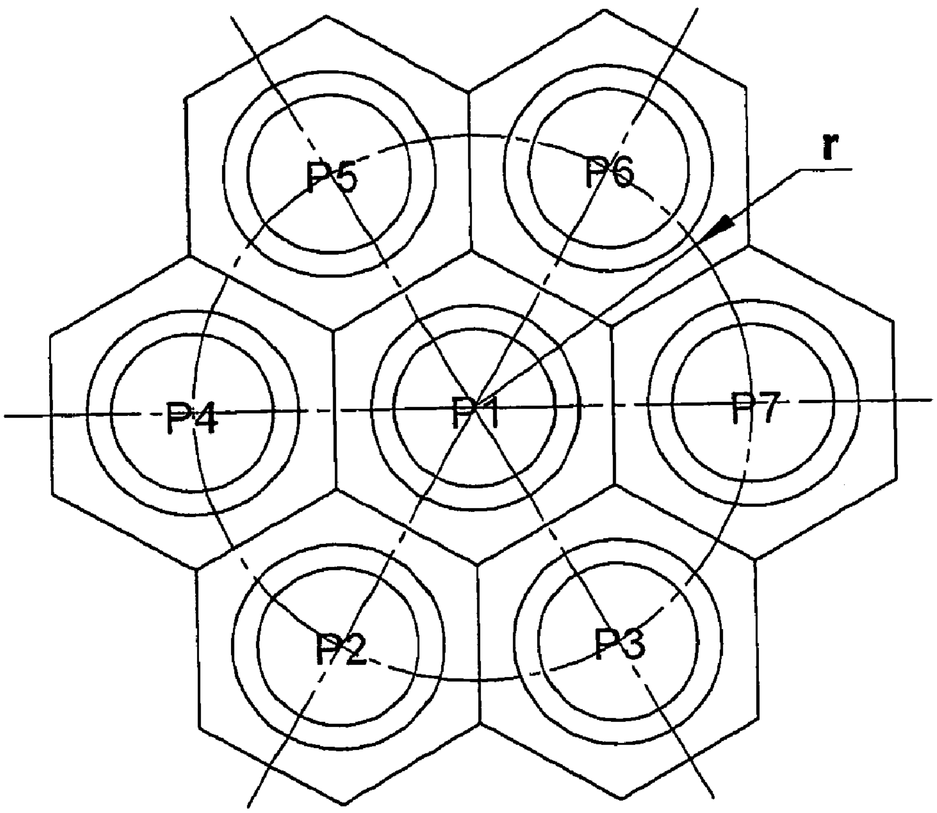
FIG. 11B is a schematic illustration of an example array of moving elements to which the timing diagram of FIG. 11A pertains.

FIG. 1A is a timing diagram showing a preferred charging control scheme which may be used by the latch controller 50 in FIG. 1A in uni-directional speaker applications wherein an input signal representing a desired sound is received, and moving elements 10 constructed and operative in accordance with a preferred embodiment of the present invention are controlled responsively, by appropriate charging of their respective latches, so as to obtain a sound pattern in which the volume in front of the speaker is greater than in other areas, each latch in the latching layer being associated with a permanent magnet, and the poles of all of the permanent magnets in the latching layer all being identically disposed. FIG. 11B is a schematic illustration of an example array of moving elements 10 to which the timing diagram of FIG. 11A pertains.

A preferred mode of operation of the latch controller 50 is now described with reference to FIGS. 11A-B. For clarity, the preferred mode of operation is described merely by way of example with reference to a speaker comprising 7 pixels numbered P1, P2, . . . P7 as shown in FIG. 11B. Further according to the example used to explain the preferred mode of operation of latch controller 50, the 7 pixels are actuated in three groups comprising 1, 2 and 4 pixels respectively. Generally, the latch controller 50 uses various decision parameters, as described in detail herein, to determine how to control each individual moving element in each time interval. Speakers constructed and operative in accordance with a preferred embodiment of the present invention are typically operative to reproduce a sound which is represented by the analog signal of Graph II and is then digitized and supplied to a speaker of the present invention. The values of the digital signal are shown in FIG. 11A, graph III.

Graph IV shows the alternation of the electromagnetic force applied to the moving elements 10 by the coil or other magnetic field generator 40. Graph V is the signal provided by latching controller 50 to the top latch of an individual moving element, P1 seen in FIG. 11B, forming, on its own, a first group G1 of moving elements consisting only of P1. Graph VI is the signal provided by latching controller 50 to the bottom latch of P1. The states of P1, due to the operation of the latches associated therewith, are shown in Graph VII, in which black indicates the top extreme position in which the top latch engages P1, white indicates the bottom extreme position in which the bottom latch engages P1, and hatching indicates intermediate positions.

Graph VIII is the signal provided by latching controller 50 to the top latch/es of each of, or both of, moving elements P2 and P3 seen in FIG. 11B, which together form a second group GII of moving elements. Graph IX is the signal provided by latching controller 50 to the bottom latch/es of GII. The states of P2 and P3, due to the operation of the latches associated therewith, are shown in Graphs X and XI respectively, in which black indicates the top extreme position in which the top latch engages the relevant moving element, white indicates the bottom extreme position in which the bottom latch engages the relevant moving element, and hatching indicates intermediate positions of the relevant moving element.

Graph XII is the signal provided by latching controller 50 to the top latch/es of each of, or all of, moving elements P4-P7 seen in FIG. 11B, which together form a third group GIII of moving elements. Graph XIII is the signal provided by latching controller 50 to the bottom latch/es of GIII. The states of P4-P7, due to the operation of the latches associated therewith, are shown in Graphs XIV-XVII respectively, in which black indicates the top extreme position in which the top latch engages the relevant moving element, white indicates the bottom extreme position in which the bottom latch engages the relevant moving element, and hatching indicates intermediate positions of the relevant moving element.

Graph XVIII schematically illustrates the moving elements P1-P7 of FIG. 11B in their various positions, as a function of time.

For example, in interval I5, the clock is high (graph I), the digitized sample value is 2 (graph III), which indicates that 5 elements need to be in their top positions. and 2 elements in their bottom positions as shown in interval I5 of Graph XVIII. Since latch actuation in this embodiment is collective, this is achieved by selecting groups G1 and G3 which together have 5 elements (1+4) to be in their top positions whereas the two moving elements in G2 will be in their bottom positions. The magnetic field points upward in interval I5 as shown in Graph IV. In interval I4, the moving element in G1 was in its bottom position as shown in Graph XVIII and therefore needs to be raised. To do so, control signal B1 is lowered (graph VI) and control signal T1 is raised (graph V). As a result, the moving element of G1 assumes its top position as shown in graph VII. In interval I4, the moving elements in G2 are already in their bottom positions as shown in Graph XVIII and therefore the top control signal T2 remains low as seen in graph VIII, the bottom control signal B2 remains high as seen in graph IX and consequently, as shown in Graphs X and XI respectively, the two moving elements (P2 and P3) in G2, remain in their bottom extreme positions. As for group G3, in interval I4, the moving elements in G3 are already in their top positions as shown in Graph XVIII and therefore the top control signal T3 remains high as seen in graph XII, the bottom control signal B3 remains low as seen in graph XIII and consequently, as shown in Graphs XIV-XVII respectively, the four moving elements (P4-P7) in G3, remain in their top extreme positions.

Preferably, when the input signal in graph II is at a positive local maximum, all moving elements are in their top position. When the input signal is at a negative local maximum, all moving elements are in their bottom position.

Figure 11C:
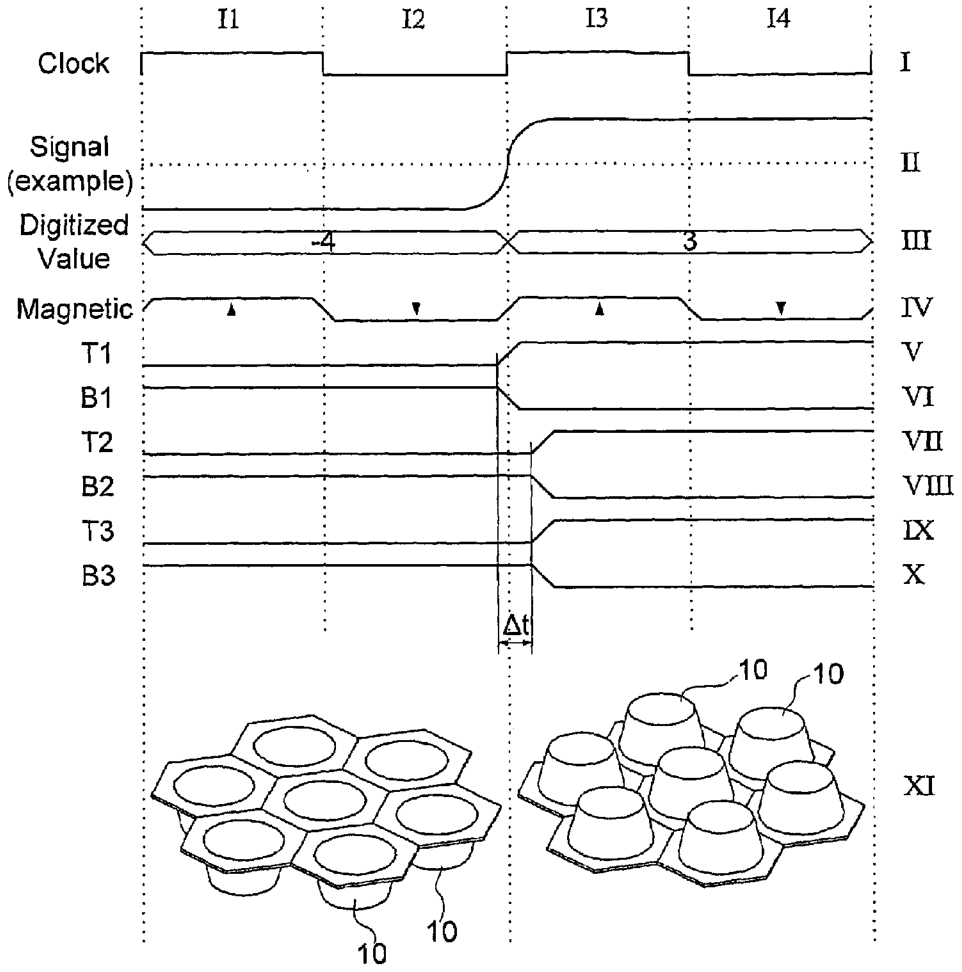
FIG. 11C is a timing diagram showing a preferred control scheme used by the latch controller in omni-directional speaker applications wherein an input signal representing a desired sound is received, and moving elements constructed and operative in accordance with a preferred embodiment of the present invention are controlled responsively, so as to obtain a sound pattern in which the volume in front of the speaker is similar to the volume in all other areas surrounding the speaker.

FIG. 11C is a timing diagram showing a preferred control scheme used by the latch controller 50 in omni-directional speaker applications wherein an input signal representing a desired sound is received, and moving elements constructed and operative in accordance with a preferred embodiment of the present invention are controlled responsively, so as to obtain a sound pattern in which the loudness of the sound in an area located at a certain distance in front of the speaker is similar to the loudness in all other areas surrounding the speaker at the same distance from the speaker.

As shown, the step of selectively latching comprises latching specific moving elements at a time determined by the distance of the specific moving elements from the center of the array (e.g. as indicated by r in the circular array of FIG. 11B). Typically, when it is desired to latch a particular subset of moving elements, typically corresponding in number to the intensity of a desired sound, the moving elements are latched not simultaneously but rather sequentially, wherein moving elements closest to the center are latched first, followed by those moving elements disposed, typically in layers, concentrically outward from the center. Typically, the moving elements in each layer are actuated simultaneously. Typically, the temporal distance Δt between the moment at which a particular moving element is latched and between the moment at which the first, central, moving element or elements was or were latched is r/c where c is the speed of sound.

It is appreciated that the moving elements in graph X of FIG. 11C are shown to comprise flexible peripheral portions, however this is merely by way of example and is not intended to be limiting.

Figure 12B:
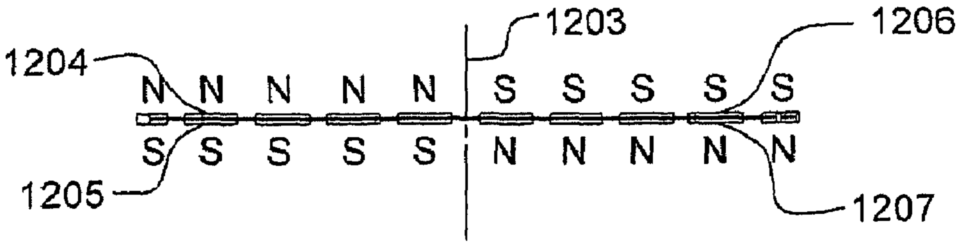

FIGS. 12A and 12B are respectively simplified top view and cross-sectional view illustrations of the moving element layer in accordance with a preferred embodiment of the present invention in which half of the permanent magnets are placed north pole upward and half north pole downward. A particular advantage of this embodiment is that moving elements can be raised both when the electromagnetic field points upward and when it points downward rather than waiting for the field to point upward before lifting a moving element and waiting for the field to point downward before lowering a moving element. Although the illustrated embodiment shows the two subsets separated from one another, this not need be the case. The two subsets may be interleaved with one another.

FIG. 13 is a simplified top view illustration similar to FIG. 10A except that half of the permanent magnets in the latching layer are disposed north pole upward and the remaining half of the permanent magnets in the latching layer are disposed north pole downward. Whereas in the embodiment of FIG. 10A, there was one group each of size 1, 2, 4, . . . (which may be arranged sequentially around the center as shown in FIG. 10A although this need not be the case) in the embodiment of FIG. 13, there are two groups of each size, thereby generating two sequences of groups of size 1, 2, 4, . . . . In the illustrated embodiment the groups in the first sequence are termed G1L, G2L, G3L, . . . and the groups in the first sequence are termed G1R, G2R, G3R, . . . . Each of these sequences is arranged within one semicircle, such as the left and right semicircles as shown. The arrangement of the groups within its semicircle need not be in order of size of the group extending concentrically outward as shown and can be any desired arrangement, however, preferably, both groups are arranged mutually symmetrically within their individual semicircle. It is appreciated that by using suitable coil designs, the same effect can be achieved using permanent magnets that are all polarized in the same direction while the coil generates magnetic fields having a certain polarization across half of the moving elements and having an opposite polarization across the other half.

A particular feature of the embodiments of FIGS. 10A and 13 is that latch elements corresponding to certain moving elements are electrically interconnected thereby to form groups of moving elements which can be collectively latched or released by collectively charging or discharging, respectively, their electrically interconnected latches.

FIG. 14 is a control diagram illustrating control of the latches and of the coil-induced electromagnetic force for a particular example in which the moving elements are arranged in groups that can each, selectively, be actuated collectively, similar to FIG. 8A except that half of the permanent magnets in the latching layer are disposed north pole upward and the remaining half of the permanent magnets in the latching layer are disposed north pole downward as shown in FIG. 13, whereas in FIG. 8A, the poles of all of the permanent magnets in the latching layer are all identically disposed. As shown in FIG. 14, latching signals are provided to all of groups G1L, G2L, G3L, . . . and G1R, G2R, G3R. The top latching signals for these groups are indicated as LT1, LT2, LT3, . . . and RT1, RT2, RT3 respectively. The bottom latching signals for these groups are indicated as LB1, LB2, LB3, . . . and RB1, RB2, RB3.

FIG. 15A is a timing diagram showing a preferred control scheme used by the latch controller 50 in unidirectional speaker applications, which is similar to the timing diagram of FIG. 11A except that half of the permanent magnets in the latching layer are disposed north pole upward and the remaining half of the permanent magnets in the latching layer are disposed north pole downward as shown in FIG. 13 whereas in FIG. 11A the poles of all of the permanent magnets in the latching layer are all identically disposed. FIG. 15B is a schematic illustration of an example array of moving elements to which the timing diagram of FIG. 15A pertains.

As described above, a particular advantage of the embodiment of FIGS. 13-15A as opposed to the embodiment of FIGS. 8A, 10A and 11A is that moving elements can be raised both when the electromagnetic field points upward and when it points downward rather than waiting for the field to point upward before lifting a moving element and waiting for the field to point downward before lowering a moving element. It is appreciated that no elements move in 50% of the time slots in FIG. 11A which may introduce distortion of sound and is relatively inefficient. In contrast, elements move in 100% of the time slots in FIG. 15A (other than slots in which no motion is required since the digital signal value is unchanged) thereby preventing distortion and enhancing efficiency.

For example, in interval I5, the digitized signal value changes from 1 to 2 as shown in graph II of FIGS. 11A and 15A. Consequently, moving element P1 in FIG. 11A needs to be raised i.e. released from its current, bottom extreme position and latched into its top extreme position, however whereas in I5, control signal B1 is lowered and control signal T1 is raised, in interval I6 nothing happens. In FIG. 15A, in contrast, where moving elements LP1 (and RP1) need to be raised, control signal LB1 is lowered and control signal LT1 is raised in interval I5, and immediately afterward, in interval I6, the RB1 control signal is lowered and the RT1 signal is raised, resulting in upward motion of RP1 without the delay incurred in FIG. 11A.

Generally in the embodiment of FIGS. 13-15A, since half of the magnets (say, the left half) point north up and the remaining (right) half point north down, when it is desired to move elements 10 upward, this can always be done without delay. If the magnetic field points up, the moving elements in the left half of the array can be moved upward before those in the right half, whereas if by chance the magnetic field is found to be pointing down, the moving elements in the right half of the array can be moved upward before those in the left half.

FIG. 15C is a graph showing changes in the number of moving elements disposed in top and bottom extreme positions at different times and as a function of the frequency of the input signal received by the latching controller 50 of FIG. 1A.

FIG. 16A is an isometric view illustration of a moving element layer which is an alternative to the moving element layer shown in FIGS. 1A and 2A-2C in which the layer is formed from a thin foil such that each moving element comprises a central portion and surrounding portions.

FIG. 16B is an isometric view illustration of still another alternative to the moving element layer shown in FIGS. 1A and 2A-2C in which the flexure structure at the periphery of each moving element comprises a sheet of flexible material e.g. rubber. The central area of each moving element comprises a magnet which may or may not be mounted on a rigid disc.

Figure 16C:
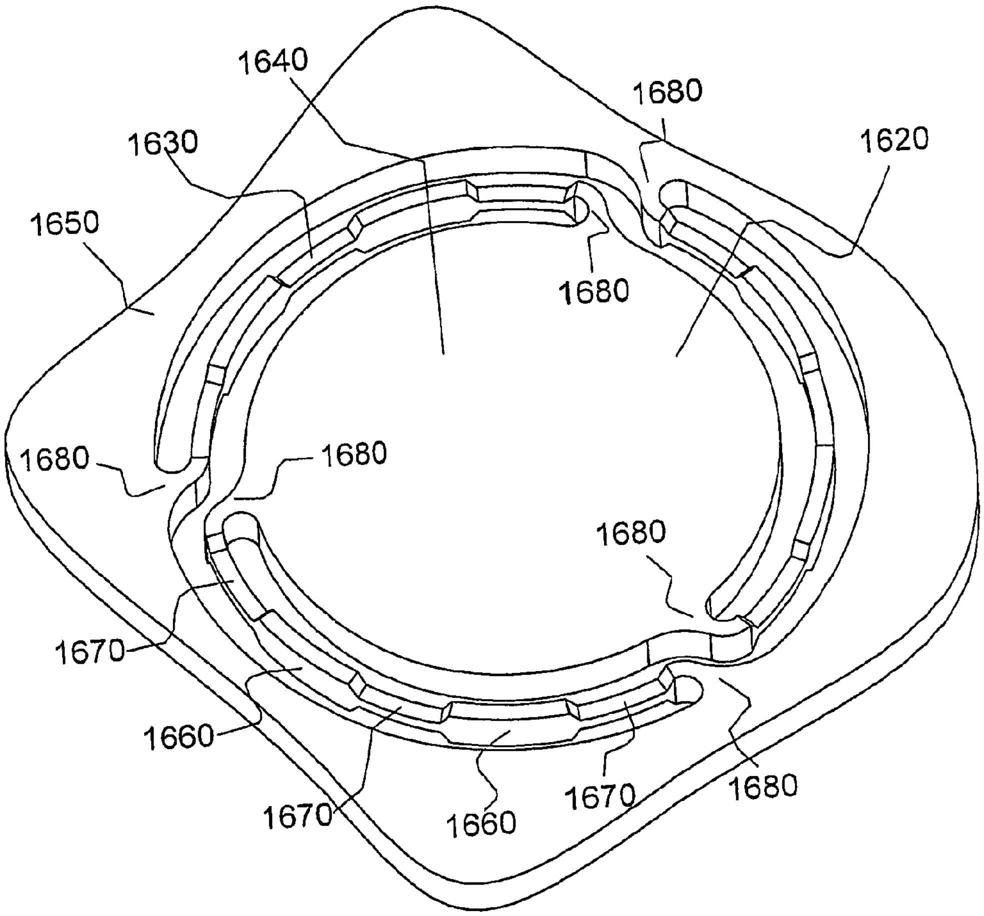
FIG. 16C is an isometric view of a preferred embodiment of the moving elements and surrounding flexures depicted in FIGS. 7A-7E or 16A in which flexures vary in thickness.

FIG. 16C is an isometric view of a preferred embodiment of the moving elements and surrounding flexures depicted in FIG. 7A-7E or 16A in which flexures vary in thickness. In FIG. 16C, for simplicity, the component which causes the moving element 1620 to be affected by the magnetic field, which may preferably comprise a magnet or alternatively, a ferro-magnet, conductive material or coil, is not shown. As shown, the moving element 1620 comprises serpentine peripheral flexures 1630 having portions of varying thicknesses connecting a central portion 1640 of the moving element to a sheet 1650 interconnecting all or many moving elements. For example, the portions of varying thicknesses may include thicker portions 1660 and thinner portions 1670 respectively as shown. For example, if the diameter of the central portion 1640 of each moving element is 300 microns and the sheet is silicon, then under certain conditions, portions 1670 may be 50 microns thick whereas portions 1660 may be 100 microns thick. More generally, thicknesses are computed as a function of materials to provide application-specific flexibility and strength levels, e.g. using FEA (finite element analysis) tools.

Figure 16D:
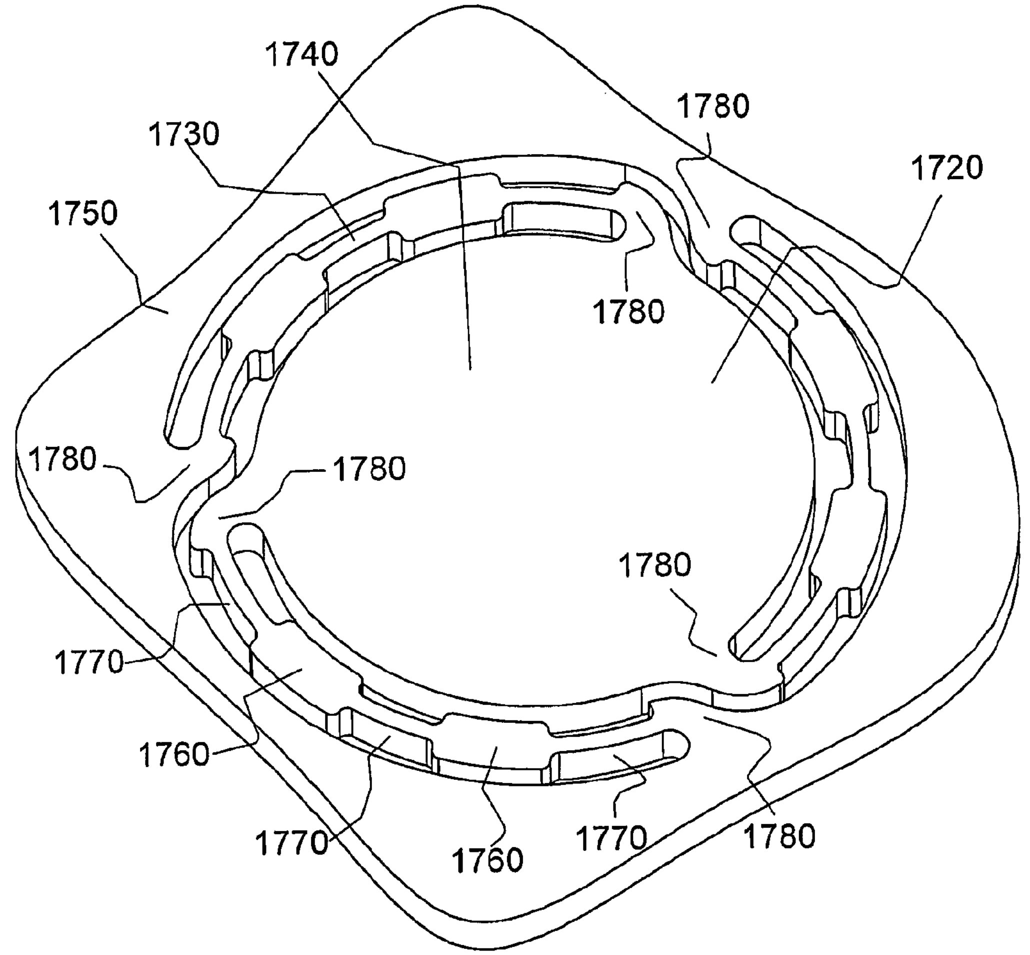
FIG. 16D is an isometric illustration of a cost effective alternative to the apparatus of FIG. 16C in which flexures vary in width.

FIG. 16D is an isometric illustration of a cost effective alternative to the apparatus of FIG. 16C in which flexures vary in width. As in FIG. 16C, for simplicity, the component which causes the moving element 1720 to be affected by the magnetic field, which component may preferably comprise a magnet or alternatively, a ferro-magnet, conductive material or coil, is not shown. As shown, the moving element 1720 comprises serpentine peripheral flexures 1730 having portions of varying widths connecting a central portion 1740 of the moving element to a sheet 1750 interconnecting all or many moving elements. For example, the portions of varying widths may include wider portions 1760 and narrower portions 1770 respectively as shown. For example, if the diameter of the central portion 1740 of each moving element is 300 microns and the sheet is silicon, then under certain conditions, portions 1770 may be 20 microns wide whereas portions 1760 may be 60 microns wide. More generally, widths are computed as a function of materials to provide application-specific flexibility and strength levels, e.g. using FEA (finite element analysis) tools.

It is appreciated that the embodiments of FIGS. 16C and 16D may be suitably combined, e.g. to provide flexures with varying thicknesses and varying widths, and/or varied, e.g. to provide flexures whose widths and/or thicknesses vary either continuously or discontinuously as shown, and either regularly as shown or irregularly.

In the above description, “thickness” is the dimension of the flexure in the direction of motion of the moving element whereas “width” is the dimension of the flexure in the direction perpendicular to the direction of motion of the moving element.

A particular advantage of the embodiments of FIGS. 16C and 16D is that in flexures of varying cross-sections, e.g. varying thicknesses or widths, the stress is not concentrated at the roots 1680 or 1780 of the flexures and is instead distributed over all the thin and/or narrow portions of the flexures. Also, generally, the stress on the flexures as a result of bending thereof is a steep function of the thickness, typically a cubic function thereof, and is also a function of the width, typically a linear function thereof. It is believed to be impractical, at least for certain materials such as silicon and at least for certain applications employing large displacement of the moving elements, e.g. public address speakers, to select flexure dimensions which are uniformly thin enough or narrow enough to provide sufficiently low stress so as to prevent breaking, and simultaneously stiff enough to allow natural resonance frequency at a desirable range e.g. 44 KHz. For this reason as well, it is believed to be advantageous to use flexures of varying thicknesses and/or widths e.g. as illustrated in FIGS. 16C-16D.

FIG. 17 is a top cross-sectional view illustration of an array of actuator elements similar to the array of FIG. 3A except that whereas in FIG. 3A, consecutive rows of individual moving elements or latches are respectively skewed so as to increase the number of actuator elements that can be packed into a given area, the rows in FIG. 17 are unskewed and typically comprise a rectangular array in which rows are mutually aligned.

FIG. 18 is an exploded view of an alternative embodiment of an array of actuator elements, including a layer 1810 of moving elements sandwiched between a top latching layer 1820 and a bottom latching layer 1830. The apparatus of FIG. 18 is characterized in that the cross-section of each actuator element is square rather than round. Each actuator element could also have any other cross-sectional shape such as a hexagon or triangle.

FIG. 19 is an isometric array of actuators supported within a support frame providing an active area which is the sum of the active areas of the individual actuator arrays. In other words, in FIG. 19, instead of a single one actuating device, a plurality of actuating devices is provided. The devices need not be identical and can each have different characteristics such as but not limited to different clock frequencies, different actuator element sizes and different displacements. The devices may or may not share components such as but not limited to coils 40 and/or magnetic field controllers 30 and/or latch controller 50.

The term “active area” refers to the sum of cross-sectional areas of all actuator elements in each array. It is appreciated that generally, the range of sound volume (or, for a general actuator other than a speaker, the gain) which can be produced by a speaker constructed and operative in accordance with a preferred embodiment of the present invention is often limited by the active area. Furthermore, the resolution of sound volume which can be produced is proportional to the number of actuator elements provided, which again is often limited by the active area. Typically, there is a practical limit to the size of each actuator array e.g. if each actuator array resides on a wafer.

If the speaker is to serve as a headphone, only a relatively small range of sound volume need be provided. Home speakers typically require an intermediate sound volume range whereas public address speakers typically have a large sound volume range, e.g. their maximal volume may be 120 dB. Speaker applications also differ in the amount of physical space available for the speaker. Finally, the resolution of sound volume for a particular application is determined by the desired sound quality. e.g. cell phones typically do not require high sound quality, however space is limited.

According to certain embodiments of the present invention, layers of magnets on the moving elements may be magnetized so as to be polarized in directions other than the direction of movement of the element to achieve a maximum force along the electromagnetic field gradient aligned with the desired element moving direction.

Referring again to FIGS. 12A-15B inter alia, it is appreciated that if the coil used is of a design that utilizes conductors carrying current on both sides of the elements, and the magnets are all polarized in the same direction, then the elements on one side of each conductor would move in opposite directions when current flows in the coil.

A particular feature of a preferred embodiment of the present invention is that the stroke of motion performed by the moving elements is relatively long because the field applied thereto is magnetic hence decays at a rate which is inversely proportional to the distance between the moving elements and the current producing the magnetic field. In contrast, an electrostatic field decays at a rate which is inversely proportional to the square of the distance between the moving elements and the electric charge producing the electrostatic field. As a result of the long stroke achieved by the moving elements, the velocity achieved thereby is increased hence the loudness that can be achieved increases because the air pressure generated by the high velocity motion of the moving elements is increased.

It is appreciated that the embodiments specifically illustrated herein are not intended to be limiting e.g. in the sense that the moving elements need not all be the same size, the groups of moving elements, or individual moving elements if actuated individually, need not operate at the same resonance nor with the same clock, and the moving elements need not have the same amplitude of displacement.

The speaker devices shown and described herein are typically operative to generate a sound whose intensity corresponds to intensity values coded into an input digital signal. Any suitable protocol may be employed to generate the input digital signal such as but not limited to PCM or PWM (SACD) protocols. Alternatively or in addition the device may support compressed digital protocols such as ADPCM, MP3, AAC, or AC3 in which case a decoder typically coverts the compressed signal into an uncompressed form such as PCM.

Design of digital loudspeakers in accordance with any of the embodiments shown and described herein may be facilitated by application-specific computer modeling and simulations. Loudness computations may be performed conventionally, e.g. using fluid dynamic finite-element computer modeling and empiric experimentation.

Generally, as more speaker elements (moving elements) are provided, the dynamic range (difference between the loudest and softest volumes that can be produced) becomes wider, the distortion (the less the sound resembles the input signal) becomes smaller and the frequency range becomes wider. On the other hand, if less speaker elements are provided, the apparatus is smaller and less costly.

Generally, if the moving elements have large diameters, the ratio between active and inactive areas (the fill factor) improves, and there is less stress on the flexures if any, assuming that the vibration displacement remains the same, which translates into longer life expectancy for the equipment. On the other hand, if the moving elements have small diameters, more elements are provided per unit area, and due to the lesser mass, less current is required in the coil or other electromagnetic force generator, translating into lower power requirements.

Generally, if the vibration displacement of the moving elements is large, more volume is produced by an array of a given size, whereas if the same quantity is small, there is less stress on the flexures, if any, and the power requirements are lower.

Generally, if the sample rate is high, the highest producible frequency is high and the audible noise is reduced. On the other hand, if the sample rate is low, accelerations, forces, stress on flexures if any and power requirements are lower.

Three examples of application-specific speakers are now described.

Example 1

It may be desired to manufacture a mobile phone speaker which is very small, is low cost, is loud enough to be heard ringing in the next room, but has only modest sound quality. The desired small size and cost suggest a speaker with relatively small area, such as up to 300 $mm^2$. If a relatively high target maximal loudness such as 90 dB SPL is desired, this suggests large displacement. Acceptable distortion levels (10%) and dynamic range (60 dB) in mobile phone speakers dictate a minimal array size of 1000 elements (computed using: $M=10^{(60/20)}$). Therefore, a suitable speaker may comprise 1023 moving elements partitioned into 10 binary groups, each occupying an area of about 0.3 $mm^2$. The cell size would therefore be about 550 μm×550 μm.

For practical reasons, the largest moving element that fits this space may have a diameter of 450 μm. Reasonable displacement for such a moving element may be about 150 μm PTP (peak to peak) which enables the target loudness to be achieved. The sample rate may be low, e.g. 32 KHz, since mobile phones sound is limited by the cellular channel to 4 KHz.

Example 2

It may be desired to manufacture high fidelity headphones having very high sound quality (highest possible) and very low noise, and which are additionally small enough to be worn comfortably, and finally, cost-effective to the extent possible.

To achieve high sound quality, wide dynamic range (at least 96 dB), wide frequency range (20 Hz-20 KHz) and very low distortion (<0.1%) may be used. The minimal number of elements may be, given these assumptions, 63000. So, for example, the speaker may have 65535 elements divided into 16 binary groups. Maximal loudness can be kept low (80 dB) so as to allow displacements of about 50 μm PTP. The smallest moving element capable of such displacements is about 150 μm in diameter. Such an element may occupy a cell of 200 μm×200 μm or 0.04 $mm^2$ such that 65535 elements fit into an area of 2621 $mm^2$ e.g. 52 mm×52 mm. The sample rate is typically at least twice the highest frequency the speaker is meant to produce, or 40 KHz. The closest standard sample rate is 44.1 KHz.

Example 3

It may be desired to manufacture a public address speaker, e.g. for a dance club, which is very loud, has a wide frequency range, extends to very low frequencies, and has low distortion. Therefore, PA speakers typically have many large moving elements. 600 μm moving elements may be used, which are capable of displacements of 200 μm PTP. Such elements occupy cells of 750 μm×750 μm or 0.5625 $mm^2$. Due to the low frequency requirement, a minimum of 262143 moving elements, partitioned into 18 binary groups, may be used. The size of the speaker may be about 40 cm×40 cm. This speaker typically reaches maximal loudness levels of 120 dB SPL and extends down to 15 Hz.

Reference is now made generally to FIGS. 20-23 which describe a preferred system for achieving volume control for a desired sound stream using a direct digital speaker such as any of those shown herein in FIGS. 1A-19 or such as a conventional direct digital speaker which may, for example comprise that shown and described in U.S. Pat. No. 6,403,995 to David Thomas, assigned to Texas Instruments and issued 11 Jun. 2002, or in Diamond Brett M., et al, "Digital sound reconstruction using array of CMOS-MEMS micro-speakers", Transducers '03, The 12$^{th}$ International Conference on Solid State Sensors, Actuators and Microsystems, Boston, Jun. 8-12, 2003.

Unless specifically stated otherwise, as apparent from the following discussions, it is appreciated that throughout the specification discussions, utilizing terms such as, "processing", "computing", "selecting", "applying" "calculating", "determining", "generating", "generating", "producing", "providing", obtaining" or the like, refer to the action and/or processes of a computer or computing system, or processor, or logic or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may use terms such as, processor, computer, storage, database, apparatus, system, sub-system, module, unit, selector and device (in single or plural form) for performing the operations herein. This may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes/devices (or counterpart terms specified above) and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

A suitable DDS in accordance with certain embodiments of the invention is disclosed in U.S. 60\802,126 filed May 22, 2006 whose contents is incorporated by reference.

The description herein of volume control in a DDS is described in particular in the context of attaining flat frequency response. Note that the description below is not bound to a specific DDS but rather may be applicable to any DDS such as but not limited to those embodiments specifically shown and described above with reference to FIGS. 1A-19 or such as conventional DDS systems.

As will be explained in greater detail below, DDS may exhibit a frequency response slope different from the 12 dB/Octave of analog speakers. However, whereas in analog speakers the amplitude of the membrane compensates for the specified response, giving rise to a desired flat response of the speaker throughout its entire frequency range, such a neutralizing effect does not exist in a DDS. In certain embodiments of DDSs, the frequency response slope may be 6 dB/Octave.

Figure 20:
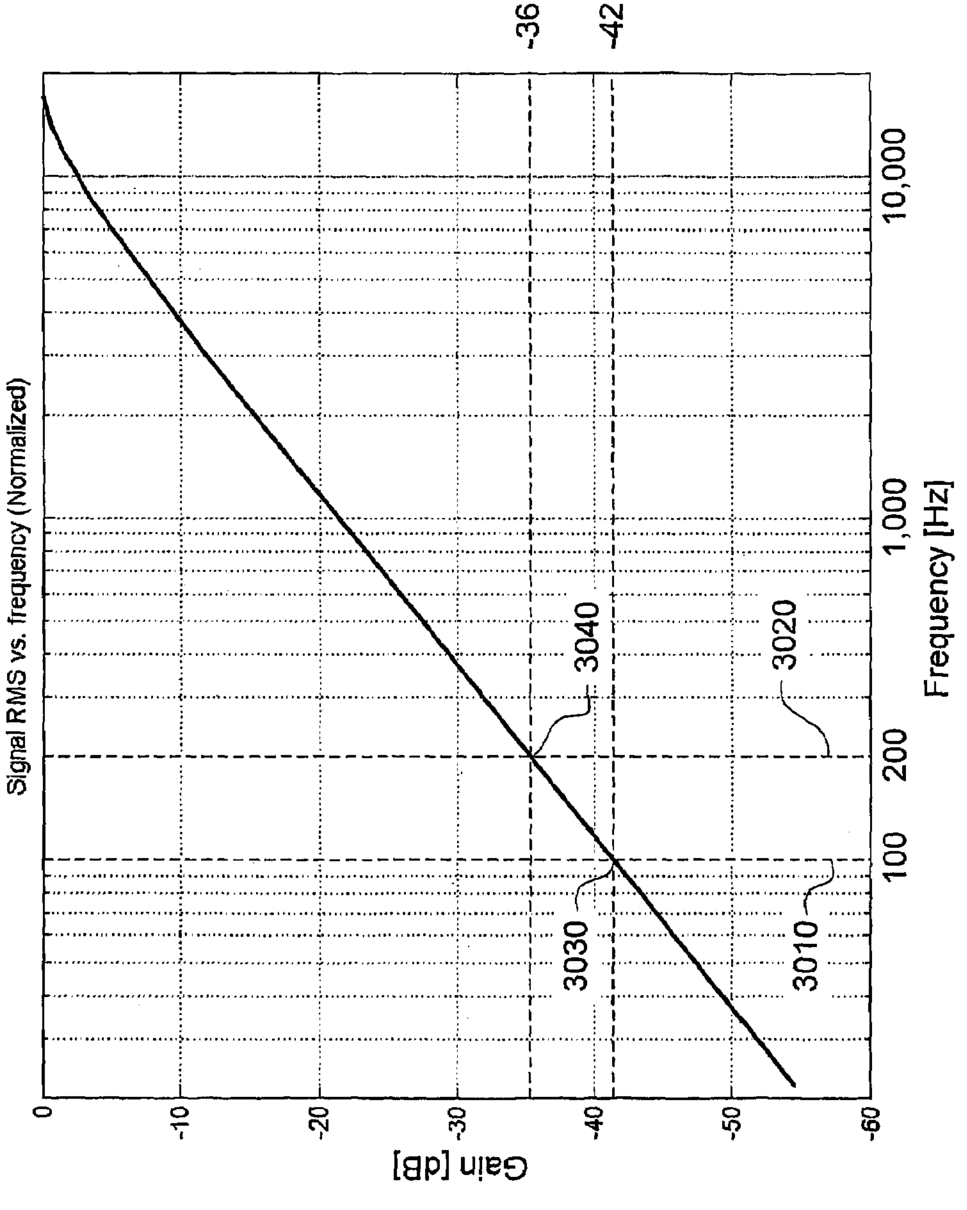
FIG. 20 illustrates an SPL vs. frequency graph, exhibiting 6 dB/octave frequency response which is typical to a DDS, in accordance with certain embodiments of the invention.

A 6 dB/Octave slope it is illustrated in FIG. 20 (showing Amplitude (ordinate) vs. frequency (abscissa)). As shown, doubling the frequency from 100 Hz to 200 Hz (3010, 3020) will result in a 6 dB amplitude increase (from −42 to −36—see 3030 and 3040 respectively). This 6 dB/octave gain is applicable throughout the entire frequency range of the DDS.

For a better understanding of the 6 dB/octave characteristics, attention is reverted to equations (1) and (2) above.

As may be recalled, in accordance with certain embodiments of the DDS, a coil surrounds the entire transducer array structure creating a magnetic field across the entire transducer array which causes any element with freedom of movement to travel according to the alternating direction of the field. The coil is driven with an alternating current of a fixed frequency $f_{CLK}$, say 44 KHz, or for example, as shown and described hereinabove with reference to FIG. 15C. The DDS may produce sounds of different pitches (22 KHz, 11 KHz and 4.4 KHz are examples provided in graphs II-IV respectively). Graph I shows the system clock which, in the illustrated example is 44 KHz. In the illustrated embodiment, the speaker used to generate these pitches has 2047 moving elements. When the 22 KHz sound (half of the clock) is generated, all 2047 elements change position (from top to bottom or vice versa) at each clock. When the 11 KHz (quarter of the clock) sound is generated, half of the 2047 moving elements change position at each clock. For example, if in the first clock all 2047 moving elements are in their top position, in the second clock, 1023 of these are lowered, in the third clock the remaining 1024 elements are lowered, in the fourth clock 1023 are raised, in the fifth clock the remaining 1024 elements are raised, and so forth. When the 4.4 KHz (1/10 of the clock) sound is generated, the numbers of elements which are in their top position at each clock (1340, 1852, . . . ) are shown on top of Graph IV whereas the numbers of elements which are in their bottom position at each clock (707, 195, . . . ) are shown on the bottom of Graph IV.

As described in further detail below, the frequency of the sound generated by the speaker is altered by changing the number of pressure producing elements movement over time, such that in each 23 μsec (=1/44000) time interval (referred to hereinafter as clock or clock interval) a given number of pressure producing elements move simultaneously. Note that altering the frequency of the generated sound signal does not affect the specified frequency $f_{CLK}$ which is maintained constant. Thus, for example, consider a situation wherein at a given clock interval all the micro speaker elements implement a 1-way stroke, i.e. move from the bottom position to the top position (due to effect of generated magnetic field at a given direction) and in the succeeding clock interval, the direction of the magnetic field is reversed imposing all the elements to implement a reverse stroke, namely to move a from the top position to the bottom position. The net effect is that all the pressure producing elements completed a reciprocating stroke cycle (from bottom to top and vise versa) within two clock intervals or 46 μsec in the current example, giving rise to a generated sound having a frequency of 22 KHz or $f_{CLK}/2$.

Now, assuming that it is desired to further divide the frequency of the generated sound into 4, the driving clock that is applied to the coil would retain constant ($f_{CLK}$), however the number of clock intervals will be changed from 2 to 4, (effecting also the number of elements that will move simultaneously per clock interval). More specifically, in the first clock interval half of the pressure producing elements will move from the bottom to the top position and in the succeeding (second) clock interval the remaining half will move from the bottom to the top position, thereby accomplishing a 1-way stroke of the entire array of pressure producing elements. Next, in the third clock pulse, half of the pressure producing elements will move from the top position to the bottom position and in the fourth clock interval the remaining half would move from the top to the bottom position, accomplishing the reciprocating stroke of the array within 4 clock intervals or 92 μsec, thereby generating the specified frequency of $f_{CLK}/4$ or 11 KHz. Note that the alternating signal applied to the coils was in both cases at frequency $f_{CLK}$.

Bearing this in mind, the frequency $f_{CLK}$ quoted in equation (1) is constant (and therefore does not affect the pressure P produced by each moving element) irrespective of frequency f of the generated sound. It is appreciated that insofar as analog speakers are concerned, this was not the case, namely f was altered in order to affect the frequency of the generated sound signal.

Reverting to DDSs, as may be recalled, equation (1) further quotes S standing for the vibrating piston surface area. Note that S in the context of DDS is the sum total surfaces of all the pressure producing elements that move simultaneously. In the example above, reducing the frequency by half did not affect the frequency $f_{CLK}$ however reduced S by half (because only half of the moving element of the array moved simultaneously during every clock interval). In other words, reducing the frequency by half results in a corresponding decrease of the surface area S (by a factor of 2) giving rise to a decrease in the pressure P by half (according to the specified equation (1)). Obviously, doubling the frequency f will result in increasing of S by a factor of 2 and consequently doubling the pressure P. To sum up, whereas in analog speaker doubling the frequency caused increase of the generated pressure P by a factor of 4 (disregarding for sake of discussion the compensating factor of the peak-to-peak amplitude A), in DDS the same increase of the frequency would result in an increase of the generated pressure by a factor of only 2.

As may be further recalled, in an analog speaker (again assuming, for sake of discussion, no compensating effect by the amplitude of the membrane A), the doubling of the frequency increased the pressure P by a factor of 4 which results (according to equation (2)) in an increase of the SPL by 12 dB, giving rise to a speaker frequency response of 12 dB/Octave. In a DDS, as was explained above, doubling the frequency results in corresponding doubling of the pressure P which in turn results in an increase in the generated SPL by 6 dB (compared to 12 dB in an analog speaker), giving rise to a speaker frequency response of 6 dB/Octave. Still further, in real life operational scenario of an analog speaker the membrane peak-to-peak movement (A) compensated for the 12 dB/Octave characteristics, bringing about the desired flat response. In contrast, in DDS such a compensating factor of the peak-to-peak movement of the micro-elements array typically does not exist, since each moving element moves through the channel in a full stroke (from bottom-to-top position and vice versa) irrespective of the generated frequency of the speaker, thereby maintaining A substantially constant for any frequency f.

Note that the invention is not bound by the specified structure and operational scenario of a DDS that is characterized by a 6 dB/octave frequency response.

In order to achieve the desired flat response in DDS, a known per se filter can be applied to the incoming digitally sampled signal to compensate for the frequency response of 6 dB/octave. The filter changes the amplitude of the input signal based on its frequency and the characteristics of the filter. In accordance with certain embodiments, such a filter should exhibit a frequency response of −6 dB/Octave, thereby maintaining substantially flat response (i.e. 0 dB/Octave) throughout the entire frequency range.

It is appreciated that in some embodiments of DDSs, a small delay is introduced into the controlling mechanism of the pressure producing elements to allow manipulation of the directionality of the DDS e.g. as described above with reference to FIGS. 11A-11C and FIGS. 15A-15B, and particularly FIG. 11C. Typically, such delay would subsequently influence the number of pressure producing elements operative at any given clock interval thus affecting the slope of the speaker. The slope of a DDS can therefore be different from 6 dB/Octave. If such may be the case, the slope of the filter is adjusted to match that of the DDS and having opposite sign thereof.

In accordance with certain embodiments the slope of the DDS is different than the specified 6 dB/Octave. For instance, in the case of an omni directional speaker (e.g. based on the embodiment of FIG. 11A as described herein, and/or based on known teachings pertaining to omni-directionality in speaker systems other than DDS systems), the specified slope is typically other than 6 dD/Octave, whereas for a uni-directional speaker the specified slope is typically 6 dD/Octave.

It is further appreciated that in certain embodiments flat frequency response may not be required, such as in the event of communication devices such as mobile phones. If such may be the case, the slope of the filter may be different from that of the DDS. For example, the slope of the DDS may be 9 dB/Octave and the slope of the filter −6 dB/Octave, substantially resulting in a system slope of 3 dB/Octave.

It is further appreciated that the filter described herein refers to any system, digital or analog, known in the art that is characterized by a non-flat frequency response, such as known per se equalizer or an amplifier or an attenuator or a plurality or a combination thereof etc.

A very common form of a filter exhibiting the required characteristics is known in the art as a Low Pass Filter, termed herein after as LPF. The transfer function of such LPF is typically characterized by a flat frequency response at sufficiently low frequencies and a sloped response at sufficiently high frequencies. The frequency at which the frequency response changes from flat to sloped is known in the art as the cutoff frequency of the filter and is typically termed $f_c$. In some cases, the filter exhibits as continuous transfer function and the slope changes gradually from flat to sloped, in which case, the cutoff frequency is typically defined as the frequency at which the magnitude drops to −3 dB compared to the maximal magnitude, which in the case of LPF is typically obtained at the flat portions of the transfer function.

It is appreciated that a system comprising a DDS combined with an LPF having a cutoff frequency $f_c$ will exhibit flat frequency response only beyond the cutoff frequency $f_c$. Below said cutoff frequency the filter has no effect on the frequency response of the system consequently resulting in a frequency response slope similar to that of the DDS itself, i.e. 6 dB/Octave.

For convenience of description, a volume control speaker device will be described with reference to a DDS of the kind described with reference to FIGS. 1A-19 above, however the invention is by no means bound to the use of the specified DDS and accordingly other suitable known types of DDS can be applicable.

Figure 21:
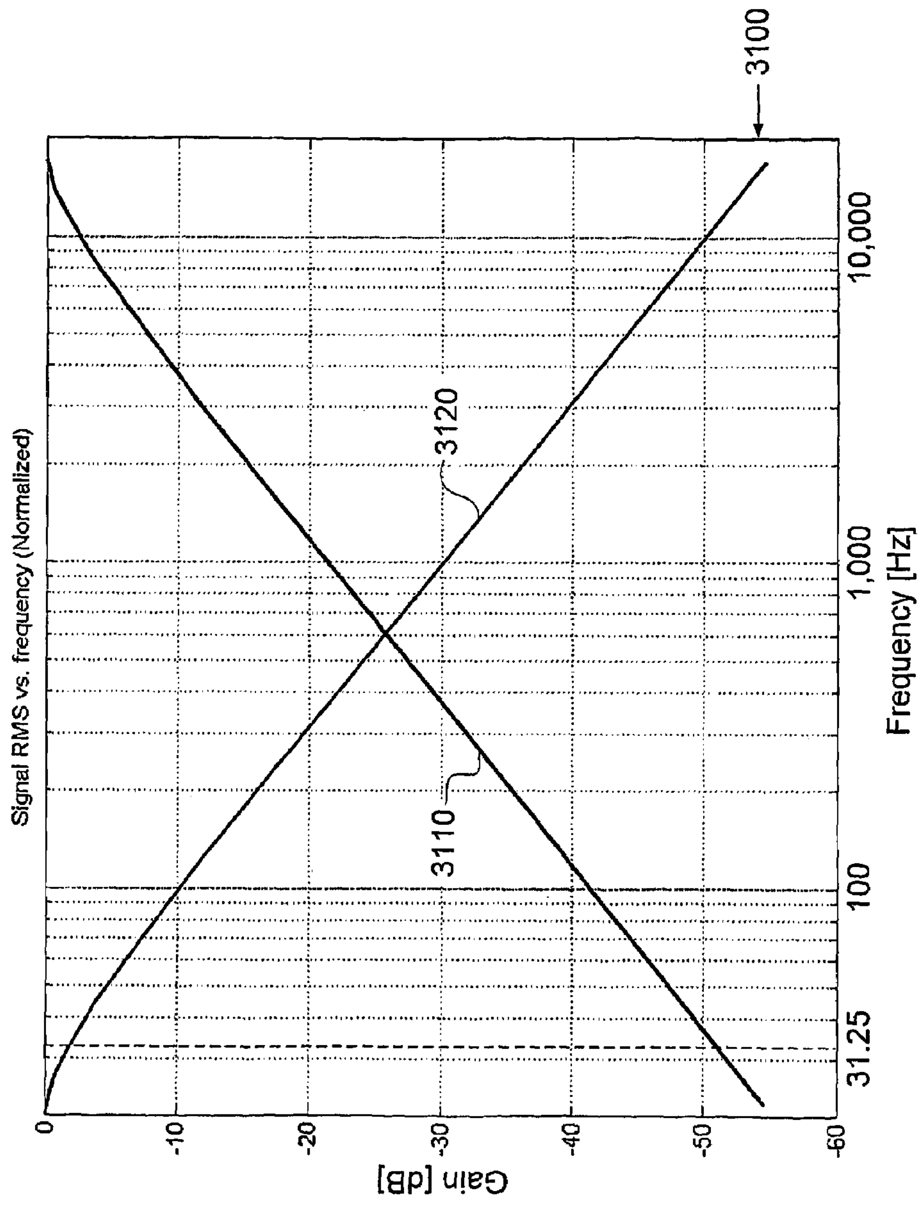
FIG. 21 illustrates a graph depicting a frequency response slope of a DDS and a corresponding frequency response slope of an attenuator, in accordance with certain embodiments of the invention.

Before turning to describe a general system architecture in accordance with various embodiments of the invention, attention is drawn to FIG. 21 illustrating a graph depicting a frequency response slope 3110 of 6 dB/octave (identical to that described with reference to FIG. 20) and a corresponding filter response slope 3120 of −6 dB/octave compensating for the specified frequency response and giving rise to the desired flat response throughout the entire frequency range.

Note that whilst, theoretically, applying an LPF with a frequency response of the kind depicted in FIG. 21 achieves the desired flat response of the speaker, this (as will be explained in greater detail below) is achieved at a significant penalty of an undue low SPL, which from the listener standpoint may be unacceptable. Thus, if the specified LPF should accomplish flat response throughout the entire audible frequency range, say form 20 Hz to 20 KHz or about 10 octaves, the LPF should be operative across a 60 dB range (as shown in the ordinate of graph 3100 indicating dB units from −60 to 0). Such a frequency response of the LPF indicates the filter cutoff frequency $f_c$ should be very low, i.e. 20 Hz or 31.25 Hz as shown in FIG. 21.

Generally speaking, since the generated SPL is directly proportional to the number of pressure producing elements that move simultaneously, it readily arises that in order to achieve a flat response, the filter typically dictates that a substantially identical number of pressure producing elements is to move (simultaneously) in any frequency (within the designated frequency range), e.g. as described above with reference to FIG. 15C.

The generated frequency of the DDS is determined by the number of clock intervals (cycles) it takes to a designated bank of moving element to complete a reciprocating stroke. By way of example, and as exemplified above, assuming that the array consists of n pressure producing elements, if at a given clock interval all the n pressure producing elements move from a bottom to top position and in a succeeding clock interval all the n pressure producing elements move from the top position to the bottom position, the generated frequency would be $f_{CLK}/2$ since the time required to achieve a reciprocating stroke of the moving element bank is two clock intervals (by this example, the bank consists of the entire n elements). Note that by this example a maximum SPL is attained since all the n pressure producing elements move simultaneously. As exemplified above, in order to divide the frequency ($f_{CLK}/4$), the array is configured to complete a reciprocating stroke in four clock intervals (instead of two). Thus, in a first interval, n/2 pressure producing elements are moved from bottom to top position and in a second interval the other n/2 pressure producing elements are moved from bottom to top position, completing a one way stroke of all n pressure producing elements array. Similarly, in a third interval n/2 pressure producing elements are moved from the top to bottom position and in the fourth cycle the other n/2 pressure producing elements are moved from top to bottom position, completing the reciprocating stroke of all the pressure producing elements array. Note that, by this example, the SPL generated for the $f_{CLK}/4$ frequency was half than that generated for the $f_{CLK}/2$ frequency, since in the former n/2 elements move simultaneously whereas in the latter n elements move simultaneously. Note that such speaker specification would not meet the desired flat response (maintaining substantial identical SPL for all frequencies). Moving on with this example, one possible manner to achieve the desired flat response is to utilize (for the higher $f_{CLK}/2$ frequency) only n/2 elements rather than the entire n elements. Thus, in the first interval n/2 elements (instead of n) move from the bottom to the top position and in the succeeding cycle the same n/2 elements move from the top to the bottom position completing the reciprocating stroke in two cycles (thus achieving frequency $f_{CLK}/2$), however generating an SPL which corresponds to a travel of n/2 elements exactly as in the case of the specified $f_{CLK}/4$ frequency, thereby achieving the desired flat response.

It is appreciated that an example of a latching method for latching a selected number of pressure producing elements, as prescribed for example by the LPF, is described herein with reference to FIG. 15C.

Having exemplified how to generate $f_{CLK}/2$ and $f_{CLK}/4$ frequencies, it readily arises that generating lower frequencies requires dividing the moving element bank into smaller subsets such that the number of clock intervals required to complete a reciprocating stroke is inversely proportionate to the desired generated frequency. The lowest possible frequency generated by the DDS (termed hereinafter $f_{MIN}$) would require moving one element in every clock interval giving rise to n clock intervals to move the entire n elements bank from a bottom to top position and another n clock intervals to move the n elements from the top to the bottom position, giving rise to a time duration T=2·n for completing a reciprocating stroke of the bank of pressure producing elements. Obviously, by this example, the generated SPL is very low, since in each clock interval only 1 moving element is moving.

To sum up, the higher the generated frequency, the more elements move per clock interval. Accordingly, the higher the selected $f_c$ (namely higher cutoff frequency), the higher the resulting SPL.

Figure 22A:
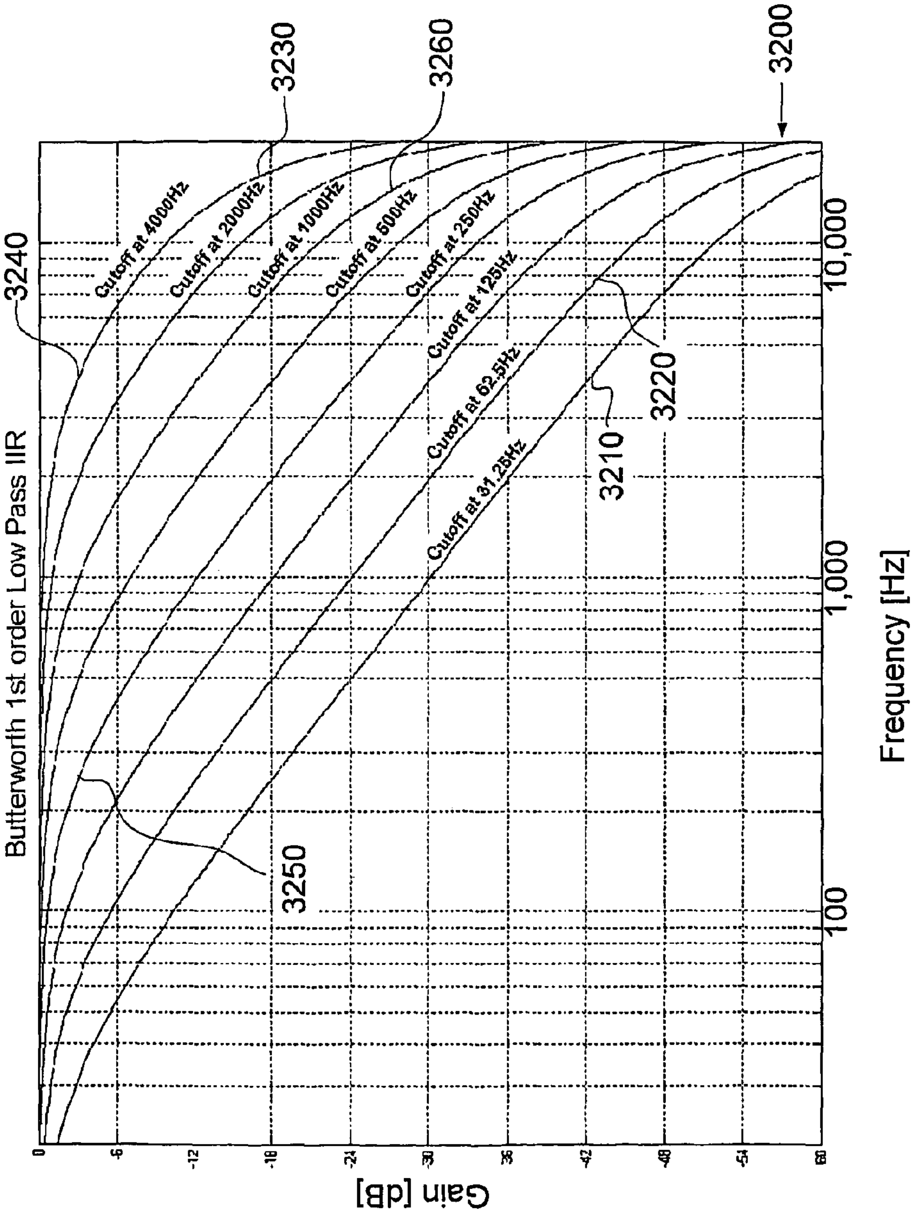
FIGS. 22A-22B illustrate a set of filters having different cutoff frequencies for use in a system in accordance with certain embodiments of the invention.

Attention is now drawn to FIG. 22A, illustrating a set of LPFs 3200 having different cutoff frequencies, for use in a system in accordance with certain embodiments of the invention. The abscissa represents the generated frequency and the ordinate the accomplished gain (in dB). As shown, few LPF slopes are depicted with an ever increasing cutoff frequency. Note that for convenience of description, FIG. 22A depicts a set of LFPs extending from 31.25 Hz cutoff frequency (3210) to 4000 Hz cutoff frequency 3230. This is of course an example only and the set of LPFs can be selected statically or dynamically, depending upon the particular applications, for example within the specified range of 20 Hz to 20 KHz.

Bearing this in mind, slope 3210 has a cutoff frequency of 31.25 Hz and therefore a desired −6 dB/octave attenuation is achieved at any frequency that exceeds 31.25 Hz. The next slope 3220 has a cutoff frequency of 62.5 Hz and therefore a desired −6 dB/octave attenuation is achieved at any frequency that exceeds 62.5 Hz. Additional slopes are illustrated for cutoff frequencies 125, 250, 500, 1000, 2000 and 4000 Hz, respectively (the latter bearing reference numeral 3230). Focusing on slope 3230, It is readily shown that below the cutoff frequency (3240), no attenuation is achieved. Thus, for example, if the LPF 3230 is used for a given frequency, say 1000 Hz, then doubling the frequency (to 2000 Hz), would increase the generated SPL by 6 dB, and the specified LPF (being inactive below 4000 Hz) would not compensate for this SPL increase, since the specified frequency is below the cutoff frequency of filter 3230. In contrast, and as explained in detail above, any change in the frequency (above the cutoff frequency) would not affect the generated SPL due to the compensating effect of the filter.

Figure 22B:
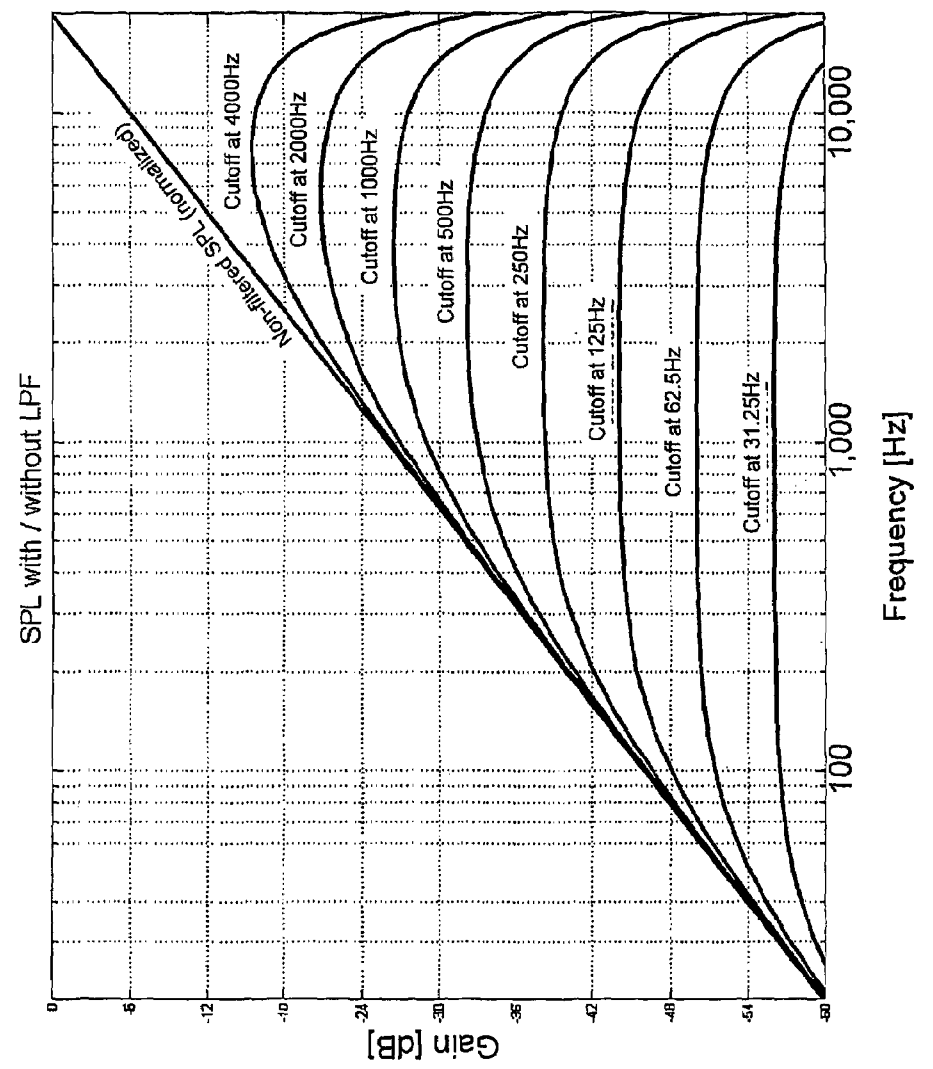

FIG. 22B illustrates the frequency response of the combined LPF and DDS, for several different cutoff frequencies. It is appreciated that for each of the LPFs, the combined frequency response exhibits a sloped portion, below the cutoff frequency and a substantially flat, constant portion above the cutoff frequency. It is further appreciated that the higher the cutoff frequency, the narrower the flat portion of the frequency response, thus the narrower the frequency range of the speaker. However, the higher the cutoff frequency, the higher the SPL of the constant portion of the frequency response.

More specifically, in certain embodiments, it may be desirable to change the properties of the speaker at different use cases. Such may be the case of a DDS disposed inside a mobile phone. The speaker of the mobile phone may have more than one purpose. It may, for example, be used at certain time to generate the ringtone, while at different times it may be used to reproduce the voice of the talker in "speakerphone" or "hands-free" mode. In the former case, the DDS is required to reproduce frequencies ranging from 350 Hz upwards at relatively low SPL levels (i.e. 86 dB), whereas in the latter a significantly louder SPL is required (i.e. 95 dB) whereas the frequency range if of lower importance. Therefore, in the first case, the cutoff frequency of the LPF would be selected to be 350 Hz while in the second case, it would be selected to be 1000 Hz, allowing the flat portion of the frequency response to reach maximum SPL, 9 dB higher than before.

Figure 23:
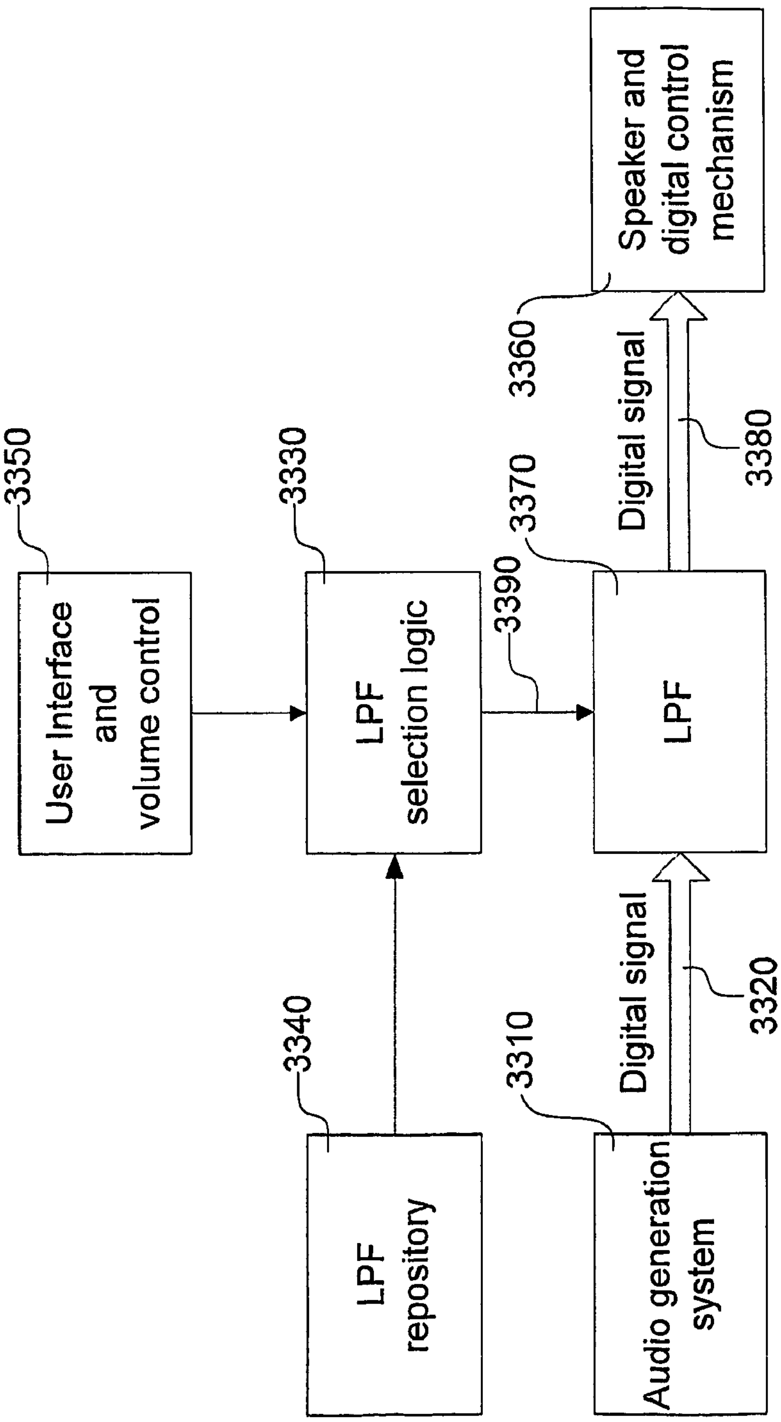
FIG. 23 illustrates a general system architecture, in accordance with certain embodiments of the invention.

Attention is now drawn to FIG. 23, illustrating a general system architecture in accordance with an embodiment of the invention. As shown, the system 3300 includes a known per se digital audio generation system 3310 fitted in say, a CD player, television system, cellular telephone system, etc. The generated digital audio signal 3320 is fed to a DDS volume control system that includes an LPF 3370, an LPF selection logic 3330 coupled to an LPF repository 3340. As will be explained in greater detail below, the LPF 3370 applies filtering to the digital signal 3320 according to LPF characteristics that are selected by the selection logic 3330 and extracted from the LPF repository 3340. Note that the digital signal 3320 that is fed to the LPF may be subjected to known per se pre-processing, such as sample-rate converters, equalizers, dynamic range compressors/expanders, sound-effect generators, echo-cancellers etc. The pre-processing may be implemented for example by DSP 810 of FIG. 8C which may perform one, some or all of these pre-processing operations between re-sampling stage 814 and scaling stage 815 of FIG. 8B.

The LPF repository 3240 is an example of a module for generating or providing at least two filters (see for example those depicted in FIG. 22), each having a distinct cutoff frequency such that each filter exhibits substantially no attenuation below its cutoff frequency and an attenuation slope that corresponds to said frequency response slope of the speaker above said filter's cutoff frequency. In typical applications, well known in the art, the LPF may be implemented in the form of a digital IIR or FIR filter (Infinite or Finite Impulse Response respectively). The frequency response of such filters is determined by a set of filter coefficients. If such is the case the filter selection logic 3330 typically determines which filter coefficient set needs to be used, retrieves the selected coefficient set from the filter repository 3340 and transfers, at block 3390, the coefficient set to the LPF 3370.

Note that in accordance with certain embodiments, the LPF characteristics, e.g. the coefficient sets, are generated by an external device and stored in repository 3340 which will provide the data to the LPF selection logic 3330. In accordance with certain embodiments, the specified characteristics are generated in the repository 3340 and provided thereby to the LPF selection logic 3330.

By way of non limiting example the extracted LPF characteristics match an LPF slopes of the kind depicted in FIG. 23. The extracted LPF has a given cutoff frequency and it will facilitate to maintain substantially a constant SPL (within designated frequency range), according to the general concept that the higher the cutoff frequency the higher the so obtained SPL (across the entire frequency range), all as explained in detail above.

The DDS volume control includes in accordance with certain embodiments an LPF selection logic 3330 being configured to select at least one of said filters (e.g LPF characteristics from repository 3340) according to a selection criterion that depends, in accordance with certain embodiments, on at least a desired volume and frequency of the generated sound. Having selected a given LPF, it is applied to the digital input signal by the LPF 3370. The specified volume may be controlled, e.g. by a user interface or volume control 3350 for increasing or decreasing the volume. The interface 3350 may include for example, a knob controlled by the user. In other embodiments, volume control signals may be provided by an external device or application automatically, without user intervention. Such may be the case of the mobile phone described in the example above, wherein the volume control signals are provided by the mobile phone controlling circuits, based on whether the phone is used in "speakerphone" mode or to produce ringtones. The control mechanism 3330 receives the volume control input from interface 3350 and selects an appropriate LPF, thereby achieving a filtered digital signal 3380 for maintaining substantially the same SPL, so long as the frequency produced is higher than the cutoff frequency of the speaker. The so filtered signal 3380 is fed to a DDS that includes a DDS controller 3360 and is processed e.g. in accordance with the stages 815 and onwards described with reference to FIG. 8B, and fed to the speakers mechanism (e.g. transducer array) for generating the desired sound.

It is appreciated that the LPF repository 3240 may, in certain embodiments, prepare the LPF in real time and in other embodiments merely store a ready-made set of LPFs. Consider, for example, in the specified example of speaker phone mode and ring tone mode. The appropriate filters can be applied in real time to the input signal (whether it is indicative of ring tone or human voice) by the specified logic in the manner described above. In accordance with certain embodiments at least one of the filters is applied in real time whereas at least one other filter is pre-processed and applied not in real time. Thus, for example, in the case of human voice the filter is applied in real time in the manner specified. However, the ring tone (whose "contents" is known in advance) can be pre-processed, say in the recording studio by selecting the appropriate filter and applying it to the ring tone and the already filtered signal is fed to the cellular telephone. Thus, when appropriate ring tone sound should be activated, the already pre-processed signal is fed to the speaker. Note that in this case the selection logic is in fact split, where one component thereof resides in the recording studio (for selecting the filter that corresponds to the ring tone) and the other filter (applicable for the speaker mode) resides in the telephone.

Obviously depending amongst the other on the nature of the input signal, at least two of the filters may be selected and or applied in a pre-processed fashion.

The invention is not bound to the exemplary stages (telephone and recording studio), and accordingly the selection and/or application of the filters may be utilized in two or more stages of the process.

The invention is likewise not bound by the specified example of cellular telephone and/or the specified ring tone/speaker modes.

It is appreciated that according to a preferred embodiment of the present invention, the teachings of FIGS. 1A and 23 may be combined so as to provide an integrated speaker system in which, typically, the latch controller 50 of FIG. 1A comprises units 3330, 3340, 3350, 3360 and 3370 of FIG. 23 and the input signal in FIG. 1A is generated by the audio generation system 3310 of FIG. 23. In this embodiment, the speaker and digital control mechanism 3360 may be constructed and operative in accordance with any of the teachings of FIGS. 1A-19 whereas blocks 3330, 3340, 3350 and 3370 may be constructed and operative in accordance with any of the teachings of FIGS. 20-23. In accordance with certain embodiments, the DDS may comprise any of the embodiments shown and described above with reference to any of FIGS. 1A-19.

Reverting to FIG. 23, a possible selection criterion is determined according to the specified application. In certain embodiments, an AGC (Automatic Gain Control) mechanism may be used to ensure the SPL of the DDS remains substantially equal regardless of the changes in the volume of the input signal. In this case, the AGC mechanism automatically selects, in a known per se manner, an LPF that matches the desired volume level and the volume of the input signal.

Consider, for example, a cellular telephone application. As known in the art, the current analog speakers exhibit degraded performance due to the physical constrains of the cellular telephone unit which prescribes use of an analog speaker of relatively small size. The small dimension of the analog speaker (fitted in the cellular telephone unit) and the inherently limited vibration amplitude thereof result in a narrow frequency response and in relatively poor performance of the speaker in particular at low frequencies (such as the lower registers of the human voice).

Thus, for example, a human voice that is transmitted from a caller's cellular telephone and is reconstructed at the receiver's unit. The voice's frequency component below 1000 Hz, is either completely truncated or drastically distorted and diminished to a very low SPL compared to higher frequency component. The net effect is, thus, as is well known to the common user of a cellular telephone unit, a degraded quality of the reconstructed voice signal. Even at higher frequencies, the SPL of the generated audio signal is in many cases of insufficient intensity.

As will be explained in detail below, the specified disadvantage is coped with utilizing various embodiments of the invention. Thus, in accordance with certain embodiments of the invention, a DDS with the specified digital volume control is utilized. The LPF selection logic 3330 may employ a criterion (out of many possible criteria) for selecting a desired LPF. For instance, the criterion may depend on at least one of (i) desired generated SPL, (ii) the desired frequency range of the generated sound, (iii) the spectrum of the input signal and (iv) the gain thereof.

Consider, for example, a human voice which, as specified above, is characterized also by low frequency components. When a call is received or dialed out and while the voice channel is active, the controlling circuits of the cellular phone indicate to the selection logic 3330 that an LPF with a low cutoff frequency, is required (say 250 Hz of filter 3250). The utilization of such an LPF will facilitate a desired flat response for any of the frequencies within the frequency range of the human voice (starting below the lower range thereof of 350 Hz). Obviously, selecting an LPF with lower cutoff frequency achieves the desired flat response, however, at a penalty that a lower SPL is attained compared to the SPL that would have been generated had an LPF with higher cutoff frequency been selected, which seemingly appears to be a disadvantage. However, more importantly, the generated SPL using the specified (low cutoff) LPF would be considerably higher for any given frequency compared to a corresponding SPL that would have been generated for the same frequency had a conventional analog speaker been used. The reason is that the maximal generated SPL for a high frequency (using an analog speaker) will drop by a steep attenuation response (−12 dB/octave) once the analog speaker has reached its maximal amplitude at the low frequency region. In contrast, in a DDS, the maximal SPL for the high frequency will drop by a more moderate slope of only −6 dB/octave (in accordance with certain embodiments), giving rise to higher generated SPL in the specified low frequencies.

The net effect would then be that in accordance with certain embodiments, the DDS would exhibit higher SPL at any frequency, compared to an analog speaker, whilst maintaining the desired flat response throughout the entire frequency range (when LPF is used) including at low frequencies.

Having exemplified a selection of an LPF with low cutoff frequency for a given application (namely cellular telephone, for reconstructing human voice having low frequency (bass) voice components), there follows another example for selection of an LPF using a desired SPL and desired frequency range criterion. Thus, reverting to the cellular telephone application, in the case that a desired generated sound is a ringtone (rather than a human voice) i.e. the cellular phone controlling circuits detect an incoming call, the ringtone is normally characterized by higher frequency component and less significant low frequency component. In addition, in many applications, it is desired to have high volume ringtone, allowing the cellular telephone owner to hear rings, e.g. even if the telephone is placed inside a bag. This scenario would impose in certain embodiments a selection of LPF with higher cutoff frequencies, maintaining the specified flat response at higher frequencies, of say 1000 Hz cutoff or 95 dB SPL (3260 in FIG. 22A). Naturally, and as explained in detail above, the higher the cutoff frequency the higher the attainable SPL meeting thus the requirement of high SPL for the generated ringtone.

Another example would be DDS used in home theater applications. When the system is used to show a documentary film, the frequency range may be limited to that of human voice thus a 350 Hz LPF may be used. When the same system is required to play classical music, a much wider frequency range is required and a suitable LPF (i.e. one with cutoff of 20 Hz) would be selected.

Those versed in the art will readily appreciate that the invention is not bound by using the specified SPL and frequency range criterion and, likewise, not bound by the specified specific examples.

Those versed in the art will readily appreciate that the DDS volume control can be an external device coupled to the speaker or in accordance with certain other embodiments integrated with the DDS. It is also appreciated that the DDS volume control may be applied to the signal before hand, providing a readily filtered audio content, in which case the content, e.g. a song recorded on a compact disk, is ready for use with DDS type speakers and no further filtration is required.

In accordance with certain embodiments Infinite Impulse Response (IIR) type filters is used as the LPF. In accordance with certain other embodiments Finite Input Response (FIR) type filters are used as LPF. These are only few out of many possible examples of using LPF in accordance with certain embodiments of the invention. Selecting the filter type may be in accordance with performance requirements and available computing resources, all as known per se. It is appreciated that in certain embodiments, a combination of different types of filters, e.g. FIR and IIR, may be used to meet certain requirements of quality, accuracy and computation complexity. For example, FIR filters are typically more stable, less sensitive to rounding errors and produce less phase distortion than IIR filters. However, FIR filters require significantly more computational resources e.g. memory and computing speed than IIR filters. In certain embodiments, IIR filters may be used at certain conditions and FIR filters at others. For example, to produce a ringtone, the cell phone processing unit may be partially engaged in decoding an MP3 file or in synthesizing a MIDI file, thus allocating fewer resources for the volume control mechanism of the present invention. If such is the case, IIR filter may be employed. However, during voice conversation, the load on the cell phone processing unit is significantly lower, allowing higher allocation of computing resources to the volume control, thus allowing the use of a generally higher quality FIR filter. In such embodiments, the filter repository 3340 may store, for example, both FIR and IIR filter coefficients and the volume control interface 3350 may indicates to the LPF selection logic 3330 what type of filter is required.

Those versed in the art will readily appreciate that there is no need for Digital to Analog (D/A) converters (DAC) in the system architecture of DDS. In contrast to DDS, such a DAC is an essential component in analog speakers.

The description above focused on accomplishing a flat response, i.e. substantially constant SPL throughout the entire frequency range. Obviously, this refers to a situation that the listener would prefer to maintain the same SPL for any generated frequency. In accordance with certain embodiments, the user can selectively adjust the volume (increase or decrease) to achieve a desired SPL. Thus, by way of example, a digital gain technique can be implemented within a known per se digital signal control system.

In accordance with certain embodiments, the volume control is achieved by multiplying the input signal (that is fed, for instance, to the LPF module 3370) by a given constant. For instance, if it is desired to double the volume intensity then the input signal is multiplied by the constant value 2. In accordance with certain embodiments, the signal intensity can be scaled down (for decreasing volume) by −6 dB steps (equivalent to dividing the volume in two at every step), or up (for increasing volume) by 6 dB steps (equivalent to doubling the volume at every step) using a shift operation, namely right shift for decreasing the volume and left shift for increasing the volume. For instance, a right shift by n locations would result in decreasing the volume intensity by a factor of $2^n$. Similarly, a left shift by n locations would result in increasing the volume intensity by a factor of $2^n$.

It is appreciated that the electromagnetic field controller 30 is preferably designed to ensure that the alternating current flowing through the coil maintains appropriate magnetic field strength at all times and under all conditions so as to allow sufficient proximity between the moving elements 10 and the electrostatic latches 20 to enable latching, while preventing the moving elements 10 from moving too fast and damaging themselves or the latches 20 as a result of impact.

With specific reference to the Figures, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Features of the present invention which are described in the context of separate embodiments may also be provided in combination in a single embodiment. Conversely, features of the invention which are described for brevity in the context of a single embodiment may be provided separately or in any suitable subcombination. For example, moving elements may be free floating, or may be mounted on filament-like flexures or may have a surrounding portion formed of a flexible material. Independently of this, the apparatus may or may not be configured to reduce air leakage therethrough as described above. Independently of all this, the moving element may for example comprise a conductor, coil, ring- or disc-shaped permanent magnet, or ring- or disc-shaped ferromagnet and the magnets, if provided, may or may not be arranged such that the poles of some e.g. 50% thereof are oppositely disposed to the poles of the remaining e.g. 50% of the magnets. Independently of all this, the latch shape may, in cross-section, be solid, annular, perforated with or without a large central portion, or notched or have any other suitable configuration. Independently of all this, control of latches may be individual or by groups or any combination thereof. Independently of all this, there may be one or more arrays of actuator elements which each may or may not be skewed and the cross-section of each actuator element may be circular, square, triangular, hexagonal or any other suitable shape. Independently of this, pressure producing elements may comprise the moving elements described above with reference to FIGS. 1A-19 and conversely, when moving elements are referred to specifically, they may where appropriate be replaced by any other type of pressure producing element.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

The present invention has been described with a certain degree of particularity but those versed in the art will readily appreciate that various alterations and modifications may be carried out, without departing from the scope of the following

The invention claimed is:

1. A system that includes a direct digital speaker volume control device configured to be coupled to a direct digital speaker; the direct digital speaker comprising a plurality of pressure producing elements being adapted to generate a sound at a sound pressure level (SPL) and at a given frequency in response to an input signal, without using digital to analog converter; the direct digital speaker inherently exhibiting a frequency response throughout its entire frequency range; the direct digital speaker volume control device comprising:

a. a module for providing at least two filters each having a distinct cutoff frequency such that each filter exhibits substantially no attenuation below its cutoff frequency and an attenuation response above said filter's cutoff frequency; and b. a selector for selecting at least one of said filters according to a selection criterion that depends on at least a desired volume and frequency of generated sound, and applying said filter to said input signal for generating a filtered signal that is configured to be fed to said speaker.

2. The system according to claim 1, wherein at least one of said filters exhibits an attenuation response above said filter's cutoff frequency that corresponds to said frequency response of the speaker.

3. The system according to claim 2, wherein at least one of said filters exhibits an attenuation response above said filter's cutoff frequency that corresponds to said frequency response of the speaker, such that the speaker exhibits flat response substantially across its entire designated frequency range.

4. The system according to claim 1, wherein said frequency response of the speaker being substantially 6 dB/octave across its frequency range, and wherein each one of said filters exhibits an attenuation response of −6 dB/octave response throughout a frequency range that exceeds said cut-off operational frequency and substantially no attenuation below said cut-off operational frequency.

5. The system according to claim 1, wherein at least one of said filters being Low Pass Filter (LPF).

6. The system according to claim 5, wherein at least one of said LPFs being an IIR type filter.

7. The system according to claim 5, wherein at least one of said LPFs being an FIR type filter.

8. The system according to claim 1, wherein said direct digital speaker volume control device includes a volume control module for adjusting the SPL of the generated sound.

9. The system according to claim 1, wherein said selection criterion depends on at least one of (i) desired generated SPL, (ii) desired frequency range of the generated sound, (iii) spectrum of the input signal and (iv) a gain of the input signal.

10. A direct digital speaker comprising a plurality of pressure producing elements being adapted to generate a sound at a sound pressure level (SPL) and at a given frequency in response to an input signal, without using digital to analog converter; the direct digital speaker inherently exhibiting a frequency response throughout its entire frequency range; the direct digital speaker includes a direct digital speaker volume control device, comprising:

a. a module for providing at least two filters each having a distinct cutoff frequency such that each filter exhibits substantially no attenuation below its cutoff frequency and an attenuation response above said filter's cutoff frequency; and b. a selector for selecting at least one of said filters according to a selection criterion that depends on at least a desired volume and frequency of generated sound, and applying said filter to said input signal for generating a filtered signal that is configured to be fed to said speaker.

11. A speaker system for generating sound, at least one attribute of sound generated thereby corresponding to at least one characteristic of the input digital signal which is sampled periodically in accordance with a clock, the system comprising at least one actuator device, each actuating device including:

an array of moving elements, wherein each individual moving element is responsive to alternating magnetic fields and is constrained to travel alternately back and forth along a respective axis responsive to an electromagnetic force operative thereupon when in the presence of an alternating magnetic field;

at least one latch operative to selectively latch at least one subset of said moving elements in at least one latching position thereby to prevent said individual moving elements from responding to said electromagnetic force;

a magnetic field control system operative to receive the clock and, accordingly, to control application of said electromagnetic force to said array of moving elements; and a latch controller operative to receive said digital input signal and to control said at least one latch accordingly, wherein said latch controller is associated with the direct digital speaker volume control device of claim 1.

12. A speaker system for generating sound, at least one attribute of sound generated thereby corresponding to at least one characteristic of the input digital signal which is sampled periodically in accordance with a clock, the system comprising at least one actuator device, each actuating device including:

an array of moving elements, wherein each individual moving element is responsive to alternating magnetic fields and is constrained to travel alternately back and forth along a respective axis responsive to an electromagnetic force operative thereupon when in the presence of an alternating magnetic field;

at least one latch operative to selectively latch at least one subset of said moving elements in at least one latching position thereby to prevent said individual moving elements from responding to said electromagnetic force;

a magnetic field control system operative to receive the clock and, accordingly, to control application of said electromagnetic force to said array of moving elements; and a latch controller operative to receive said digital input signal and to control said at least one latch accordingly, wherein said latch controller is associated with the direct digital speaker volume control device of claim 1.

13. A method for controlling volume of an input signal configured to be fed to a direct digital speaker; the direct digital speaker comprising a plurality of pressure producing elements being adapted to generate a sound at a sound pressure level (SPL) and at a given frequency in response to an input signal, without using digital to analog converter; the direct digital speaker inherently exhibiting a frequency response throughout its entire frequency range; the method comprising:

a. providing at least two filters each having a distinct cutoff frequency such that each filter exhibits substantially no attenuation below its cutoff frequency and an attenuation response above said filter's cutoff frequency; and b. selecting at least one of said filters according to a selection criterion that depends on at least a desired volume and frequency of generated sound, and applying said filter to said input signal for generating a filtered signal that is configured to be fed to said speaker.

14. The method according to claim 13, wherein at least one of said filters is applied to an input signal received in real time.

15. The method according to claim 13, wherein said applying includes pre-processing at least one of said filters to an input signal.

16. A computer program product, comprising a computer usable medium having a computer readable program code embodied therein, said computer readable program code adapted to be executed to implement a method for controlling volume of an input signal configured to be fed to a direct digital speaker; the direct digital speaker comprising a plurality of pressure producing elements being adapted to generate a sound at a sound pressure level (SPL) and at a given frequency in response to an input signal, without using digital to analog converter; the direct digital speaker inherently exhibiting a frequency response throughout its entire frequency range; the method comprising:

a. providing at least two filters each having a distinct cutoff frequency such that each filter exhibits substantially no attenuation below its cutoff frequency and an attenuation response above said filter's cutoff frequency; and b. selecting at least one of said filters according to a selection criterion that depends on at least a desired volume and frequency of generated sound, and applying said filter to said input signal for generating a filtered signal that is configured to be fed to said speaker.

* * * * *